(12) United States Patent
Yamazaki

(10) Patent No.: US 10,727,355 B2
(45) Date of Patent: Jul. 28, 2020

(54) SEMICONDUCTOR DEVICE AND MANUFACTURING METHOD OF THE SAME

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 163 days.

(21) Appl. No.: 15/059,830

(22) Filed: Mar. 3, 2016

(65) Prior Publication Data

US 2016/0260838 A1 Sep. 8, 2016

(30) Foreign Application Priority Data

Mar. 6, 2015 (JP) .................................. 2015-044526

(51) Int. Cl.
*H01L 29/10* (2006.01)
*H01L 29/786* (2006.01)
(Continued)

(52) U.S. Cl.
CPC ...... *H01L 29/7869* (2013.01); *H01L 27/1207* (2013.01); *H01L 27/1218* (2013.01);
(Continued)

(58) Field of Classification Search
CPC ............. H01L 29/045; H01L 29/66969; H01L 29/78603; H01L 29/7869
(Continued)

(56) References Cited

U.S. PATENT DOCUMENTS 5,637,898 A 6/1997 Baliga
6,489,652 B1 12/2002 Jeon et al.
(Continued)

FOREIGN PATENT DOCUMENTS

CN 101567320 A 10/2009
JP 09-148578 A 6/1997
(Continued)

*Primary Examiner* — Jay C Kim
(74) *Attorney, Agent, or Firm* — Fish & Richardson P.C.

(57) ABSTRACT

A semiconductor device includes first and second insulators over a substrate, a semiconductor over the second insulator, first and second conductors over the semiconductor, a third insulator over the semiconductor, a fourth insulator over the third insulator, a third conductor over the fourth insulator, and a fifth insulator over the first insulator, the first conductor and the second conductor. The semiconductor includes first, second, and third regions. The first region overlaps with the third conductor with the third insulator and the fourth insulator positioned therebetween. The second region overlaps with the third conductor with the first conductor, the fourth insulator, and the fifth insulator positioned therebetween. The third region overlaps with the third conductor with the second conductor, the fourth insulator, and the fifth insulator positioned therebetween. The fourth insulator is in contact with a side surface of the fifth insulator in a region overlapping with the semiconductor.

9 Claims, 47 Drawing Sheets

(51) Int. Cl.
*H01L 29/04* (2006.01)
*H01L 29/66* (2006.01)
*H01L 29/423* (2006.01)
*H01L 27/12* (2006.01)

(52) U.S. Cl.
CPC ........ *H01L 27/1225* (2013.01); *H01L 29/045* (2013.01); *H01L 29/42384* (2013.01); *H01L 29/66969* (2013.01); *H01L 29/78603* (2013.01); *H01L 29/78648* (2013.01); *H01L 29/78696* (2013.01)

(58) Field of Classification Search
USPC .......................................................... 257/43
See application file for complete search history.

(56) References Cited

U.S. PATENT DOCUMENTS

| | | | | |
|---|---|---|---|---|
| 7,211,825 B2* | 5/2007 | Shih | .................. | H01L 29/78633 257/13 |
| 8,093,589 B2* | 1/2012 | Sugihara | ........... | H01L 29/66969 257/43 |
| 8,148,779 B2* | 4/2012 | Jeong | .................. | H01L 29/4908 257/347 |
| 8,274,079 B2* | 9/2012 | Yamazaki | ......... | H01L 21/02554 257/43 |
| 8,304,300 B2* | 11/2012 | Sakata | .............. | H01L 21/02554 438/157 |
| 8,344,387 B2* | 1/2013 | Akimoto | ........... | H01L 21/02554 257/72 |
| 8,367,486 B2* | 2/2013 | Sakata | ................ | H01L 29/7869 438/151 |
| 8,395,156 B2* | 3/2013 | Miyairi | ............... | H01L 27/1233 257/57 |
| 8,410,002 B2 | 4/2013 | Yamazaki et al. | | |
| 8,421,068 B2 | 4/2013 | Yamazaki et al. | | |
| 8,421,069 B2 | 4/2013 | Yamazaki et al. | | |
| 8,440,510 B2* | 5/2013 | Yamazaki | ........... | H01L 21/0237 438/149 |
| 8,450,144 B2* | 5/2013 | Sakata | ................ | H01L 27/1288 257/E21.46 |
| 8,501,564 B2 | 8/2013 | Suzawa et al. | | |
| 8,502,221 B2* | 8/2013 | Yamazaki | ........... | H01L 29/7869 257/410 |
| 8,525,304 B2* | 9/2013 | Endo | .................. | H01L 29/4908 257/649 |
| 8,547,771 B2 | 10/2013 | Koyama | | |
| 8,624,245 B2* | 1/2014 | Yamazaki | ........... | H01L 27/1225 257/59 |
| 8,624,254 B2* | 1/2014 | Egi | .................. | H01L 29/78618 257/60 |
| 8,629,438 B2* | 1/2014 | Yamazaki | ........... | H01L 27/1225 257/43 |
| 8,629,441 B2* | 1/2014 | Yamazaki | ........... | H01L 27/1225 257/59 |
| 8,664,036 B2* | 3/2014 | Yamazaki | ......... | H01L 21/02472 257/E21.46 |
| 8,669,556 B2* | 3/2014 | Yamazaki | ........... | H01L 29/7869 257/57 |
| 8,728,860 B2* | 5/2014 | Yamazaki | ......... | H01L 21/02554 438/104 |
| 8,735,231 B2 | 5/2014 | Miyairi et al. | | |
| 8,742,544 B2 | 6/2014 | Yamazaki et al. | | |
| 8,748,224 B2* | 6/2014 | Noda | .................. | H01L 29/4908 438/104 |
| 8,759,917 B2* | 6/2014 | Park | .................. | H01L 29/78606 257/347 |
| 8,766,255 B2* | 7/2014 | Isobe | .................. | H01L 27/1156 257/288 |
| 8,823,074 B2 | 9/2014 | Suzawa et al. | | |
| 8,841,665 B2* | 9/2014 | Park | .................. | H01L 29/66742 257/43 |
| 8,890,159 B2* | 11/2014 | Yamazaki | ............. | H01L 29/247 257/43 |
| 8,901,556 B2* | 12/2014 | Okazaki | ............ | H01L 29/66742 257/43 |
| 8,916,866 B2* | 12/2014 | Godo | .................. | H01L 29/7869 257/43 |
| 8,937,307 B2* | 1/2015 | Yamazaki | ............ | H01L 27/0733 257/43 |
| 8,993,383 B2* | 3/2015 | Kishida | ................. | G02F 1/1368 257/72 |
| 8,995,174 B2 | 3/2015 | Koyama | | |
| 9,048,265 B2* | 6/2015 | Hondo | ............. | H01L 29/78693 |
| 9,059,219 B2* | 6/2015 | Sasagawa | ......... | H01L 29/66969 |
| 9,064,967 B2 | 6/2015 | Suzawa et al. | | |
| 9,082,857 B2* | 7/2015 | Yamazaki | ........... | H01L 29/4908 |
| 9,082,860 B2* | 7/2015 | Nakano | ............... | H01L 29/4908 |
| 9,087,907 B2* | 7/2015 | Kim | .................... | H01L 29/7869 |
| 9,153,699 B2* | 10/2015 | Yamazaki | ........... | H01L 29/7869 |
| 9,184,245 B2* | 11/2015 | Yamazaki | ............. | H01L 29/267 |
| 9,190,525 B2* | 11/2015 | Yamazaki | ........... | H01L 29/7869 |
| 9,209,795 B2 | 12/2015 | Okamoto et al. | | |
| 9,219,162 B2 | 12/2015 | Yamazaki et al. | | |
| 9,231,111 B2* | 1/2016 | Yamazaki | ............. | H01L 29/7869 |
| 9,240,492 B2* | 1/2016 | Yamazaki | ......... | H01L 29/78693 |
| 9,269,821 B2* | 2/2016 | Yamazaki | ......... | H01L 29/78696 |
| 9,276,121 B2* | 3/2016 | Yamazaki | ......... | H01L 29/78609 |
| 9,281,409 B2* | 3/2016 | Yamazaki | ......... | H01L 29/78693 |
| 9,306,079 B2* | 4/2016 | Yamazaki | ......... | H01L 29/78693 |
| 9,318,484 B2* | 4/2016 | Matsubayashi | ..... | H01L 27/0629 |
| 9,331,100 B2* | 5/2016 | Yamazaki | ........... | H01L 27/1225 |
| 9,355,844 B2 | 5/2016 | Yamazaki | | |
| 9,356,054 B2* | 5/2016 | Miyairi | ............... | H01L 27/1225 |
| 9,362,136 B2* | 6/2016 | Yamazaki | ........... | H01L 29/7869 |
| 9,391,096 B2* | 7/2016 | Yamazaki | ........... | H01L 27/1225 |
| 9,397,225 B2* | 7/2016 | Imoto | ............... | H01L 29/78603 |
| 9,412,877 B2* | 8/2016 | Tanaka | .............. | H01L 29/78696 |
| 9,425,220 B2* | 8/2016 | Miyake | ............... | H01L 27/1255 |
| 9,425,322 B2* | 8/2016 | Noda | ................ | H01L 21/02472 |
| 9,450,080 B2* | 9/2016 | Yamazaki | ......... | H01L 29/66969 |
| 9,553,202 B2* | 1/2017 | Kurata | ................ | H01L 27/1225 |
| 9,647,125 B2* | 5/2017 | Yamazaki | ......... | H01L 29/78648 |
| 9,673,224 B2* | 6/2017 | Yamazaki | ........... | H01L 27/1225 |
| 9,722,092 B2* | 8/2017 | Noda | .................. | H01L 29/7869 |
| 9,761,736 B2* | 9/2017 | Yamazaki | ........... | H01L 29/42384 |
| 9,847,431 B2* | 12/2017 | Yamazaki | ............... | H01L 29/24 |
| 9,865,743 B2 | 1/2018 | Yamazaki | | |
| 9,929,280 B2 | 3/2018 | Noda et al. | | |
| 10,056,494 B2 | 8/2018 | Yamazaki et al. | | |
| 10,192,997 B2 | 1/2019 | Noda et al. | | |
| 10,269,563 B2 | 4/2019 | Yamazaki | | |
| 2011/0127523 A1* | 6/2011 | Yamazaki | ......... | H01L 21/02554 257/43 |
| 2011/0133177 A1 | 6/2011 | Suzawa et al. | | |
| 2011/0240991 A1* | 10/2011 | Yamazaki | ............ | H01L 29/7831 257/43 |
| 2012/0248432 A1 | 10/2012 | Noda et al. | | |
| 2012/0248433 A1* | 10/2012 | Nakano | ............... | H01L 29/4908 257/43 |
| 2013/0075731 A1* | 3/2013 | Han | .................. | H01L 29/66765 257/57 |
| 2013/0193434 A1 | 8/2013 | Yamazaki et al. | | |
| 2013/0193435 A1 | 8/2013 | Yamazaki et al. | | |
| 2013/0270552 A1* | 10/2013 | Yamazaki | ............ | H01L 29/7831 257/43 |
| 2013/0285050 A1* | 10/2013 | Yamazaki | ............. | H01L 29/518 257/43 |
| 2013/0320330 A1* | 12/2013 | Yamazaki | ......... | H01L 29/78693 257/43 |
| 2014/0034949 A1* | 2/2014 | Matsukura | ........ | H01L 29/78693 257/52 |
| 2014/0042432 A1* | 2/2014 | Yamazaki | ............. | H01L 33/0041 257/43 |
| 2014/0175427 A1 | 6/2014 | Tsang | | |
| 2014/0339540 A1 | 11/2014 | Takemura | | |
| 2014/0339548 A1* | 11/2014 | Yamazaki | ........... | H01L 29/7869 257/43 |
| 2015/0280691 A1 | 10/2015 | Koyama | | |

(56) References Cited

U.S. PATENT DOCUMENTS

| | | | |
|---|---|---|---|
| 2015/0372009 | A1 | 12/2015 | Yamazaki |
| 2016/0099277 | A1* | 4/2016 | Vora .................. H01L 27/14663 257/428 |
| 2018/0269330 | A1 | 9/2018 | Yamazaki et al. |

FOREIGN PATENT DOCUMENTS

| | | |
|---|---|---|
| JP | 2008-141125 A | 6/2008 |
| JP | 2011-124556 A | 6/2011 |
| JP | 2011-139055 A | 7/2011 |
| JP | 2012-069938 A | 4/2012 |
| JP | 2012-084857 A | 4/2012 |
| JP | 2012-146946 A | 8/2012 |
| JP | 2012-216787 A | 11/2012 |
| JP | 2012-257187 A | 12/2012 |
| JP | 2013-251534 A | 12/2013 |
| JP | 2014-112659 A | 6/2014 |
| JP | 2014-240833 A | 12/2014 |
| JP | 2014-241407 A | 12/2014 |
| KR | 2012-0110034 A | 10/2012 |
| KR | 2013-0122554 A | 11/2013 |
| WO | WO-2011/058866 | 5/2011 |
| WO | WO-2011/068028 | 6/2011 |
| WO | WO-2012/029596 | 3/2012 |
| WO | WO-2014/065301 | 5/2014 |

* cited by examiner

FIG. 9A
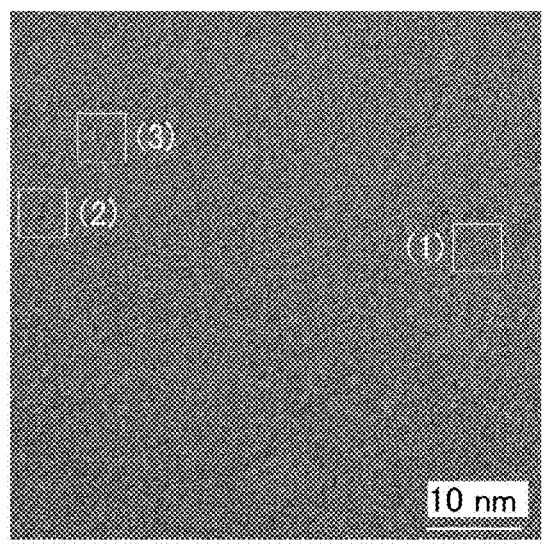
FIG. 9B          FIG. 9C          FIG. 9D
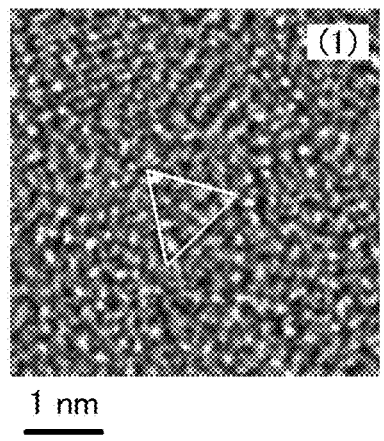   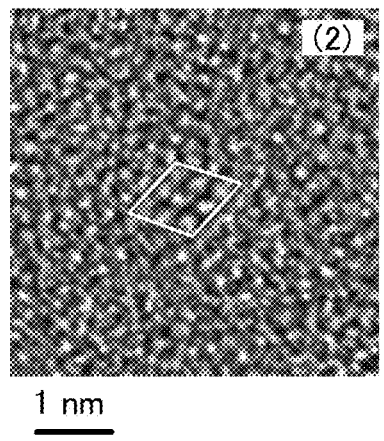   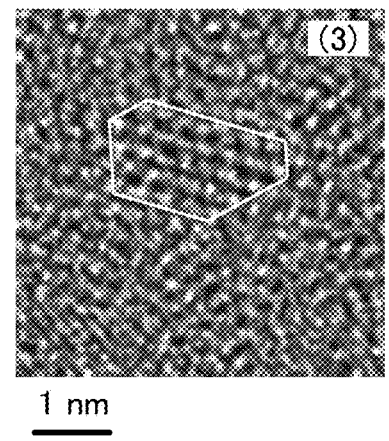

FIG. 47A
FIG. 47B
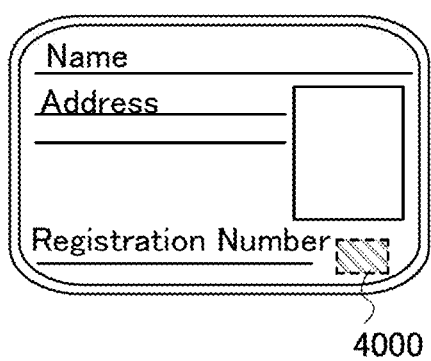
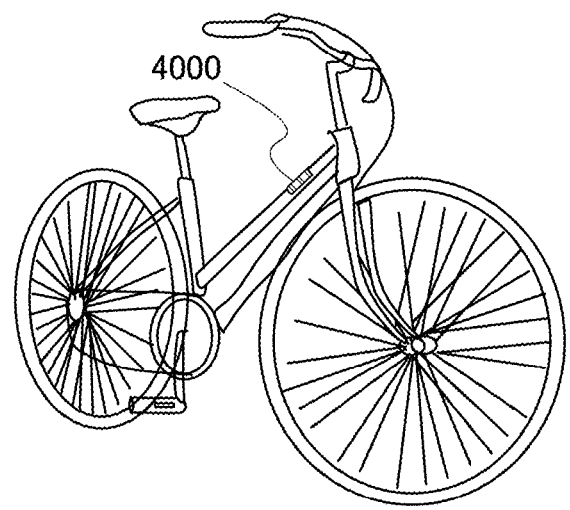
FIG. 47C
FIG. 47D
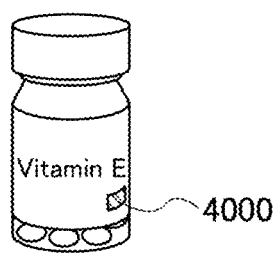
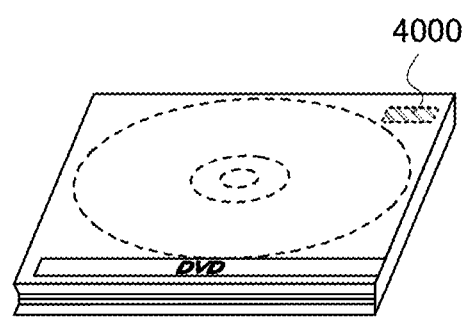
FIG. 47E
FIG. 47F
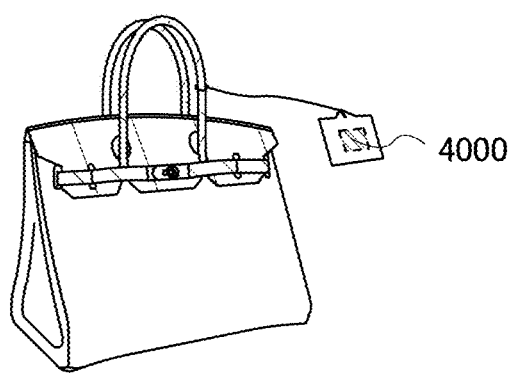
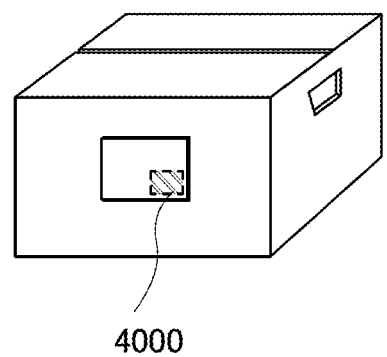

SEMICONDUCTOR DEVICE AND MANUFACTURING METHOD OF THE SAME

BACKGROUND OF THE INVENTION

1. Field of the Invention

The present invention relates to a transistor and a semiconductor device, and a manufacturing method thereof, for example. The present invention relates to a display device, a light-emitting device, a lighting device, a power storage device, a memory device, an imaging device, a processor, or an electronic device, for example. The present invention relates to a method for manufacturing a display device, a liquid crystal display device, a light-emitting device, a memory device, an imaging device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, a transistor including an oxide semiconductor has attracted attention. It is known that a transistor including an oxide semiconductor has an extremely low leakage current in an off state. For example, a low-power CPU and the like utilizing the characteristics that a leakage current of the transistor including an oxide semiconductor is low is disclosed (see Patent Document 1).

A method for manufacturing a transistor including an oxide semiconductor by forming a gate electrode so as to fill an opening is disclosed (see Patent Document 2 and Patent Document 3).

REFERENCE

Patent Document

[Patent Document 1] Japanese Published Patent Application No. 2012-257187
[Patent Document 2] Japanese Published Patent Application No. 2014-241407
[Patent Document 3] Japanese Published Patent Application No. 2014-240833

SUMMARY OF THE INVENTION

An object is to provide a minute transistor. Another object is to provide a transistor with low parasitic capacitance. Another object is to provide a transistor with high frequency characteristics. Another object is to provide a transistor with favorable electrical characteristics. Another object is to provide a transistor with stable electrical characteristics. Another object is to provide a transistor with low off-state current. Another object is to provide a novel transistor. Another object is to provide a semiconductor device including the transistor. Another object is to provide a semiconductor device which can operate at high speed. Another object is to provide a novel semiconductor device. Another object is to provide a module including the semiconductor device. Another object is to provide an electronic device including the semiconductor device or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulator over a substrate, a second insulator over the first insulator, a semiconductor over the second insulator, a first conductor and a second conductor over the semiconductor, a third insulator over the semiconductor, a fourth insulator over the third insulator, a third conductor over the fourth insulator, and a fifth insulator over the first insulator, the first conductor, and the second conductor. The semiconductor includes a first region, a second region, and a third region. The first region includes a region overlapping with the third conductor with the third insulator and the fourth insulator positioned therebetween. The second region includes a region overlapping with the third conductor with the first conductor, the fourth insulator, and the fifth insulator positioned therebetween. The third region includes a region overlapping with the third conductor with the second conductor, the fourth insulator, and the fifth insulator positioned therebetween. The fourth insulator includes a region in contact with a side surface of the fifth insulator in a region overlapping with the semiconductor.

In the above embodiment, the third insulator may have a stacked-layer structure including two or more layers.

In the above embodiment, the semiconductor may include a CAAC-OS.

In the above embodiment, each of the first to third conductors may have a stacked-layer structure including two or more layers.

In the above embodiment, each of the first conductor and the second conductor may include regions with different thicknesses.

In the above embodiment, a fourth conductor may be positioned under the first insulator.

In the above embodiment, each of the second insulator and the third insulator may contain at least one element contained in the semiconductor other than oxygen.

In the above embodiment, a top surface of the third insulator may be over top surfaces of the first conductor and the second conductor in a cross-sectional shape.

Another embodiment of the present invention is a method for manufacturing a semiconductor device, including the steps of: forming a first insulator; forming a second insulator over the first insulator; forming a semiconductor over the second insulator; forming a multilayer film including the second insulator and the semiconductor by etching a part of the second insulator and a part of the semiconductor; forming a first conductor over the multilayer film; forming a second conductor and a third conductor by etching a part of the first conductor; forming a fourth conductor over the second conductor and the third conductor; forming a third insulator over the fourth conductor and the first insulator; dividing the fourth conductor into a fifth conductor and a sixth conductor by forming an opening, through which the semiconductor and the first insulator are exposed, in the third insulator and the fourth conductor; forming a fourth insulator over the third insulator, the fifth conductor, the sixth conductor, and the semiconductor; forming a fifth insulator by selectively etching a part of the fourth insulator so that a region in contact with the semiconductor is left and a part of a side surface of the third insulator is exposed; forming a sixth insulator over the fifth insulator and the third insulator; and forming a seventh conductor over the sixth insulator. Each of the second insulator and the fourth insulator contain at least one element contained in the semiconductor other than oxygen.

In the above embodiment, each of the first and the seventh conductors may have a stacked-layer structure including two or more layers. Moreover, an eighth conductor may be further included under the first insulator.

In the above embodiment, a top surface of the fifth insulator may be over the top surfaces of the fifth conductor and the sixth conductor in a cross-sectional shape.

Another embodiment of the present invention is a method for manufacturing a semiconductor device, including the steps of: forming a first insulator; forming a second insulator over the first insulator; forming a semiconductor over the second insulator; forming a first conductor over the semiconductor; forming a multilayer film including the second insulator, the semiconductor, and the first conductor by etching a part of the second insulator, a part of the semiconductor, and a part of the first conductor; forming a third insulator over the multilayer film; dividing the first conductor into the second conductor and the third conductor by forming an opening, through which the semiconductor is exposed, in the third insulator and the first conductor; forming a fourth insulator over the third insulator, the second conductor, the third conductor, and the semiconductor; forming a fifth insulator by selectively etching a part of the fourth insulator so that a region in contact with the semiconductor is left and a part of a side surface of the third insulator is exposed; forming a sixth insulator over the fifth insulator and the third insulator; and forming a fourth conductor over the sixth insulator. Each of the second insulator and the fourth insulator contain at least one element contained in the semiconductor other than oxygen.

In the above embodiment, each of the first and the fourth conductors may have a stacked-layer structure including two or more layers. Moreover, a fifth conductor may be further included under the first insulator.

In the above embodiment, a top surface of the fifth insulator may be over the top surfaces of the second conductor and the third conductor in a cross-sectional shape.

In each of the above embodiments, the semiconductor may include a CAAC-OS.

In each of the above embodiments, each of the second conductor and the third conductor may include regions with different thicknesses.

In each of the above embodiments, the crystallinity of the part of the fourth insulator to be selectively etched is lower than the crystallinity of the fifth insulator.

In each of the above embodiments, the selective etching is performed by wet etching using an acid solution.

In each of the above embodiments, the fourth insulator may have a stacked-layer structure including two or more layers.

A miniaturized transistor can be provided. A transistor with low parasitic capacitance can be provided. A transistor with high frequency characteristics can be provided. A transistor with favorable electrical characteristics can be provided. A transistor with stable electrical characteristics can be provided. A transistor with low off-state current can be provided. A novel transistor can be provided. A semiconductor device including the transistor can be provided. A semiconductor device which can operate at high speed can be provided. A novel semiconductor device can be provided. A module including the semiconductor device can be provided. Furthermore, an electronic device including the semiconductor device or the module can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 9A to 9D are Cs-corrected high-resolution TEM images of a plane of a CAAC-OS.

FIGS. 47A to 47F illustrate application examples of an RF tag according to one embodiment of the present invention.

DETAILED DESCRIPTION OF THE INVENTION

Figure 1A:
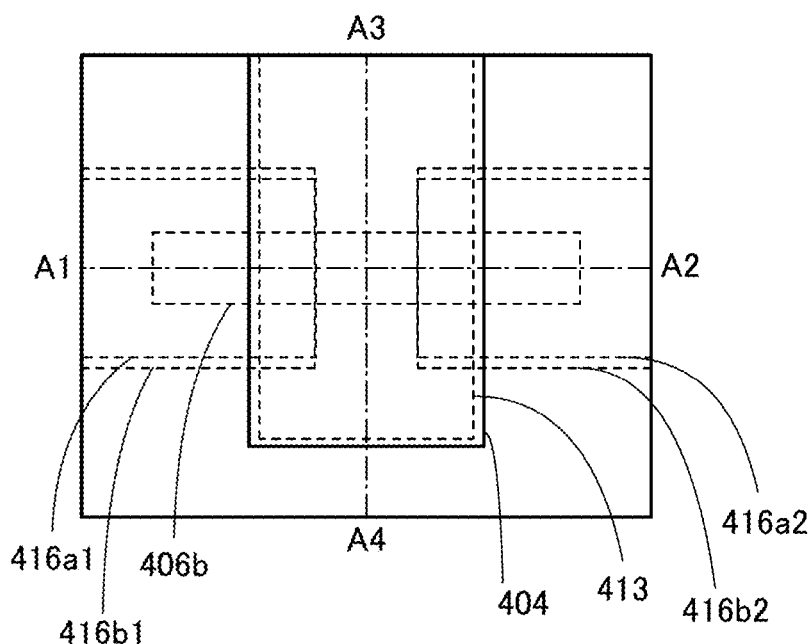
FIGS. 1A to 1C are a top view and cross-sectional views which illustrate a transistor of one embodiment of the present invention.

Hereinafter, embodiments of the present invention will be described in detail with the reference to the drawings. However, the present invention is not limited to the description below, and it is easily understood by those skilled in the art that embodiments and details disclosed herein can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or the region in drawings is sometimes exaggerated for simplicity.

In this specification, for example, for describing the shape of an object, the length of one side of a minimal cube where the object fits, or an equivalent circle diameter of a cross section of the object can be interpreted as the "diameter", "grain size (diameter)", "dimension", "size", or "width" of the object. The term "equivalent circle diameter of a cross section of the object" refers to the diameter of a perfect circle having the same area as the cross section of the object.

Note that a voltage refers to a potential difference between a certain potential and a reference potential (e.g., a ground potential (GND) or a source potential) in many cases. A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, in the case where the semiconductor is a silicon film, examples of an impurity which changes characteristics of the semiconductor include oxygen, Group 1 elements except hydrogen, Group 2 elements, Group 13 elements, and Group 15 elements.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

In this specification, a term "semiconductor" can be referred to as an "oxide semiconductor". As the semiconductor, a Group 14 semiconductor such as silicon or germanium; a compound semiconductor such as silicon carbide, germanium silicide, gallium arsenide, indium phosphide, zinc selenide, or cadmium sulfide; a carbon nanotube; graphene; or an organic semiconductor can be used.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (or may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

In addition, contents that are not specified in any text or drawing in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

Embodiment 1

Transistor Structure 1

The structures of transistors included in a semiconductor device of embodiments of the present invention will be described below.

Figure 1B:
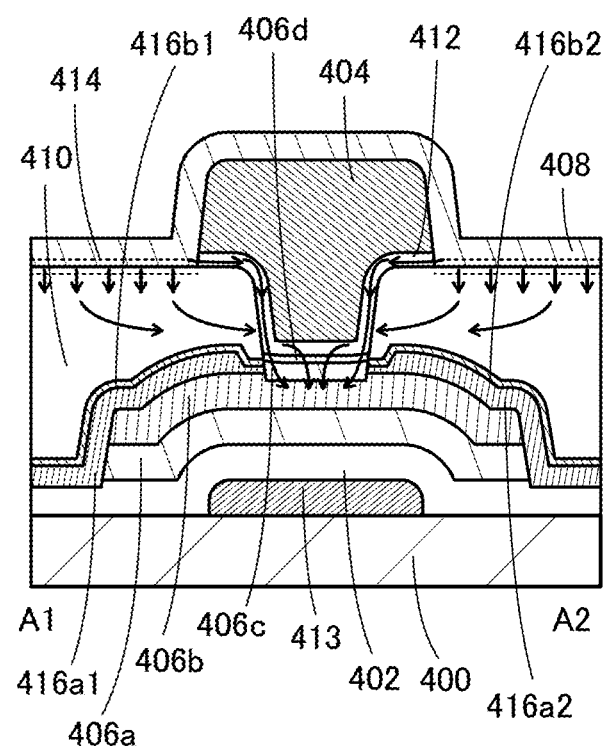
Figure 1C:
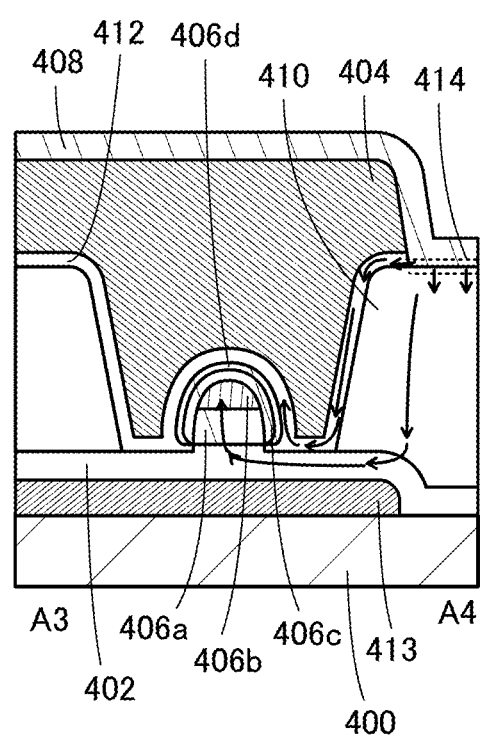

FIGS. 1A to 1C are a top view and cross-sectional views of the semiconductor device of one embodiment of the present invention. FIG. 1A is the top view. FIG. 1B is a cross-sectional view taken along dashed-dotted line A1-A2 in FIG. 1A, which illustrates a cross-sectional shape in the channel length direction. FIG. 1C is a cross-sectional view taken along dashed-dotted line A3-A4 in FIG. 1A, which illustrates a cross-sectional shape in the channel width direction. Note that for simplification of the drawing, some components in the top view in FIG. 1A are not illustrated. The paths through which the excess oxygen (referred to as exO) passes are denoted by arrows in FIGS. 1B and 1C.

The transistor illustrated in FIGS. 1A to 1C includes a conductor 413 over a substrate 400, an insulator 402 over the conductor 413, an insulator 406a over the insulator 402, a semiconductor 406b over the insulator 406a, a conductor 416a1 and a conductor 416a2 each including a region in contact with a top surface of the semiconductor 406b, a conductor 416b1 over the conductor 416a1, a conductor 416b2 over the conductor 416a2, an insulator 410 in contact with top surfaces of the conductors 416b1 and 416b2, an insulator 406c in contact with a top surface and a side surface of the semiconductor 406b, an insulator 406d in contact with a top surface of the insulator 406c, an insulator 412 in contact with the insulator 406d and the insulator 410, a conductor 404 over the semiconductor 406b with the insulator 412, the insulator 406c, and the insulator 406d positioned therebetween, and an insulator 408 over the insulator 412 and the conductor 404. Note that the insulator 406c may be in contact with the insulator 402.

A mixed region 414 containing excess oxygen is formed in the vicinity of the interface between the insulator 408 and the insulator 410 in some cases.

The insulator 406c and the insulator 406d preferably contain at least one element contained in the semiconductor 406b other than oxygen. This can reduce generation of defects at each of the interface between the semiconductor 406b and the insulator 406c and that between the insulator 406c and the insulator 406d. Furthermore, the crystallinity of the insulators 406c and 406d can be improved.

It is preferable that the semiconductor 406b and the insulator 406c each include a CAAC-OS which will be described later. In addition, the insulator 406d preferably includes a CAAC-OS. Furthermore, the insulator 406a preferably includes a CAAC-OS.

In the transistor, the conductor 404 serves as a first gate electrode. The conductor 404 can have a stacked-layer structure including a conductor that is less likely to transmit oxygen. For example, forming a conductor that is less likely to transmit oxygen in a lower layer can prevent decrease in conductivity due to oxidation of the conductor 404. In addition, the insulator 412 serves as a first gate insulator.

The conductor 413 serves as a second gate electrode. The conductor 413 can have a stacked-layer structure including a conductive film that is less likely to transmit oxygen. The stacked-layer structure including a conductive film that is less likely to transmit oxygen can prevent decrease in conductivity due to oxidation of the conductor 413. The insulator 402 serves as a second gate insulator. The potential applied to the conductor 413 can control the threshold voltage of the transistor. When the first gate electrode is electrically connected to the second gate electrode, the current in a conducting state (on-state current) can be increased. Note that the function of the first gate electrode and that of the second gate electrode may be interchanged.

Figure 2A:
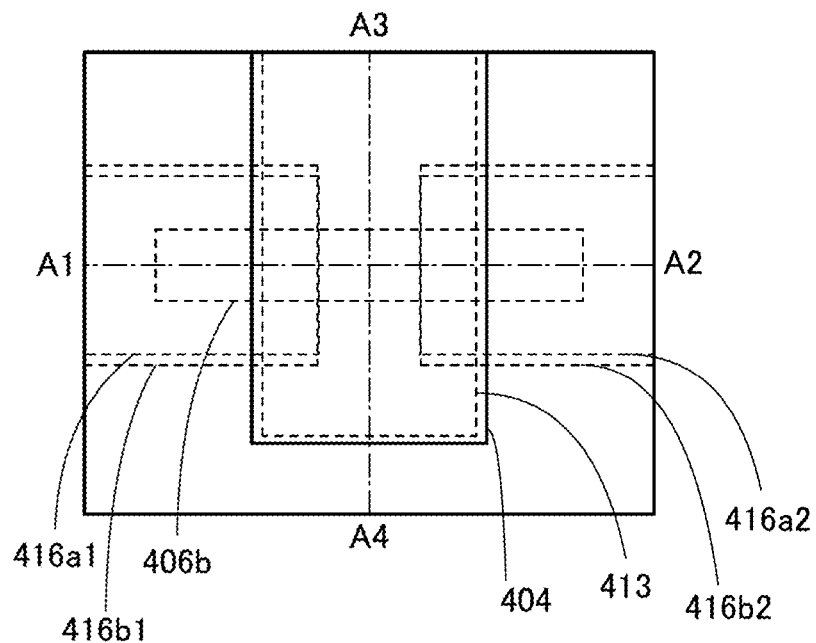
FIGS. 2A to 2C are a top view and cross-sectional views which illustrate a transistor of one embodiment of the present invention.
Figure 2B:
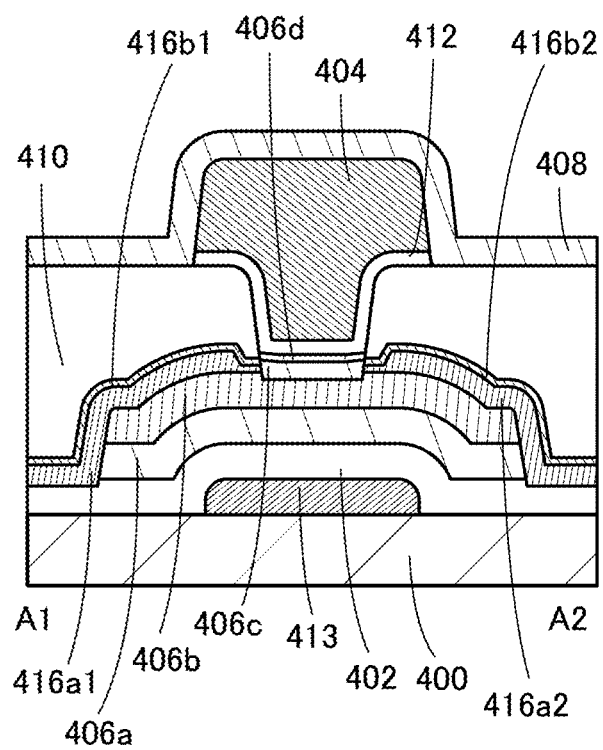
Figure 2C:
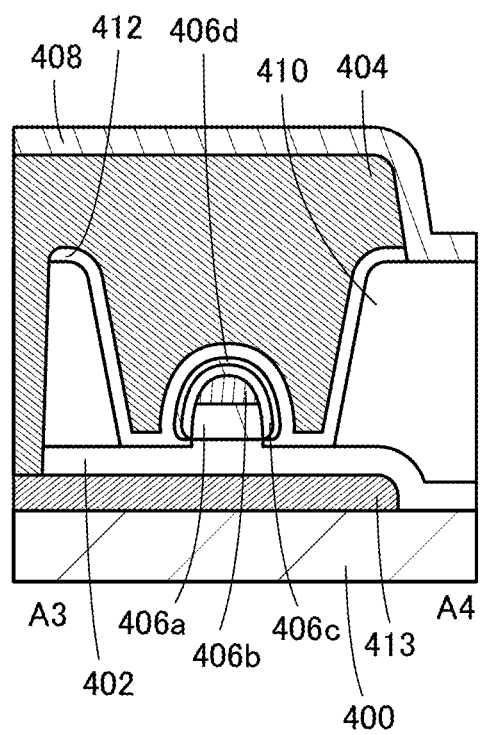

FIGS. 2A to 2C illustrate an example in which the first gate electrode is electrically connected to the second gate electrode. As illustrated in FIG. 2C, by forming an opening in the insulator 402, the insulator 410, and the insulator 412, the conductor 413 and the conductor 404 are electrically connected to each other.

The conductors 416a1 and 416a2 serve as a source electrode and a drain electrode. It is preferable that each of the conductors 416a1 and 416a2 preferably has regions with different thicknesses. For example, the thickness of a region in contact with the insulator 406c, the insulator 406d, or the insulator 412 of the conductor 416a1 and the conductor 416a2 is preferably small. In addition, the conductors 416a1 and 416a2 can each have a stacked-layer structure including a conductor that is less likely to transmit oxygen. For example, forming a conductor that is less likely to transmit oxygen in an upper layer can prevent decrease in conductivity due to oxidation of the conductor 416a1 and the conductor 416a2. Note that conductivity of the conductor can be measured by a two-terminal method or the like.

Therefore, the resistance of the semiconductor 406b can be controlled by a potential applied to the conductor 404. That is, conduction or non-conduction between the conductors 416a1 and 416a2 can be controlled by the potential applied to the conductor 404.

As illustrated in FIG. 1B, the top surface of the semiconductor 406b is in contact with the conductors 416a1 and 416a2. In addition, the semiconductor 406b can be electrically surrounded by an electric field of the conductor 404 serving as the gate electrode. A structure in which a semiconductor is electrically surrounded by an electric field of a gate electrode is referred to as a surrounded channel (s-channel) structure. Therefore, a channel is formed in the entire semiconductor 406b in some cases. In the s-channel structure, a large amount of current can flow between a source and a drain of the transistor, so that an on-state current can be increased. In addition, since the semiconductor 406b is surrounded by the electric field of the conductor 404, an off-state current can be decreased.

The transistor in this embodiment can also be referred to as a trench-gate self-aligned s-channel FET (TGSA s-channel FET) because the region serving as a gate electrode is formed in a self-aligned manner to fill the opening formed in the insulator 410 and the like.

In the transistor in this embodiment, the insulator 410 is provided in a region where the conductors 416a1 and 416b1 and the conductor 404 overlap with each other. Accordingly, the length between the conductors 416a1 and 416b1 and the conductor 404 becomes longer, whereby the parasitic capacitance generated between the conductors 416a1 and 416b1 and the conductor 404 can be reduced.

Figure 3A:
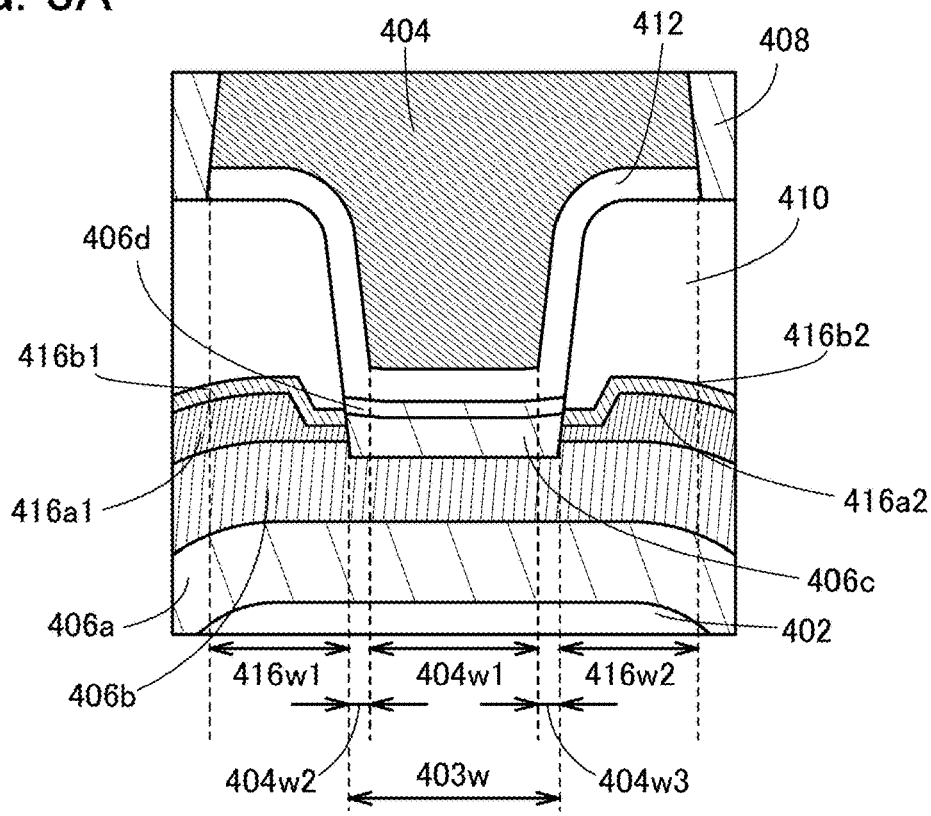
FIGS. 3A and 3B are cross-sectional views each illustrating a part of a transistor of one embodiment of the present invention.
Figure 3B:
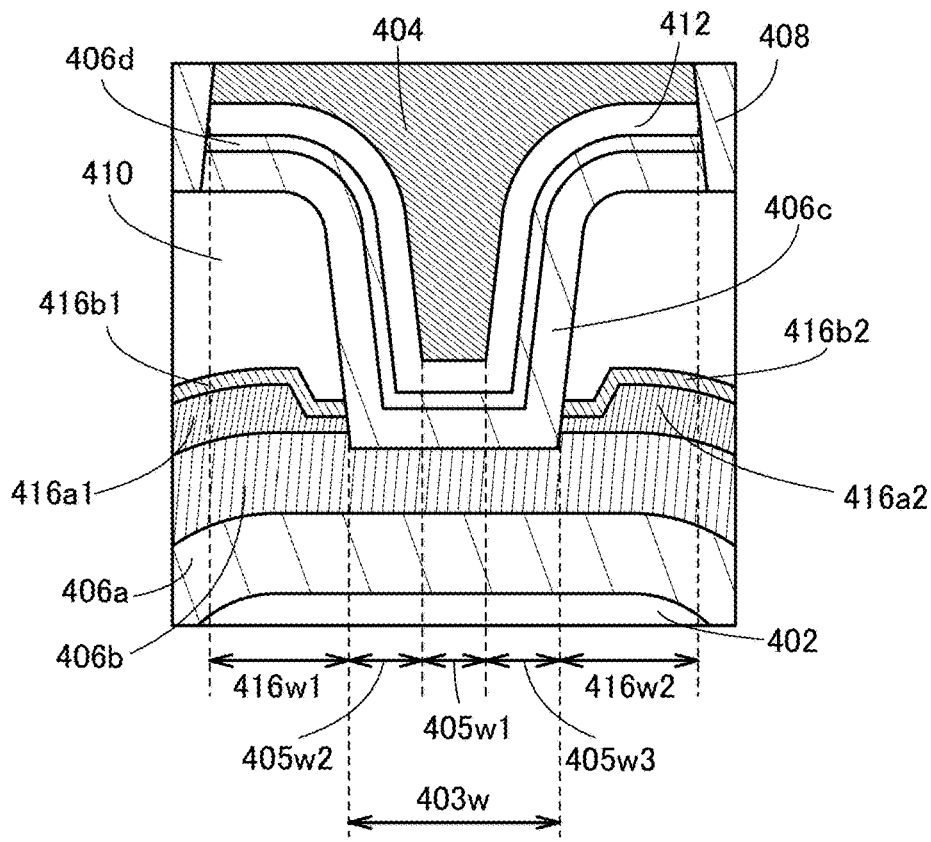

FIGS. 3A and 3B are each an enlarged view of a portion of a transistor. FIG. 3A illustrates an enlarged portion of the transistor of one embodiment of the present invention. FIG. 3B illustrates an enlarged portion of a comparative transistor.

In FIG. 3A, the length of the region of the bottom surface of the conductor 404 serving as a gate electrode facing and parallel to the top surface of the semiconductor 406b with the insulator 412, the insulator 406c, and the insulator 406d positioned therebetween is denoted as a gate line width 404w1. The length of the region where the semiconductor 406b, the conductor 416a1, the conductor 416b1, the insulator 410, the insulator 412, and the conductor 404 overlap with one another is denoted as 416w1. The length of the region where the semiconductor 406b, the conductor 416a2, the conductor 416b2, the insulator 410, the insulator 412, and the conductor 404 overlap with one another is denoted as 416w2. In cross-sectional views in FIGS. 3A and 3B, the shortest distance between the region of 416$w$1 and the region of 404$w$1 is 404$w$2. The shortest distance between the region of 416$w$2 and the region of 404$w$1 is 404$w$3. The sum of the lengths 404$w$1, 404$w$2, and 404$w$3 is denoted as 403$w$. In FIG. 3A, the length of the conductor 404 is the sum of 416$w$1, 404$w$2, 404$w$1, 404$w$3, and 416$w$2.

In FIG. 3B, the length of the region of the bottom surface of the conductor 404 serving as a gate electrode facing and parallel to the top surface of the semiconductor 406$b$ with the insulator 412, the insulator 406$c$, and the insulator 406$d$ positioned therebetween is denoted as a gate line width 405$w$1. The length of the region where the semiconductor 406$b$, the conductor 416$a$1, the conductor 416$b$1, the insulator 410, the insulator 412, and the conductor 404 overlap with one another is denoted as 416$w$3. The length of the region where the semiconductor 406$b$, the conductor 416$a$2, the conductor 416$b$4, the insulator 410, the insulator 412, and the conductor 404 overlap with one another is denoted as 416$w$4. The shortest distance between the region of 416$w$3 and the region of 405$w$1 is denoted as 405$w$2. The shortest distance between the region of 416$w$4 and the region of 405$w$1 is denoted as 405$w$3. The sum of the lengths 405$w$1, 405$w$2, and 405$w$3 is denoted as 405$w$. In FIG. 3B, the length of the conductor 404 is the sum of 416$w$3, 405$w$2, 405$w$1, 405$w$3, and 416$w$4.

In the transistors in FIGS. 3A and 3B, the conductor 404 serving as a gate electrode partly overlap with the conductors 416$a$1 and 416$a$2 serving as a source electrode and a drain electrode. However, in the semiconductor 406$b$, the region of 404$w$2 and the region of 404$w$3 in FIG. 3A and the region of 405$w$2 and the region of 405$w$3 in FIG. 3B are regions where an electric field from the gate electrode is small because the distance between the conductor 404 and the semiconductor 406$b$ is long. The regions of the semiconductor 406$b$ have low conductivity in a channel region formed between the conductor 416$a$1 and the conductor 416$a$2. The on-state current of the transistor becomes small due to the regions; thus, the regions are preferably small.

In the transistor of this embodiment illustrated in FIG. 3A, the insulator 406$c$ and the insulator 406$d$ are not formed to cover a side surface of the opening but in contact with a part of the side surface. In the transistor of this embodiment illustrated in FIG. 3A, the insulator 406$c$ and the insulator 406$d$ are not formed on a side surface of an opening formed in the insulator 410. Thus, the transistor in FIG. 3A is preferable because the transistor has smaller region with low conductivity than the comparative transistor in FIG. 3B.

Figure 4A:
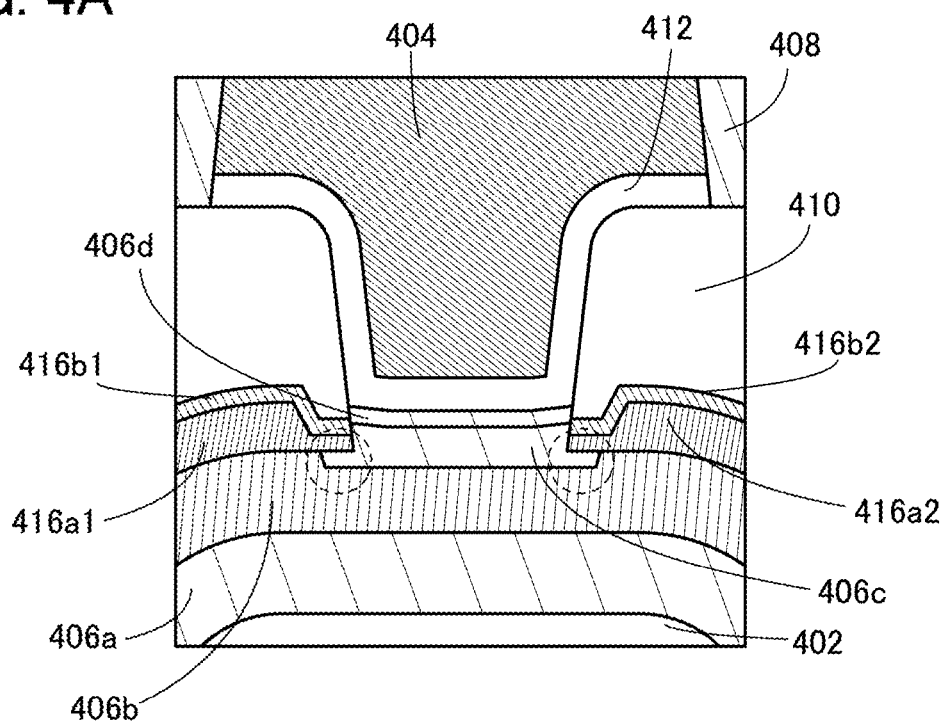
FIGS. 4A and 4B are cross-sectional views each illustrating a part of a transistor of one embodiment of the present invention.
Figure 4B:
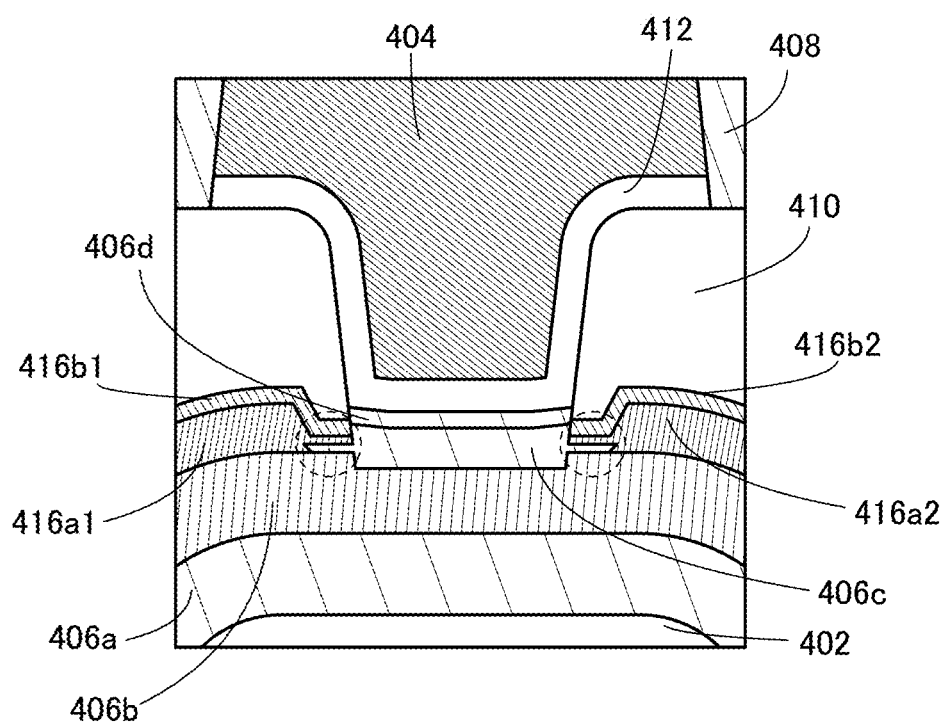
Figure 5A:
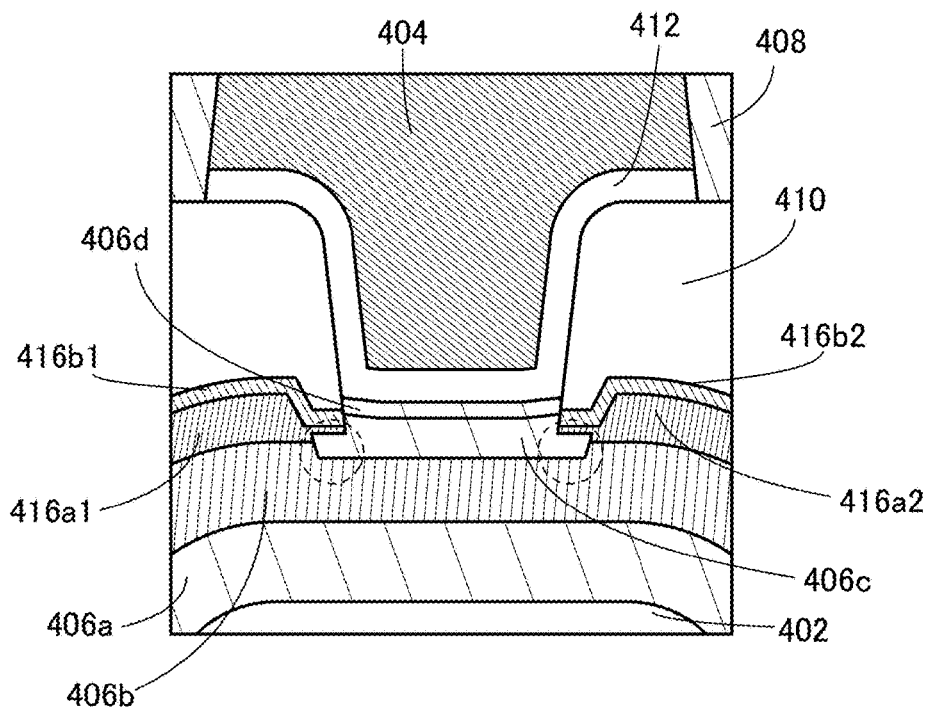
FIGS. 5A to 5C are cross-sectional views each illustrating a part of a transistor of one embodiment of the present invention.

In a cross-sectional view in FIG. 3A, the top surface of the insulator 406$d$ is preferably over the top surfaces of the conductors 416$a$1 and 416$a$2, more preferably over the top surfaces of the conductors 416$b$1 and the conductor 416$b$2. In addition, in a cross-sectional shape, the top surface of the insulator 406$c$ is preferably over the top surfaces of the conductors 416$a$1 and 416$a$2, more preferably over the top surfaces of the conductors 416$b$1 and the conductor 416$b$2. Thus, even in the case where part of the semiconductor 406$b$ is recessed as illustrated by the dotted circles in the enlarged view of part of the transistor illustrated in FIG. 4A, the recessed part can be filled by forming the insulator 406$c$. Alternatively, even in the case where parts of the conductors 416$a$1 and 416$a$2 are recessed as illustrated by the dotted circles in the enlarged view of part of the transistor illustrated in FIG. 4B, the recessed parts can be filled with the insulator 406$c$. Alternatively, even in the case where parts of the semiconductor 406$b$, the conductor 416$a$1, and the conductor 416$a$2 are recessed as illustrated in the dotted circles in the enlarged view of part of the transistor illustrated in FIG. 5A, the recessed parts can be filled by forming the insulator 406$c$.

Figure 5B:
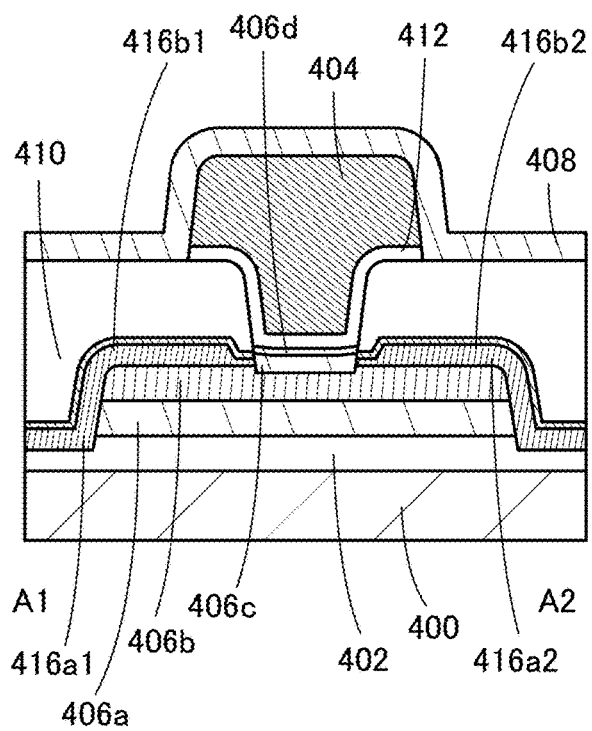
Figure 5C:
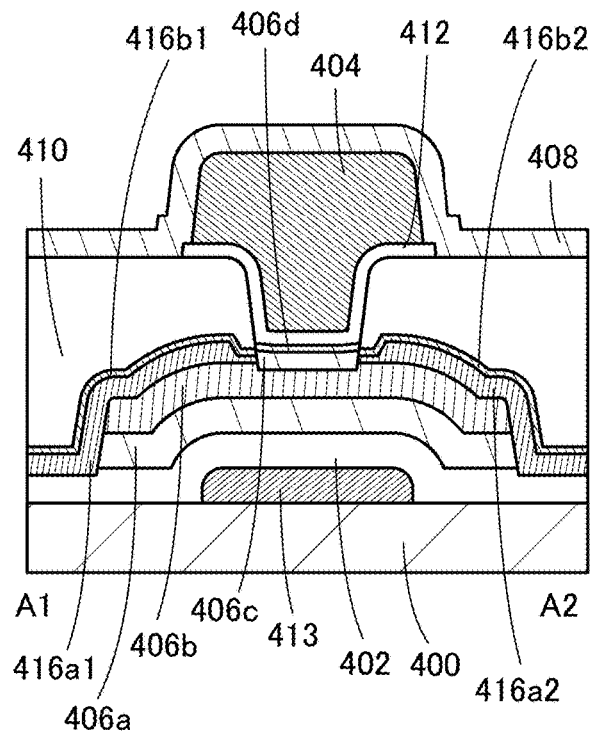

Alternatively, a structure without the conductor 413 may be used (see FIG. 5B). Alternatively, as illustrated in FIG. 5C, the insulator 412 may protrude from the conductor 404.

Figure 6A:
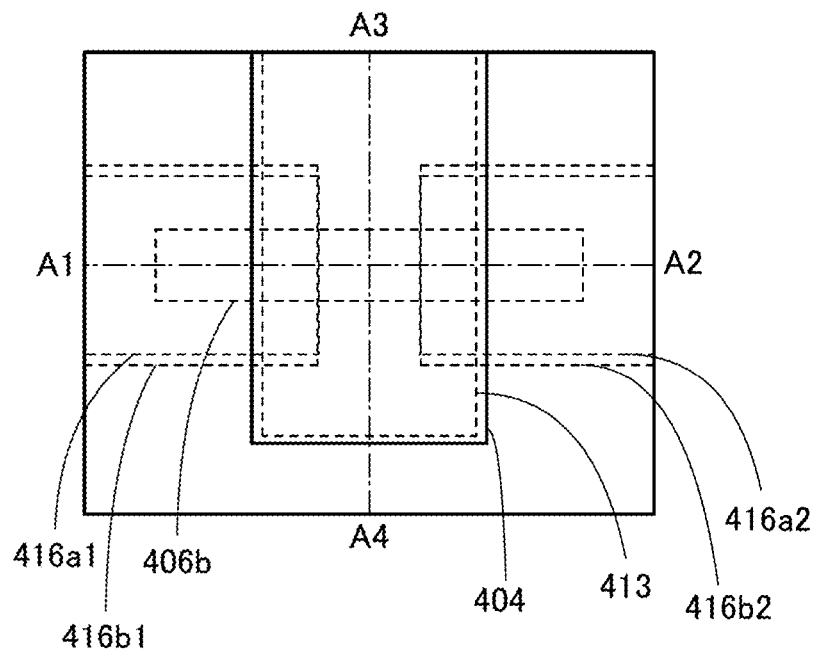
FIGS. 6A to 6C are a top view and cross-sectional views which illustrate a transistor of one embodiment of the present invention.
Figure 6B:
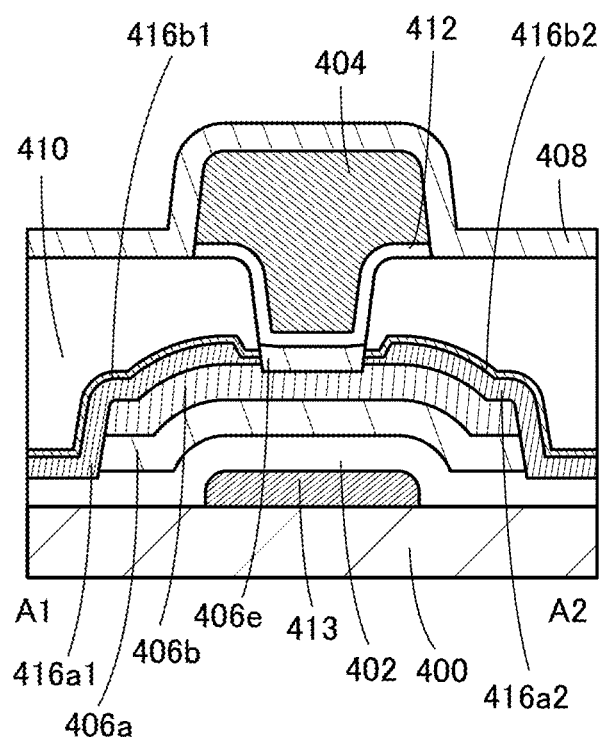
Figure 6C:
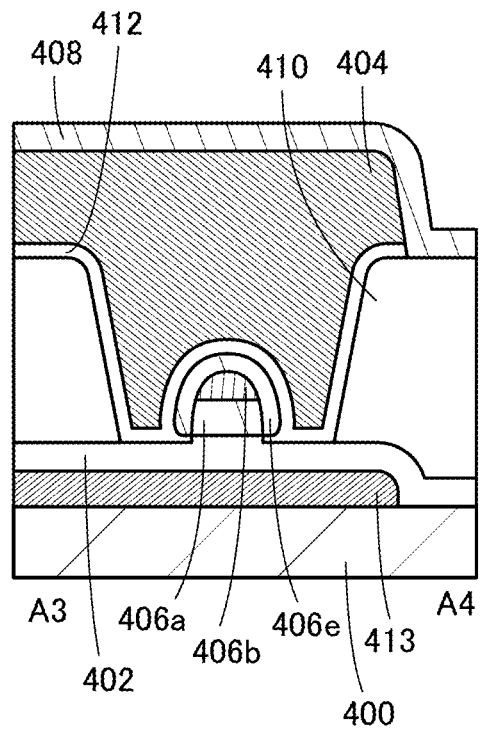

The transistor of this embodiment has, although not limited to, a structure in which the insulators 406$c$ and 406$d$ are provided over the semiconductor 406$b$. For example, only an insulator 406$e$ may be provided over the semiconductor 406$b$ (see FIGS. 6A to 6C).

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

Note that electrical characteristics of the transistor can be stabilized when the transistor is surrounded by an insulator with a function of blocking oxygen and impurities such as hydrogen. For example, an insulator with a function of blocking oxygen and impurities such as hydrogen may be used as the insulator 408.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

For example, the insulator 408 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 408 preferably contains aluminum oxide. For example, when the insulator 408 is formed using plasma containing oxygen, oxygen can be added to the insulator 410 to be a base layer of the insulator 408 or a side surface of the insulator 412. The added oxygen becomes excess oxygen in the insulator 410 or the insulator 412. When the insulator 408 contains aluminum oxide, entry of impurities such as hydrogen into the semiconductor 406b can be inhibited. In addition, when the insulator 408 contains aluminum oxide, outward diffusion of excess oxygen that is added to the insulator 410 and the insulator 412 can be reduced, for example.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

Note that the insulator 410 preferably includes an insulator with low relative dielectric constant. For example, the insulator 410 preferably contains silicon oxide, silicon oxynitride, silicon nitride oxide, silicon nitride, silicon oxide to which fluorine is added, silicon oxide to which carbon is added, silicon oxide to which carbon and nitrogen are added, silicon oxide having pores, a resin, or the like. Alternatively, the insulator 410 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. When silicon oxide or silicon oxynitride, which is thermally stable, is combined with a resin, the stacked-layer structure can have thermal stability and low relative dielectric constant. Examples of the resin include polyester, polyolefin, polyamide (e.g., nylon or aramid), polyimide, polycarbonate, and acrylic.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, for the insulator 412, a material containing silicon oxide or silicon oxynitride is preferably used.

Note that the insulator 412 preferably contains an insulator with a high relative dielectric constant. For example, the insulator 412 preferably contains gallium oxide, hafnium oxide, oxide containing aluminum and hafnium, oxynitride containing aluminum and hafnium, oxide containing silicon and hafnium, oxynitride containing silicon and hafnium, or the like. The insulator 412 preferably has a stacked-layer structure containing silicon oxide or silicon oxynitride and an insulator with a high relative dielectric constant. Since silicon oxide and silicon oxynitride have thermal stability, combination of silicon oxide or silicon oxynitride with an insulator with a high relative dielectric constant allows the stacked-layer structure to be thermally stable and have a high relative dielectric constant. For example, when an aluminum oxide, a gallium oxide, or a hafnium oxide of the insulator 412 is on the insulators 406c and 406d side, entry of silicon included in the silicon oxide or the silicon oxynitride into the semiconductor 406b can be suppressed. When silicon oxide or silicon oxynitride is on the insulators 406c and 406d side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

Each of the conductors 416a1 and 416a2 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, or the like may be used. Furthermore, the conductors 416b1 and 416b2 may be formed in a similar manner to that of the conductors 416a1 and 416a2.

Each of the conductors 404 and 413 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406a, the insulator 406c, and the insulator 406d, oxides containing one or more elements other than oxygen contained in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The semiconductor 406b is an oxide semiconductor containing indium, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, magnesium, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, the insulator 406a, the insulator 406c, the insulator 406d, and the insulator 406e are oxides including one or more elements, or two or more elements other than oxygen included in the semiconductor 406b. Since the insulator 406a, the insulator 406c, and the insulator 406d each include one or more elements, or two or more elements other than oxygen included in the semiconductor 406b, a defect state is less likely to be formed at the interface between the insulator 406a and the semiconductor 406b and the interface between the semiconductor 406b and the insulator 406c.

As the semiconductor 406b, an oxide having an electron affinity higher than those of the insulators 406a, 406c, and 406d is used. For example, as the semiconductor 406b, an oxide having an electron affinity higher than those of the insulators 406a, 406c, and 406d by 0.07 eV or higher and 1.3 eV or lower, preferably 0.1 eV or higher and 0.7 eV or lower, or further preferably 0.15 eV or higher and 0.4 eV or lower is used. Note that the electron affinity refers to an energy gap between the vacuum level and the bottom of the conduction band. Furthermore, the insulator 406c preferably has higher electron affinity than the insulator 406d.

When gate voltage is applied to such a transistor in which the insulator 406a is placed under the semiconductor 406b and the insulators 406c and 406d are placed over the semiconductor 406b, a channel is formed in the semiconductor 406b whose electron affinity is the highest among the insulator 406a, the semiconductor 406b, the insulator 406c, and the insulator 406d. In this manner, a buried channel structure is formed.

Figure 7:
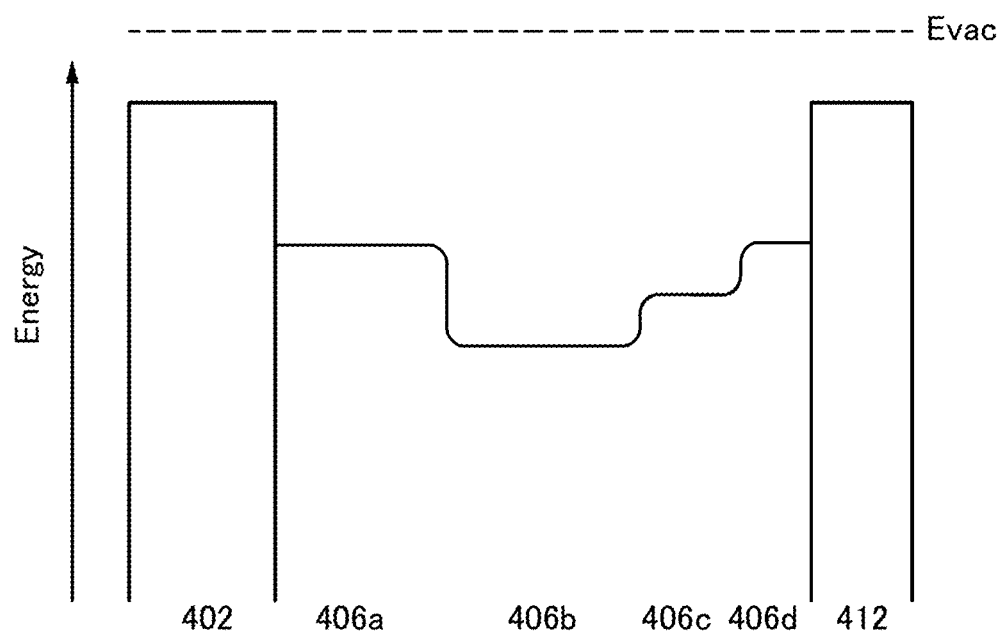
FIG. 7 is a band diagram of one embodiment of the present invention.

In some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. Furthermore, in some cases, there is a mixed region of the semiconductor 406b and the insulator 406c between the semiconductor 406b and the insulator 406c. The mixed region has a low density of defect states. For that reason, in a band diagram of a stack including the insulator 406a, the semiconductor 406b, the insulator 406c, and the insulator 406d (see FIG. 7), energy changes continuously at each interface and in the vicinity of the interface (continuous junction). Note that boundaries of the insulator 406a, the semiconductor 406b, the insulator 406c, and the insulator 406d are not clear in some cases.

At this time, electrons move mainly in the semiconductor 406b, not in the insulators 406a, 406c, and 406d.

As factors of inhibiting electron movement are decreased, the on-state current of the transistor can be increased. Electron movement is inhibited, for example, in the case where physical unevenness in a channel formation region is large.

To increase the on-state current of the transistor, for example, root mean square (RMS) roughness with a measurement area of 1 μm×1 μm of the top surface or the bottom surface of the semiconductor 406b (a formation surface; here, the top surface of the insulator 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P-V) with the measurement area of 1 μm×1 μm is less than 10 nm, preferably less than 9 nm, further preferably less than 8 nm, still further preferably less than 7 nm. RMS roughness, Ra, and P-V can be measured using a scanning probe microscope SPA-500 manufactured by SII Nano Technology Inc.

The above four-layer structure is an example. For example, a stacked-layer structure in which one or more of the insulators described as examples of the insulator 406a, the insulator 406c, and the insulator 406d is provided under or over the insulator 406a, under or over the insulator 406c, or under or over the insulator 406d may be employed.

<Structure of Oxide Semiconductor>

Structures of an oxide semiconductor that can be used as the above semiconductor will be described below.

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, an nc-OS, an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur. The pellet is larger than or equal to 1 nm, preferably larger than or equal to 3 nm, and further preferably larger than or equal to 6 nm.

Figure 8A:
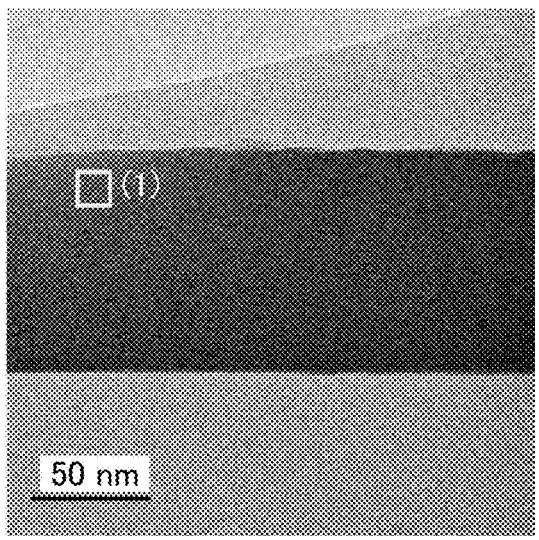
FIGS. 8A to 8D are Cs-corrected high-resolution TEM images of a cross section of a CAAC-OS and a cross-sectional schematic view of the CAAC-OS.

A CAAC-OS observed with TEM will be described below. FIG. 8A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 8B:
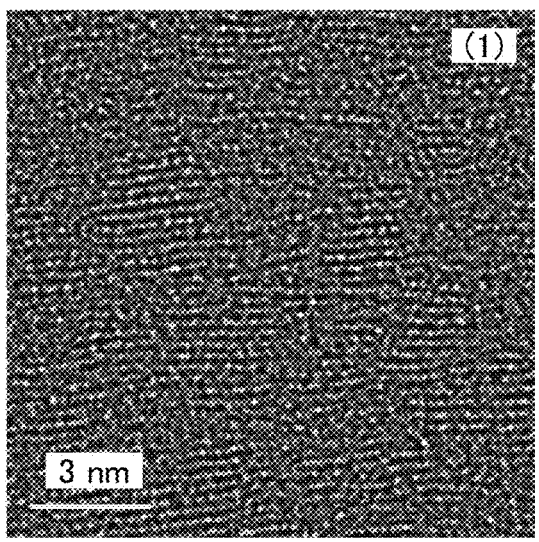

FIG. 8B is an enlarged Cs-corrected high-resolution TEM image of a region (1) in FIG. 8A. FIG. 8B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS film, and is arranged parallel to the formation surface or the top surface of the CAAC-OS film.

Figure 8C:
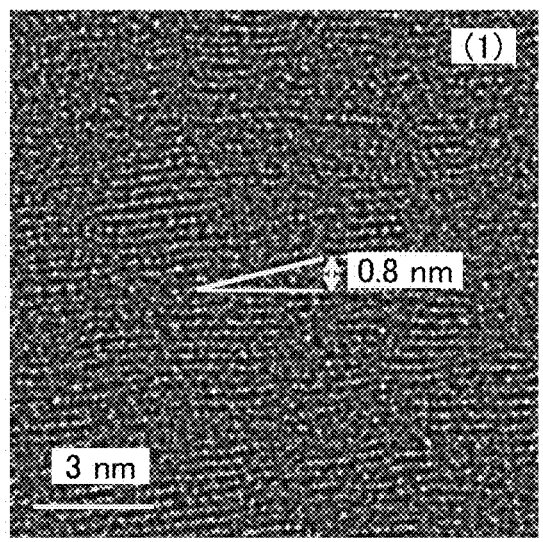

As shown in FIG. 8B, the CAAC-OS has a characteristic atomic arrangement. The characteristic atomic arrangement is denoted by an auxiliary line in FIG. 8C. FIGS. 8B and 8C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 8D:
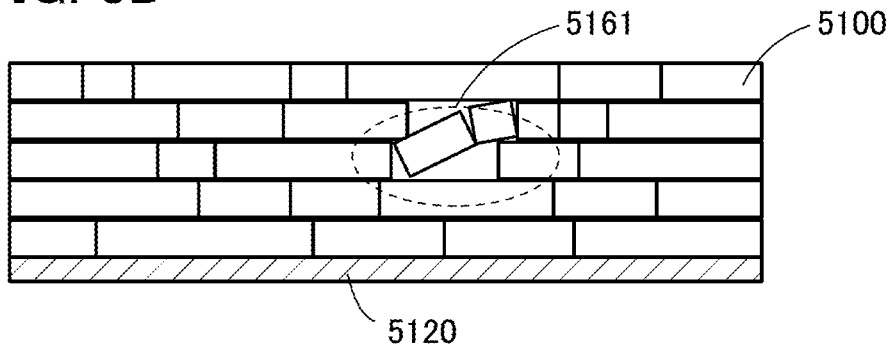

Here, according to the Cs-corrected high-resolution TEM images, the schematic arrangement of pellets 5100 of a CAAC-OS over a substrate 5120 is illustrated by such a structure in which bricks or blocks are stacked (see FIG. 8D). The part in which the pellets are tilted as observed in FIG. 8C corresponds to a region 5161 shown in FIG. 8D.

FIG. 9A shows a Cs-corrected high-resolution TEM image of a plane of the CAAC-OS observed from a direction substantially perpendicular to the sample surface.

FIGS. 9B, 9C, and 9D are enlarged Cs-corrected high-resolution TEM images of regions (1), (2), and (3) in FIG. 9A, respectively. FIGS. 9B, 9C, and 9D indicate that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) will be described.

Figure 10A:
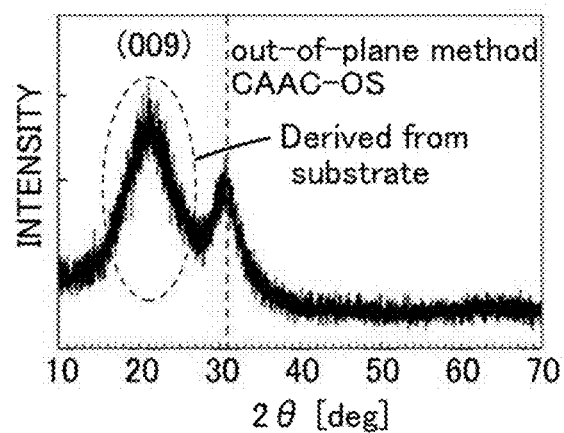
FIGS. 10A to 10C show structural analysis of a CAAC-OS and a single crystal oxide semiconductor by XRD.

For example, when the structure of a CAAC-OS including an $InGaZnO_4$ crystal is analyzed by an out-of-plane method, a peak appears at a diffraction angle ($2\theta$) of around 31° as shown in FIG. 10A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 10B:
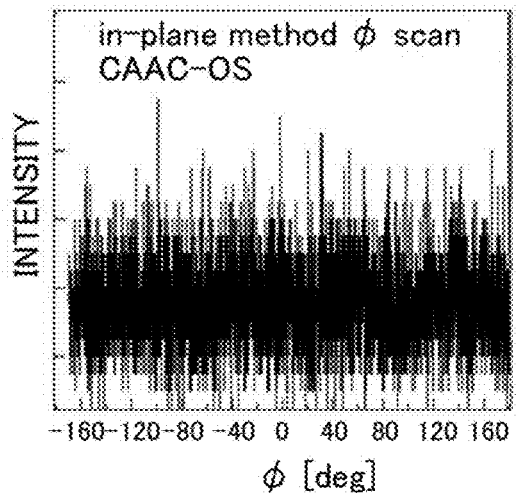
Figure 10C:
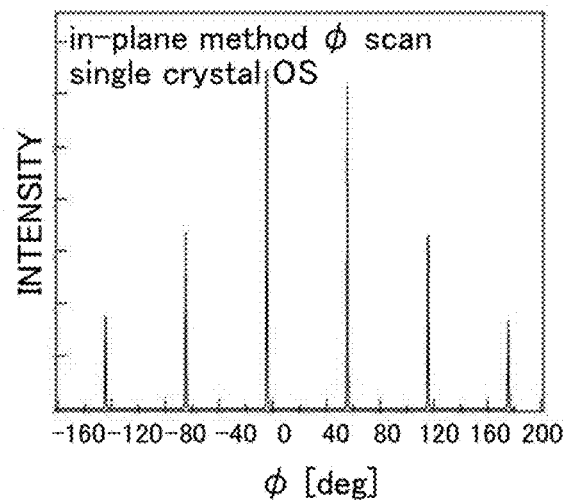

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 10B, a peak is not clearly observed. In contrast, in the case of a single crystal oxide semiconductor of $InGaZnO_4$, when $\phi$ scan is performed with $2\theta$ fixed at around 56°, as shown in FIG. 10C, six peaks which are derived from crystal planes equivalent to the (110) plane are observed. Accordingly, the structural analysis using XRD shows that the directions of a-axes and b-axes are irregularly oriented in the CAAC-OS.

Figure 11A:
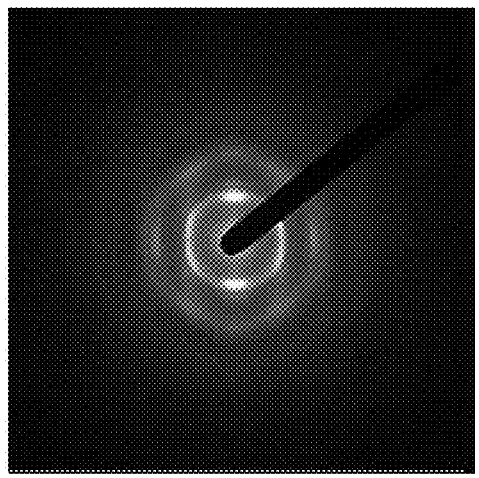
FIGS. 11A and 11B show electron diffraction patterns of a CAAC-OS.
Figure 11B:
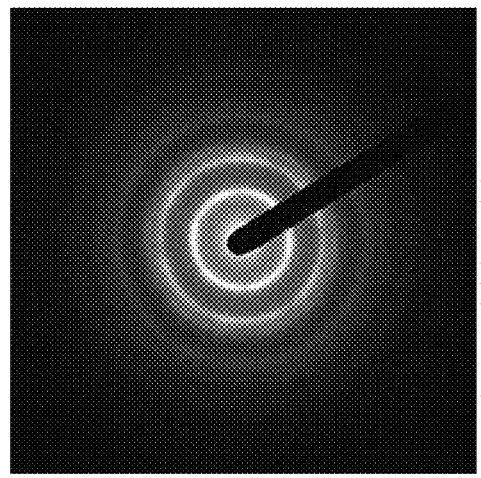

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 11A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 11B shows a diffraction pattern obtained in such a manner that an electron beam with a probe diameter of 300 nm is incident on the same sample in a direction perpendicular to the sample surface. As shown in FIG. 11B, a ring-like diffraction pattern is observed. Thus, the electron diffraction also indicates that the a-axes and b-axes of the pellets included in the CAAC-OS do not have regular alignment. The first ring in FIG. 11B is considered to be derived from the (010) plane, the (100) plane, and the like of the $InGaZnO_4$ crystal. The second ring in FIG. 11B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with a low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary cannot be clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak indicating a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 12:
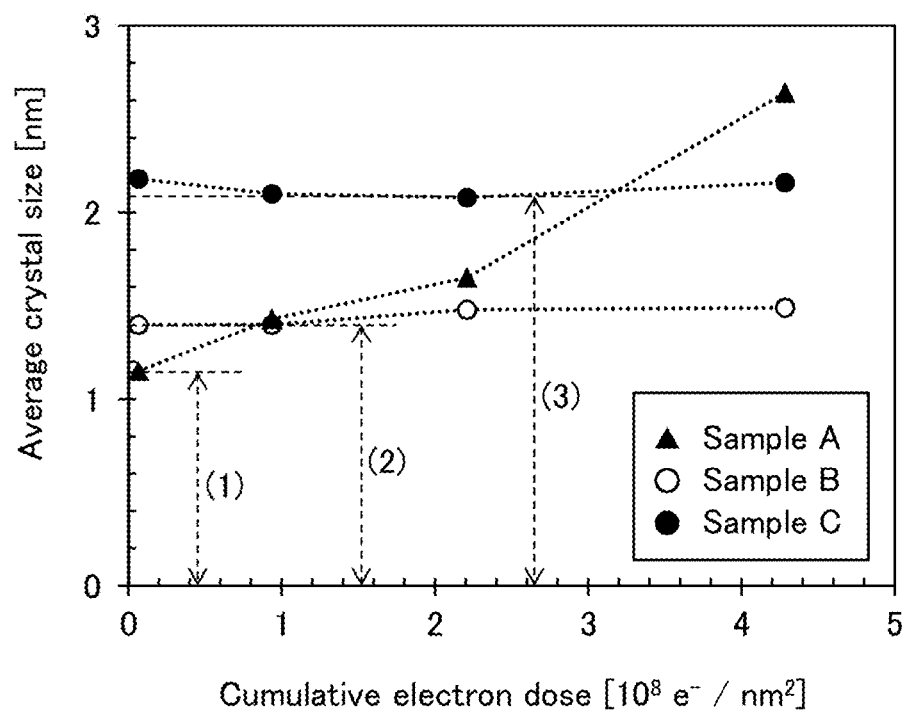
FIG. 12 shows a change in crystal part of an In—Ga—Zn oxide induced by electron irradiation.

FIG. 12 shows change in the average size of crystal parts (at 22 points to 45 points) in each sample. Note that the crystal part size corresponds to the length of a lattice fringe. FIG. 12 indicates that the crystal part size in the a-like OS increases with an increase in the cumulative electron dose. Specifically, as shown by (1) in FIG. 12, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 12, the average crystal sizes in an nc-OS and a CAAC-OS are approximately 1.4 nm and approximately 2.1 nm, respectively, regardless of the cumulative electron dose.

In this manner, growth of the crystal part in the a-like OS might be induced by electron irradiation, for example. In contrast, in the nc-OS and the CAAC-OS, it is shown that growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Method 1 for Manufacturing Transistor>

A method for manufacturing the transistor of the present invention illustrated in FIGS. 1A to 1C is described below with reference to FIGS. 13A to 13C, FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, and FIGS. 22A to 22D.

First, the substrate 400 is prepared.

Next, a conductor is formed over the substrate 400 and is then processed by a photolithography method or the like to form the conductor 413. The conductor to be the conductor 413 can be formed by a sputtering method, a CVD method, an MBE method, a PLD method, an ALD method, or the like. The conductor 413 may have a multilayer structure including a conductor that is less likely to transmit oxygen.

Another method for forming the conductor 413 is described. An insulator to be the insulator 402 is formed over the substrate 400. An opening is formed in the insulator 402, whereby a conductor to be the conductor 413 is formed over the insulator 402. The conductor 413 may be embedded to the opening in the insulator 402 by chemical mechanical polishing (CMP) or the like.

In the photolithography method, first, a resist is exposed to light through a photomask. Next, a region exposed to light is removed or left using a developing solution, so that a resist mask is formed. Then, etching through the resist mask is conducted. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique in which a portion between a substrate and a projection lens is filled with liquid (e.g., water) to perform light exposure may be employed. An electron beam or an ion beam may be used instead of the above-mentioned light. Note that a photomask is not necessary in the case of using an electron beam or an ion beam. For the removal of the resist mask, dry etching treatment such as ashing, wet etching treatment, or both can be used.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, the capacitively coupled plasma etching apparatus may have a structure in which different high-frequency power is applied to one of the parallel plate type electrodes. Alternatively, the capacitively coupled plasma etching apparatus may have a structure in which high-frequency power with the same frequency is applied to the parallel plate type electrodes. Alternatively, the capacitively coupled plasma etching apparatus may have a structure in which high-frequency power with different frequencies is applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example Next, the insulator 402 is formed. The insulator 402 may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object to be processed. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such damage due to exposure to plasma is not caused and the yield of the semiconductor device can be increased. In a thermal CVD method, an object to be processed is not exposed to plasma during deposition, so that a film with few defects can be obtained.

An ALD method also causes less plasma damage to an object to be processed. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object to be processed. Thus, a CVD method and an ALD method enable favorable step coverage almost regardless of the shape of an object to be processed. In particular, an ALD method enables excellent step coverage and excellent thickness uniformity and can be favorably used for covering a surface of an opening with a high aspect ratio, for example. On the other hand, an ALD method has a low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Next, treatment to add oxygen to the insulator 402 may be performed. For the treatment to add oxygen, an ion implantation method, a plasma treatment method, or the like can be used. Note that oxygen added to the insulator 402 is excess oxygen.

Next, an insulator to be the insulator 406a is formed over the insulator 402. The insulator to be the insulator 406a can be formed by a sputtering method, a CVD method, an MBE method, a PLD method, an ALD method, or the like. It is particularly preferable to use a facing-target sputtering apparatus. Note that in this specification and the like, deposition using a facing-target sputtering apparatus can also be referred to as vapor deposition sputtering (VDSP).

The use of the facing-target sputtering apparatus can reduce plasma damage induced during deposition of the insulator. Thus, oxygen vacancies in the insulator can be reduced. In addition, the use of the facing-target sputtering apparatus allows deposition in high vacuum. In that case, impurity concentration (e.g., concentration of hydrogen, a rare gas (such as argon), or water) in the deposited insulator can be reduced.

Alternatively, a sputtering apparatus including an inductively-coupled antenna conductor plate may be used. Thus, a large film with high uniformity can be formed with a high deposition rate.

Deposition is preferably performed using a gas containing oxygen, a rare gas, a gas containing nitrogen, or the like. As the gas containing nitrogen, nitrogen ($N_2$), dinitrogen oxide ($N_2O$), ammonia ($NH_3$), or the like may be used, for example.

Next, treatment to add oxygen to the insulator to be the insulator 406a may be performed. An ion implantation method, a plasma treatment method, or the like can be used for the treatment to add oxygen. Note that oxygen added to the insulator to be the insulator 406a is excess oxygen.

Next, the semiconductor to be the semiconductor 406b is formed over the insulator to be the insulator 406a. The semiconductor can be formed by a sputtering method, a CVD method, an MBE method, a PLD method, an ALD method, or the like. It is particularly preferable to use a facing-target sputtering apparatus.

The use of the facing-target sputtering apparatus can reduce plasma damage induced during deposition of the semiconductor. Accordingly, oxygen vacancies in the semiconductor can be reduced. In addition, the use of the facing-target sputtering apparatus allows deposition in high vacuum. In that case, impurity concentration (e.g., concentration of hydrogen, a rare gas (such as argon), or water) in the deposited semiconductor can be reduced.

Alternatively, a sputtering apparatus including an inductively-coupled antenna conductor plate may be used. Thus, a large film with high uniformity can be formed with a high deposition rate.

Deposition is preferably performed using a gas containing oxygen, a rare gas, a gas containing nitrogen, or the like. As the gas containing nitrogen, nitrogen ($N_2$), dinitrogen oxide ($N_2O$), or ammonia ($NH_3$) may be used, for example.

Next, first heat treatment is preferably performed. The first heat treatment can be performed at a temperature higher than or equal to 250° C. and lower than or equal to 650° C., preferably higher than or equal to 450° C. and lower than or equal to 600° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased and impurities such as hydrogen and moisture can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a plasma power source for applying a radio frequency (RF) voltage to a substrate side may be provided. The use of high-density plasma enables high-density oxygen radicals to be produced, and application of the RF voltage to the substrate side allows oxygen radicals generated by the high-density plasma to be efficiently introduced into the semiconductor 406b. Alternatively, after plasma treatment using an inert gas with the apparatus, plasma treatment using oxygen in order to compensate released oxygen may be performed.

Figure 13A:
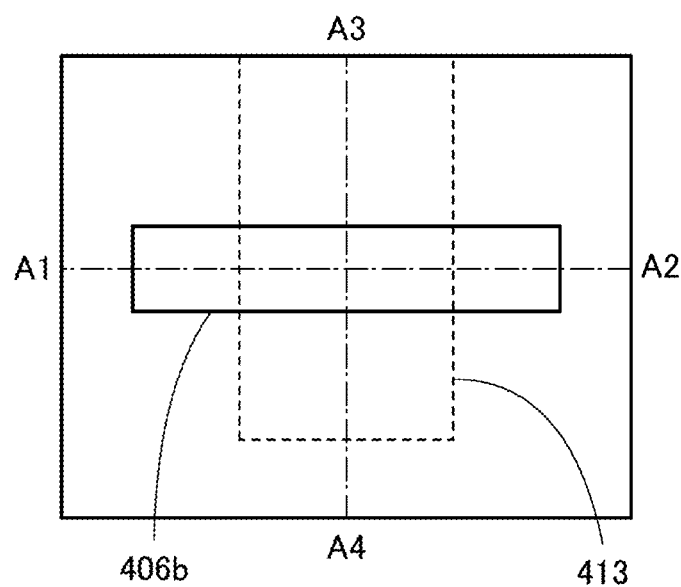
FIGS. 13A to 13C are a top view and cross-sectional view illustrating a method for manufacturing a transistor of one embodiment of the present invention.
Figure 13B:
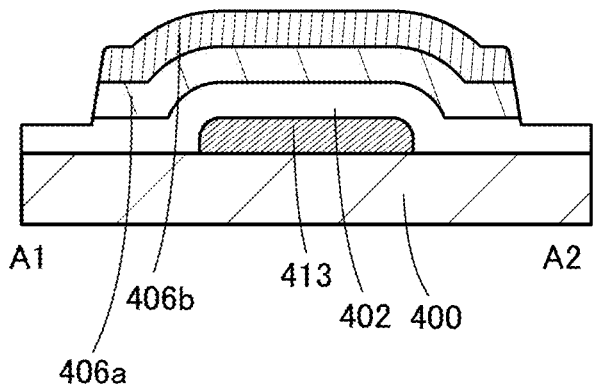
Figure 13C:
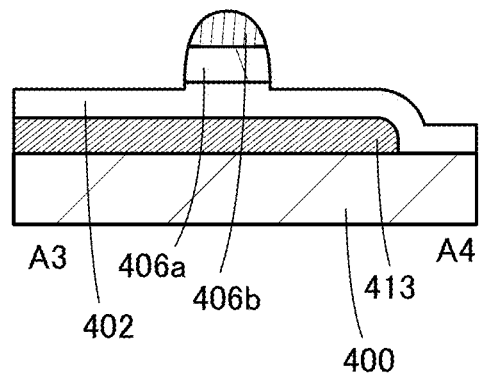
Figure 14A:
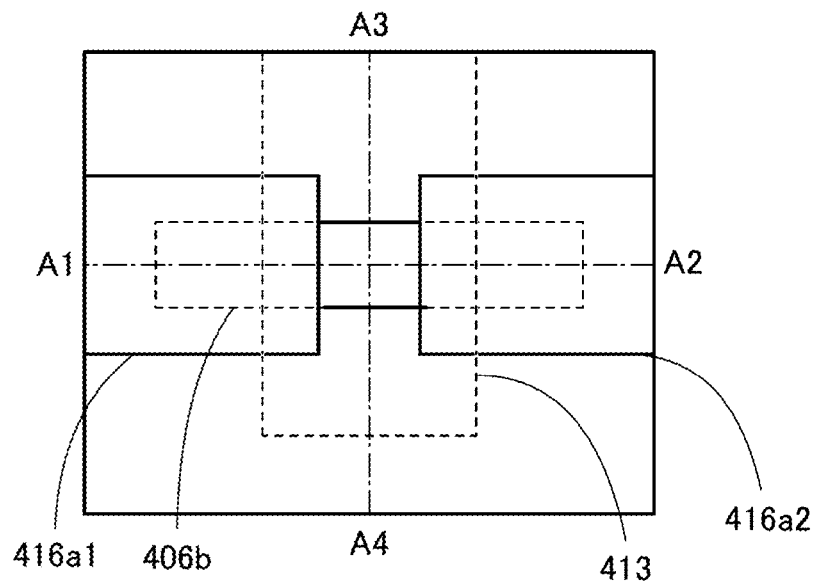
FIGS. 14A to 14C are a top view and cross-sectional views illustrating a method for manufacturing a transistor of one embodiment of the present invention.
Figure 14B:
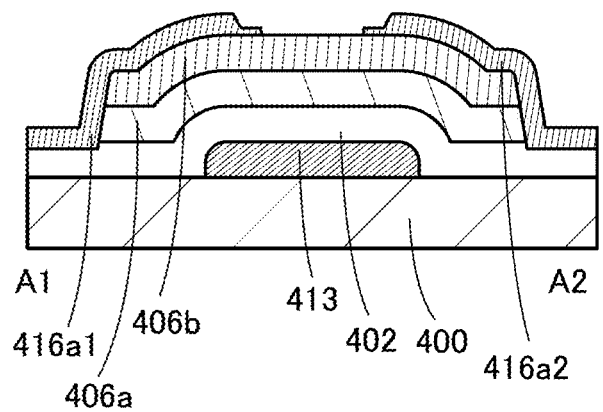
Figure 14C:
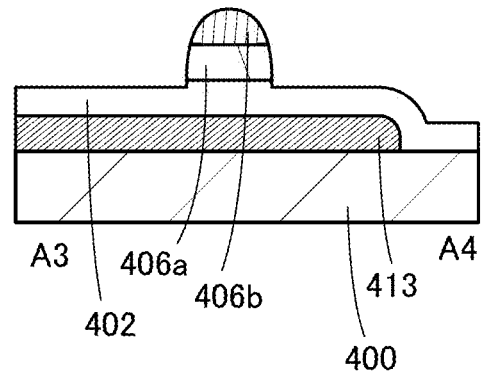
Figure 15A:
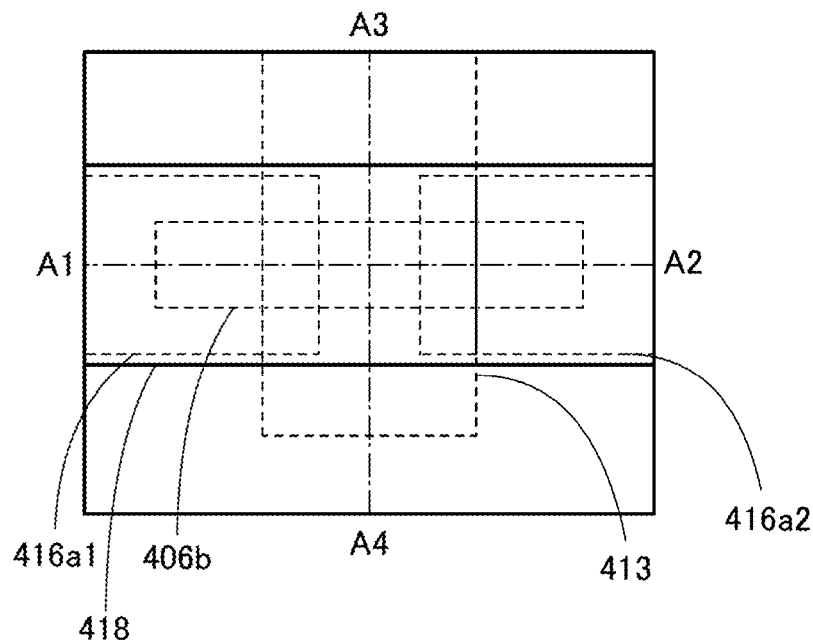
FIGS. 15A to 15C are a top view and cross-sectional views illustrating a method for manufacturing a transistor of one embodiment of the present invention.
Figure 15B:
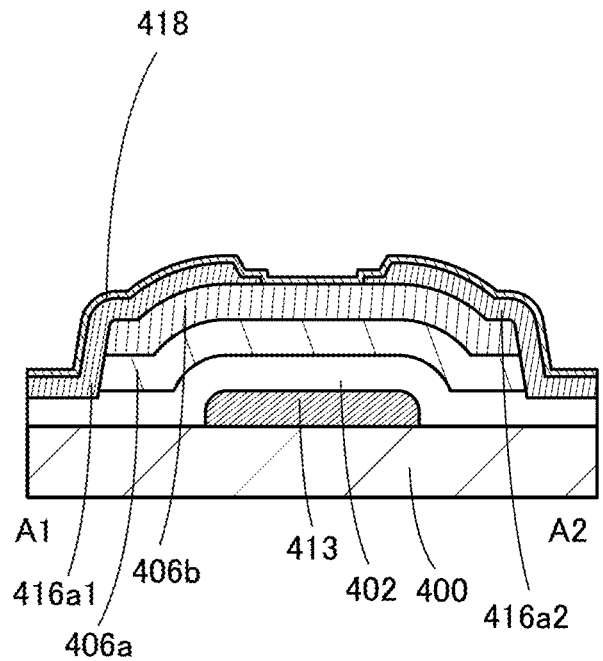
Figure 15C:
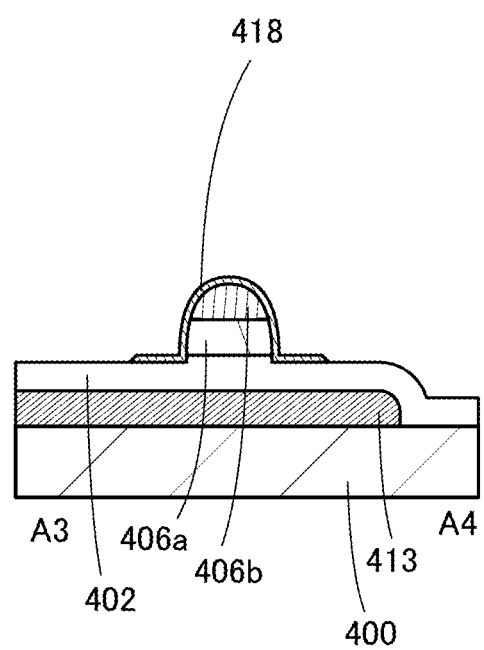

Next, the insulator to be the insulator 406a and the semiconductor to be the semiconductor 406b are processed by a photolithography method or the like to form a multilayer film including the insulator 406a and the semiconductor 406b (see FIGS. 13A to 13C). Note that when the multilayer film is formed, the insulator 402 is also subjected etching to have a thinned region in some cases. That is, the insulator 402 may have a protruding portion in a region in contact with the multilayer film.

Next, a conductor is formed. The conductor can be formed by a sputtering method, a CVD method, an MBE method, a PLD method, an ALD method, or the like.

Then, a first resist is formed over the conductor by a photolithography method or the like. First etching is performed by dry etching or the like using the first resist as a mask. Next, second etching is performed. In the second etching, dry etching is performed on the first resist using oxygen plasma or the like to reduce the first resist, so that the second resist is formed. Then, the third etching is performed. In the third etching, the conductor is etched using the second resist as a mask to form the conductors 416a1 and 416a2 each having a step-like end portion. In the first etching, 20% to 80%, preferably 30% to 60%, of the thickness of the conductor is etched, whereby the end portions of the conductor can be thin. In this manner, the conductors 416a1 and 416a2 each have regions with different thicknesses (see FIGS. 14A to 14C).

Note that the conductors 416a1 and 416a2 cover the multilayer film. The side surface of the insulator 406a and the top and side surfaces of the semiconductor 406b are partly damaged in forming the conductors over the multilayer film, and then a region where resistance is reduced might be formed. Since each of the insulator 406a and the semiconductor 406b includes a region whose resistance is lowered, the contact resistance between the semiconductor 406b and the conductors 416a1 and 416a2 can be lowered.

Next, a conductor is formed. The conductor can be formed by a sputtering method, a CVD method, an MBE method, a PLD method, an ALD method, or the like. The conductor is processed by a photolithography method or the like to form a conductor 418 (see FIGS. 15A to 15C).

Next, an insulator to be the insulator 410 is formed. The insulator to be the insulator 410 can be formed by a sputtering method, a CVD method, an MBE method, a PLD method, an ALD method, or the like. Alternatively, the insulator to be the insulator 410 can be formed by a spin coating method, a dipping method, a droplet discharging method (such as an ink-jet method), a printing method (such as screen printing or offset printing), a doctor knife method, a roll coater method, a curtain coater method, or the like.

The insulator to be the insulator 410 may be formed to have a flat top surface. For example, the top surface of the insulator to be the insulator 410 may have planarity immediately after the film formation. Alternatively, the insulator to be the insulator 410 may be planarized by removing the insulator or the like from the top surface so that the top surface becomes parallel to a reference surface such as a rear surface of the substrate. Such treatment is referred to as planarization treatment. As the planarization treatment, for example, chemical mechanical polishing treatment, dry etching treatment, or the like can be performed. However, the top surface of the insulator to be the insulator 410 is not necessarily flat.

Next, a resist mask is formed over the insulator to be the insulator 410 by a photolithography method or the like. Here, an organic coating film may be formed between the top surface of the insulator to be the insulator 410 and the resist mask in order to improve the adhesion between the top surface of the insulator to be the insulator 410 and the resist mask.

Next, the insulator to be the insulator 410 is subjected to a first processing by a dry etching method or the like to expose the top surface of the conductor 418. As a dry etching apparatus, any of the above dry etching apparatuses can be used; however, a dry etching apparatus in which high-frequency power sources with different frequencies are connected to the parallel-plate electrodes is preferably used.

Then, the conductor 418 is subjected to a second processing by a dry etching method or the like so as to be separated into a conductive layer including the conductors 416a1 and 416b1 and a conductive layer including the conductors 416a2 and 416b2. Note that the insulator 410 and the conductor 418 may be processed in the same photolithography process. Processing in the same photolithography process can reduce the number of manufacturing steps. Thus, a semiconductor device including the transistor can be manufactured with high productivity. Alternatively, the insulator 410 and the conductor 418 may be processed in different photolithography processes. Processing in different photolithography processes may facilitate formation of films with different shapes (see FIGS. 16A to 16C).

At this time, the semiconductor 406b has a region that is exposed. The exposed region of the semiconductor 406b is partly removed by the second processing in some cases. Furthermore, impurity elements such as residual components of the etching gas are attached to the exposed surface of the semiconductor 406b in some cases. For example, when a chlorine-based gas is used as an etching gas, chlorine and the like are attached in some cases. Furthermore, when a hydrocarbon-based gas is used as an etching gas, carbon, hydrogen, and the like are attached in some cases. Thus, the impurity elements attached to the exposed surface of the semiconductor 406b are preferably reduced. The impurity elements can be reduced by cleaning treatment using dilute hydrofluoric acid, cleaning treatment using ozone, cleaning treatment using ultra violet rays, or the like. Note that some kinds of cleaning treatment may be used in combination. Accordingly, the exposed surface of the semiconductor 406b, that is, the channel formation region has a high resistance.

The method for forming the conductors 416b1 and 416b2 may be different from the above method. For example, a conductor to be the conductors 416b1 and 416b2 is formed after the conductors 416a1 and 416a2 are formed. Next, the conductor is processed by a photolithography method or the like to form the conductors 416b1 and 416b2. Then, the insulator to be the insulator 410 is formed and processed to have an opening through which the semiconductor 406b is exposed.

Figure 17A:
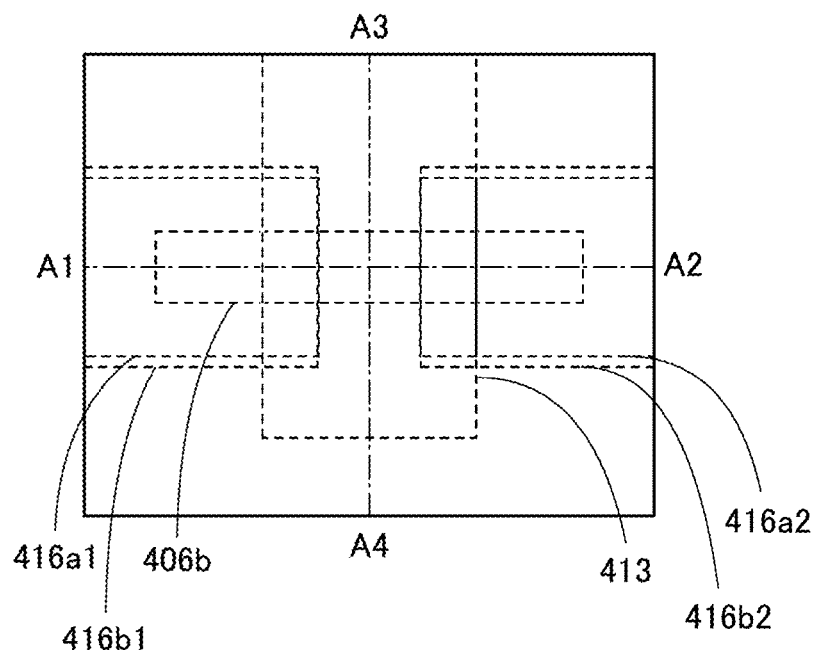
FIGS. 17A to 17C are a top view and cross-sectional views illustrating a method for manufacturing a transistor of one embodiment of the present invention.
Figure 17B:
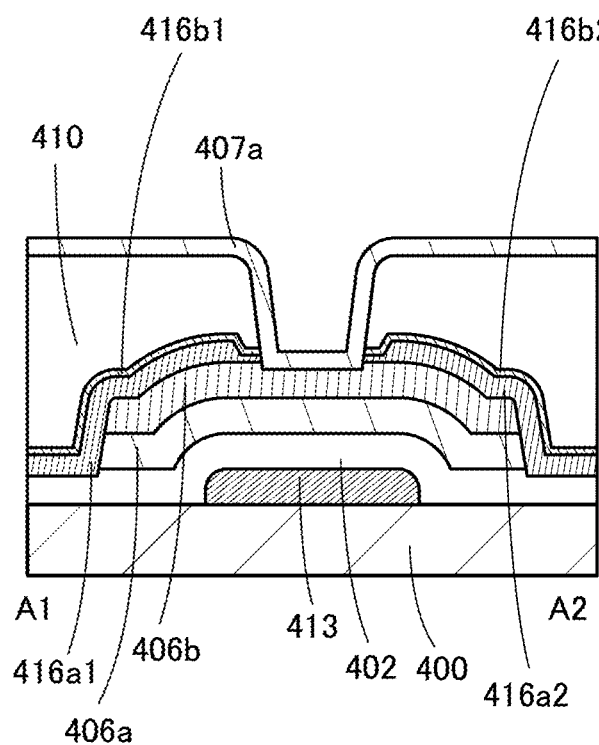
Figure 17C:
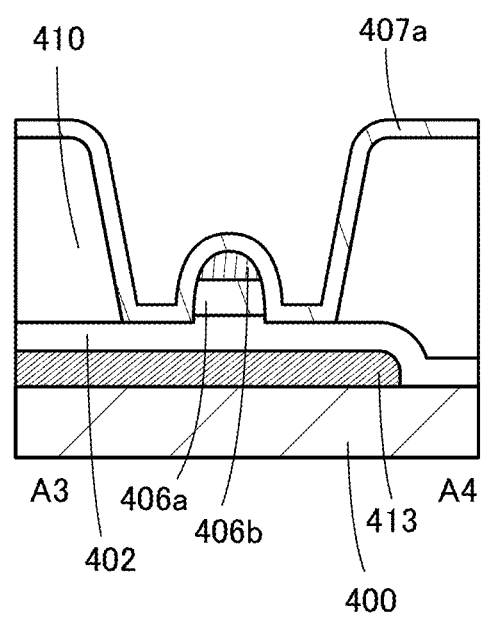

Next, an insulator 407a is formed (see FIGS. 17B and 17C). The insulator 407a can be formed by a sputtering method, a CVD method, an MBE method, a PLD method, an ALD method, or the like. The insulator 407a may be formed in a manner similar to that of the insulator 406a.

Figure 18A:
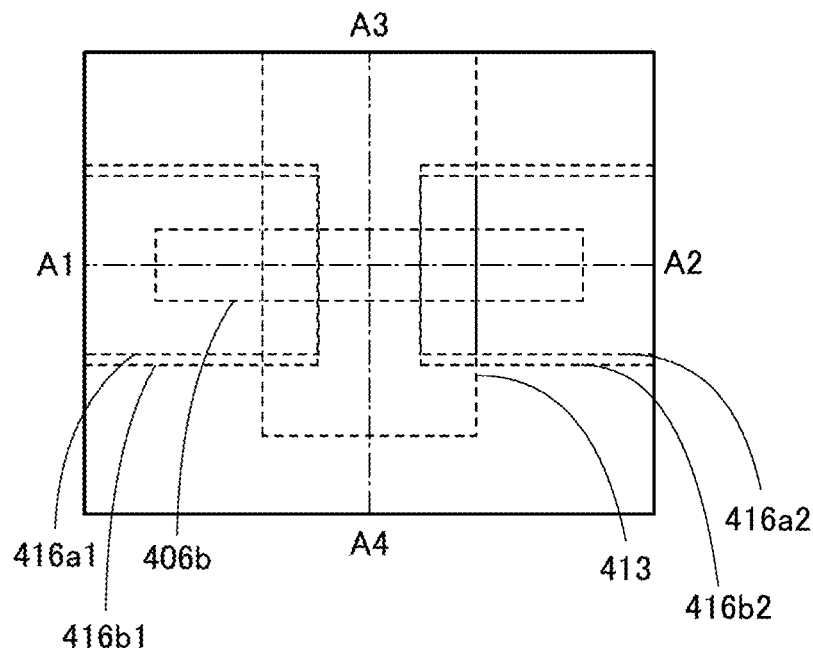
FIGS. 18A to 18C are a top view and cross-sectional views illustrating a method for manufacturing a transistor of one embodiment of the present invention.
Figure 18B:
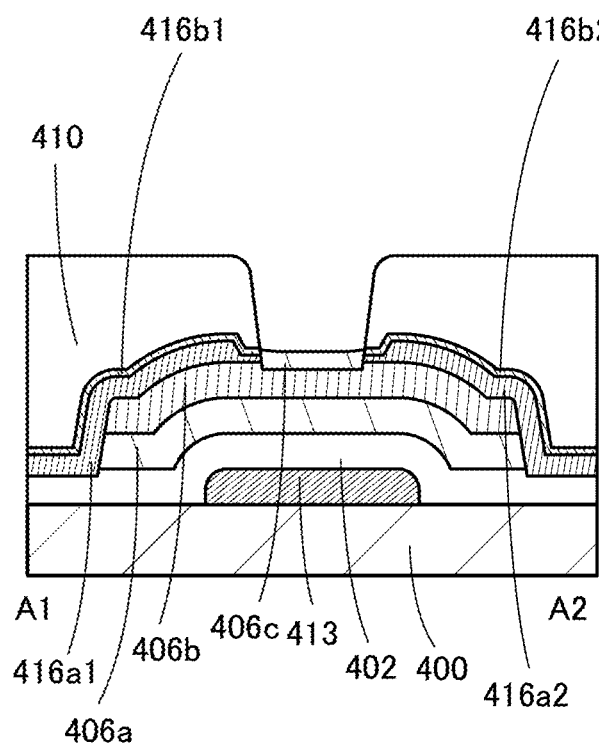
Figure 18C:
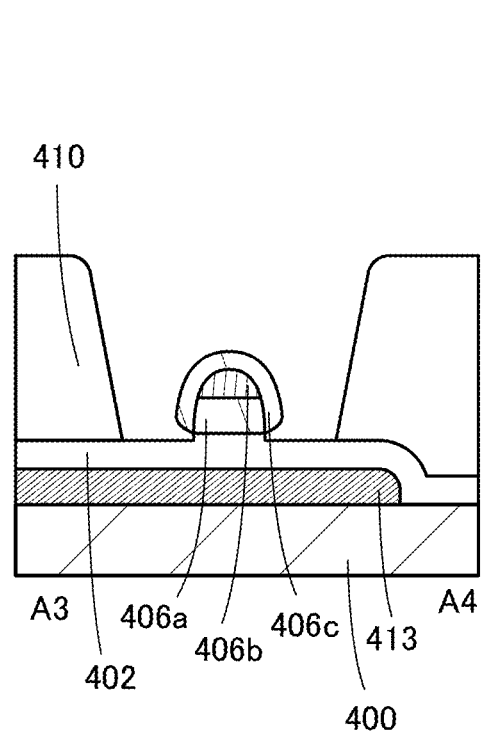

Next, the insulator 407a is etched to form the insulator 406c (see FIGS. 18B and 18C). The etching is preferably performed by wet etching. Accordingly, the insulator 407a can be selectively etched in accordance with the crystallinity or the like of the insulator. As an etchant of the wet etching, an acid solution is preferably used. For example, a solution containing hydrofluoric acid, a solution obtained by mixing phosphoric acid, acetic acid, and nitric acid, a solution containing oxalic acid, or a solution containing phosphoric acid can be used. Furthermore, the etchant is not limited to an acid solution and may be an alkaline solution. As the alkaline solution, an ammonia hydrogen peroxide mixture (a mixed solution of ammonia, water, and a hydrogen peroxide solution) may be used, for example.

In the insulator 407a, a region in contact with the semiconductor 406b and the insulator 406a has high crystallinity. In contrast, in the insulator 407a, a region in contact with the insulator 410 has low crystallinity. In particular, it is preferable that the insulator 406a and the semiconductor 406b each have a CAAC-OS, and thus the region of the insulator 407a in contact with the insulator 406a and the semiconductor 406b tends to be an insulator having a CAAC-OS. The etching resistance of the region having a CAAC-OS is higher than that of the region not having a CAAC-OS.

Accordingly, since the insulator 407a has regions with different crystallinities, the insulator 407a can be selectively etched without using a mask.

Figure 19A:
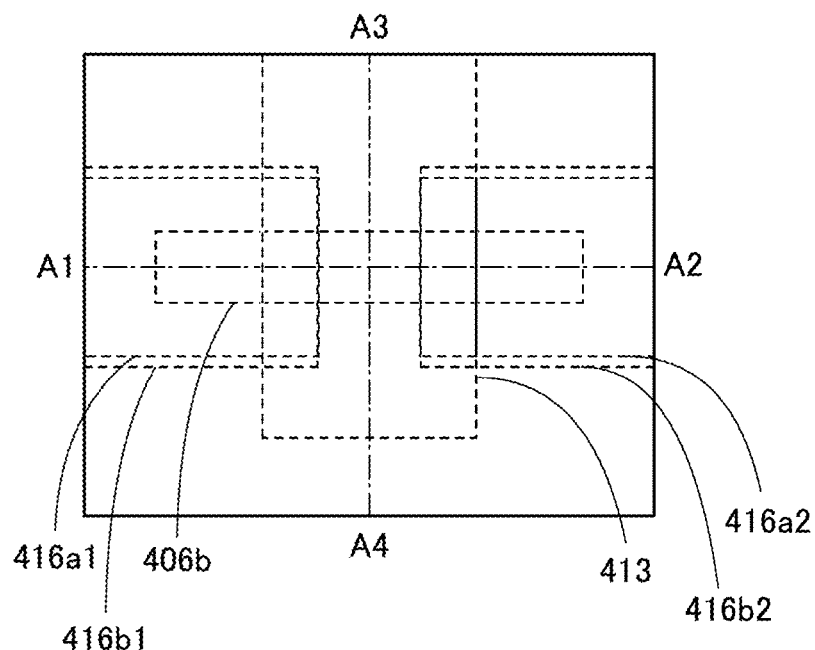
FIGS. 19A to 19C are a top view and cross-sectional views illustrating a method for manufacturing a transistor of one embodiment of the present invention.
Figure 19B:
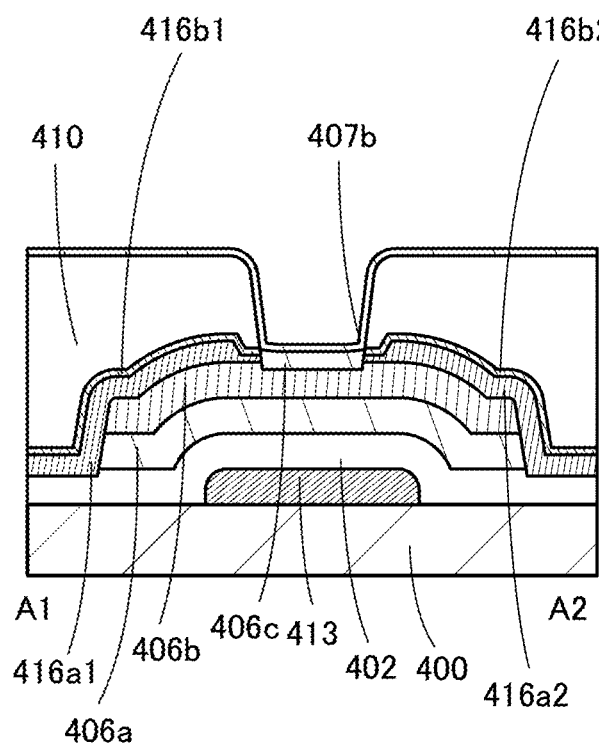
Figure 19C:
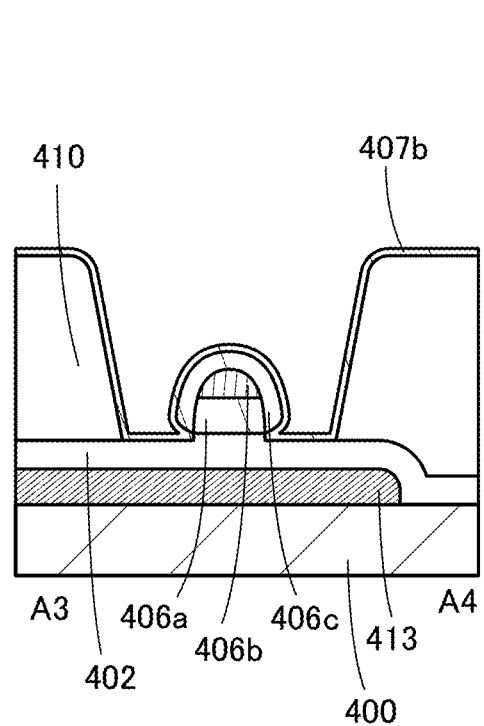

Then, an insulator 407b is formed (see FIGS. 19B and 19C). The insulator 407b can be formed by a sputtering method, a CVD method, an MBE method, a PLD method, an ALD method, or the like. The insulator 407b may be formed in a manner similar to that of the insulator 406a.

Figure 20A:
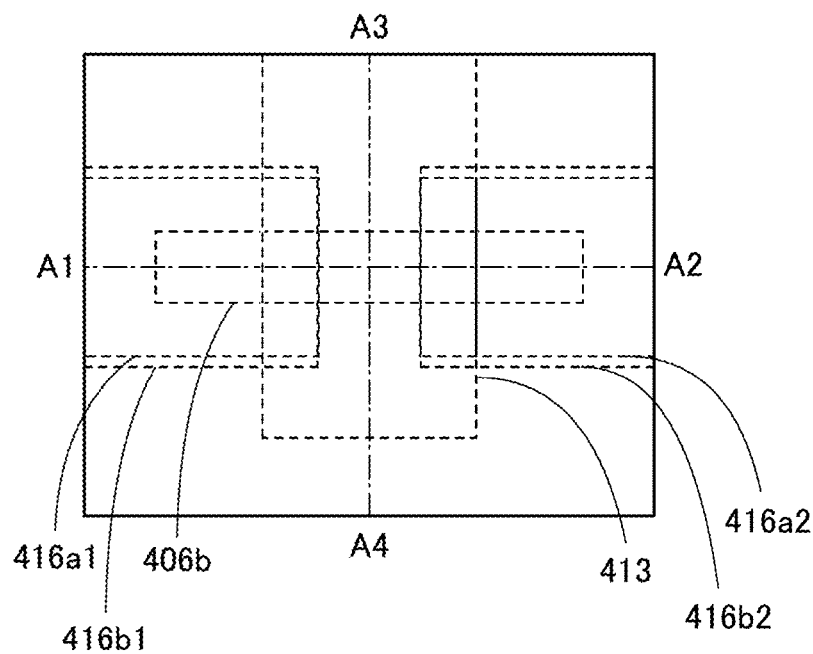
FIGS. 20A to 20C are a top view and cross-sectional views illustrating a method for manufacturing a transistor of one embodiment of the present invention.
Figure 20B:
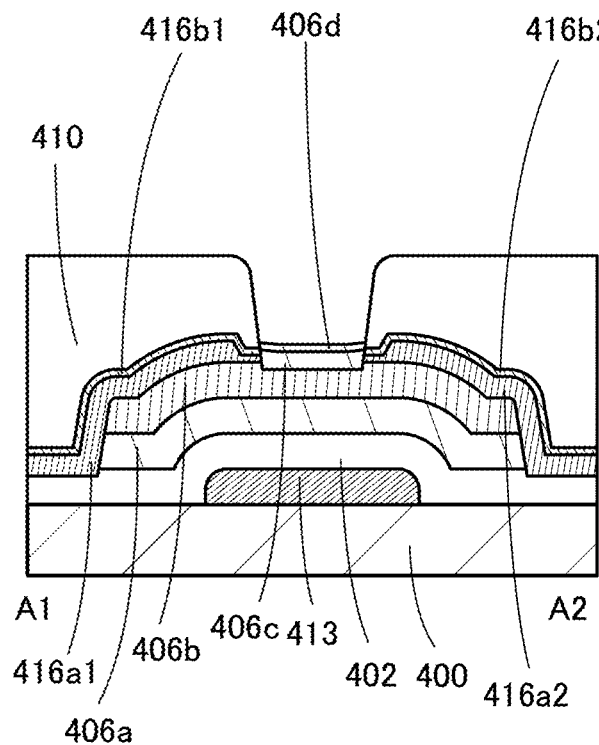
Figure 20C:
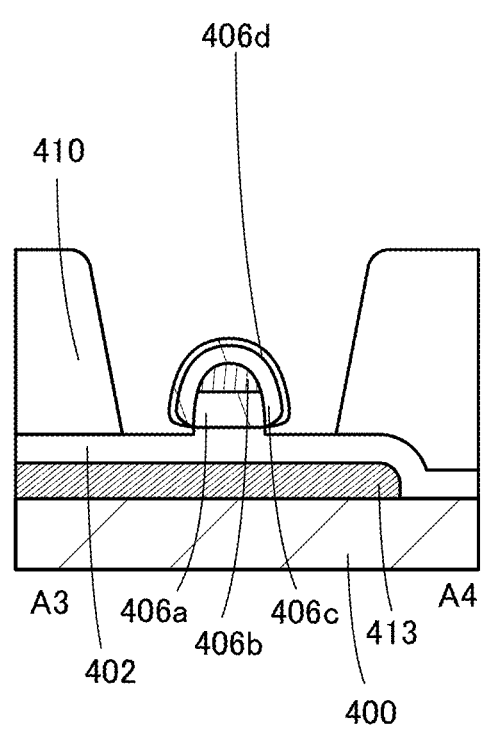

Next, the insulator 407b is etched to form the insulator 406d (see FIGS. 20B and 20C). The etching is preferably performed by wet etching. Accordingly, the insulator 407b can be selectively etched in accordance with the crystallinity or the like of the insulator. As an etchant of the wet etching, an acid solution is preferably used. For example, a solution containing hydrofluoric acid, a solution obtained by mixing phosphoric acid, acetic acid, and nitric acid, a solution containing oxalic acid, or a solution containing phosphoric acid can be used. Furthermore, the etchant is not limited to an acid solution and may be an alkaline solution. As the alkaline solution, an ammonia hydrogen peroxide mixture (a mixed solution of ammonia, water, and a hydrogen peroxide solution) may be used, for example.

In the insulator 407b, a region in contact with the insulator 406c has high crystallinity. In contrast, in the insulator 407b, a region in contact with the insulator 410 has low crystallinity. In particular, it is preferable that the insulator 406c have a CAAC-OS, and thus the region of the insulator 407b in contact with the insulator 406c tends to be an insulator having a CAAC-OS. The etching resistance of the region having a CAAC-OS is higher than that of the region not having a CAAC-OS. Accordingly, since the insulator 407b has regions with different crystallinities, the insulator 407b can be selectively etched without using a mask.

Next, an insulator to be the insulator 412 is formed over the insulators 410 and 406d. The insulator to be the insulator 412 can be formed by a sputtering method, a CVD method, an MBE method, a PLD method, an ALD method, or the like.

Next, a conductor to be the conductor 404 is formed. The conductor to be the conductor 404 can be formed by a sputtering method, a CVD method, an MBE method, a PLD method, an ALD method, or the like. The conductor to be the conductor 404 is formed so as to fill the opening formed by the insulator 410 and the like. Therefore, a CVD method (an MCVD method, in particular) is preferred. A stacked-layer film of a conductor formed by an ALD method or the like and a conductor formed by a CVD method is preferred in some cases to increase adhesion of the conductor formed by an MCVD method. For example, a stacked-layer film where titanium nitride and tungsten are formed in this order may be used.

Then, the conductor to be the conductor 404 is processed by a photolithography method to form the conductor 404.

Figure 21A:
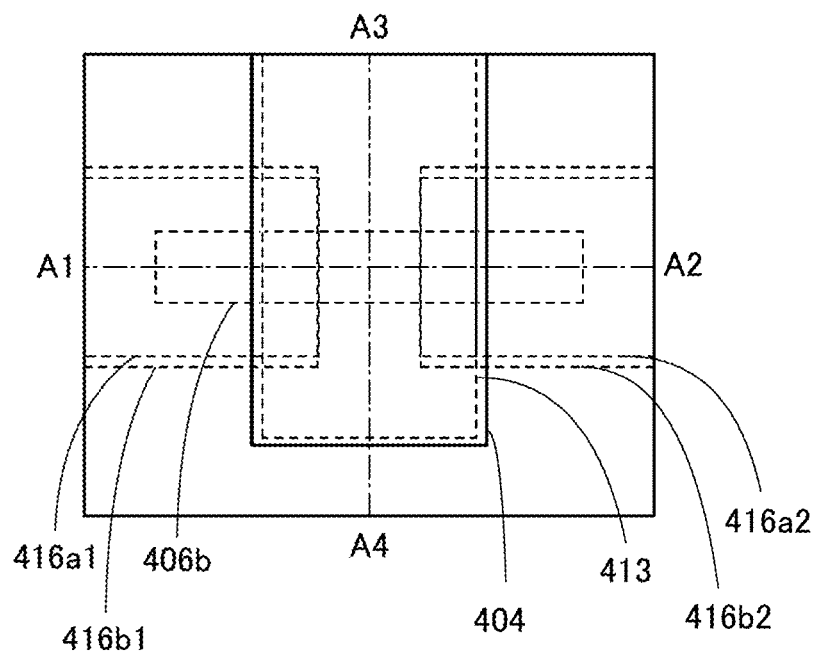
FIGS. 21A to 21C are a top view and cross-sectional views illustrating a method for manufacturing a transistor of one embodiment of the present invention.
Figure 21B:
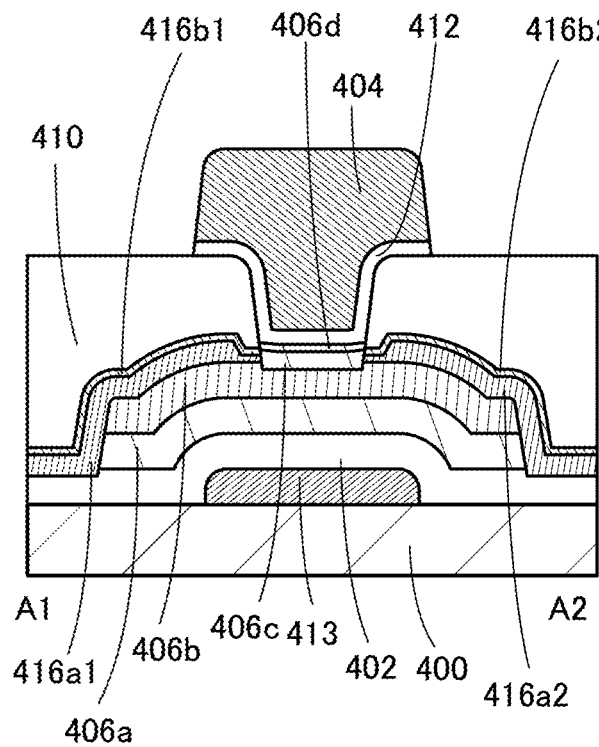
Figure 21C:
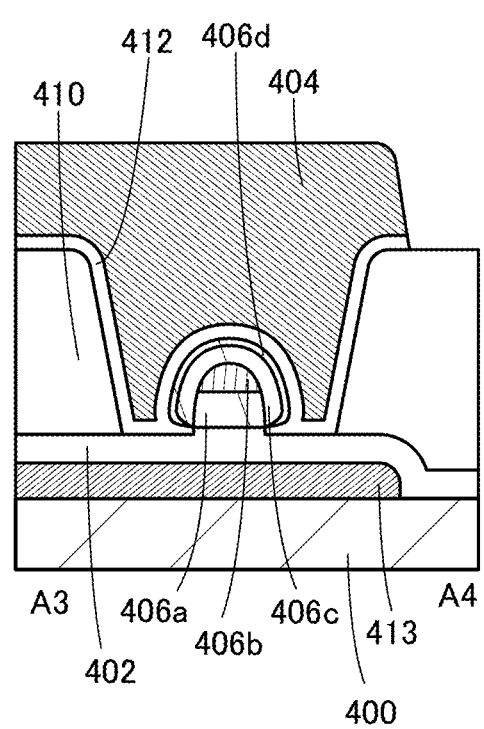

Next, the insulator to be the insulator 412 is processed by a photolithography method or the like, so that the insulator 412 is formed (see FIGS. 21B and 21C). Note that the conductor to be the conductor 404 and the insulator to be the insulator 412 may be processed in the same photolithography step. Processing in the same photolithography process can reduce the number of manufacturing steps. Thus, productivity of a semiconductor device including a transistor can be increased. Alternatively, the conductor to be the conductor 404 and the insulator to be the insulator 412 may be processed in different photolithography processes. Processing in different photolithography processes may facilitate formation of films with different shapes. Although an example where the insulator to be the insulator 412 is processed is shown here, the transistor of one embodiment of the present invention is not limited thereto. For example, the insulator to be the insulator 412 may be used without being processed in some cases.

Figure 22A:
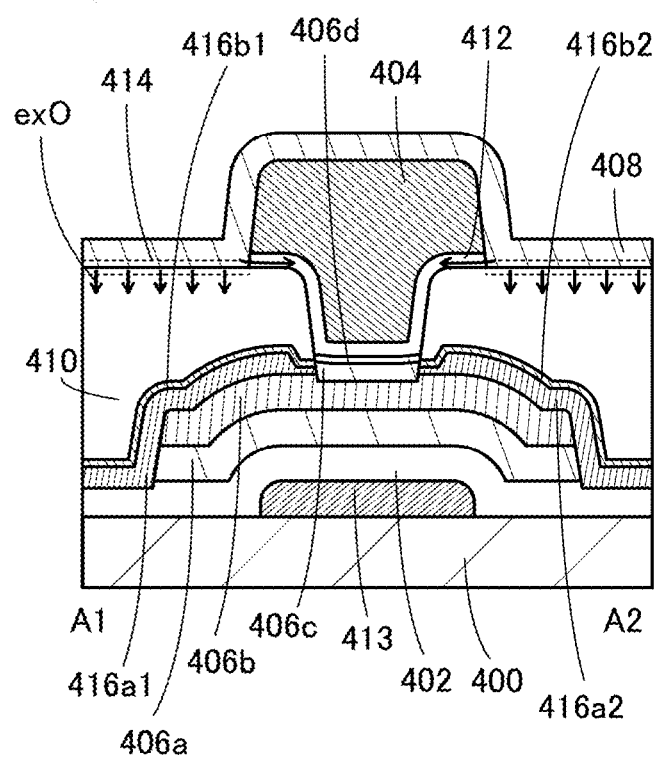
FIGS. 22A to 22D are cross-sectional views illustrating a method for manufacturing a transistor of one embodiment of the present invention.
Figure 22B:
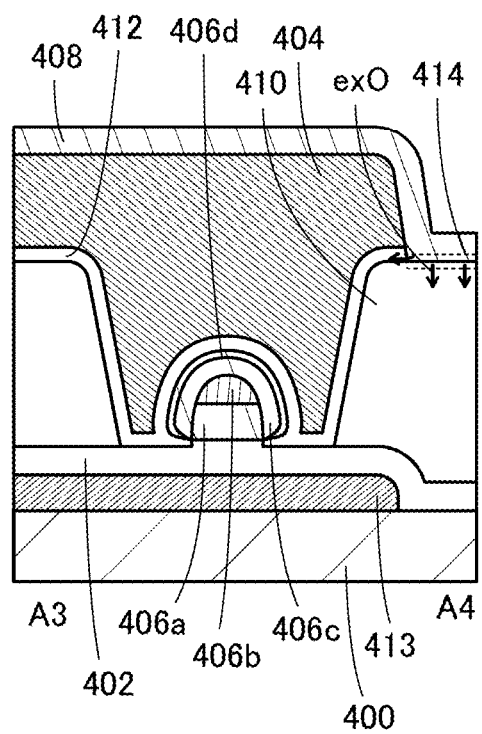
Figure 22C:
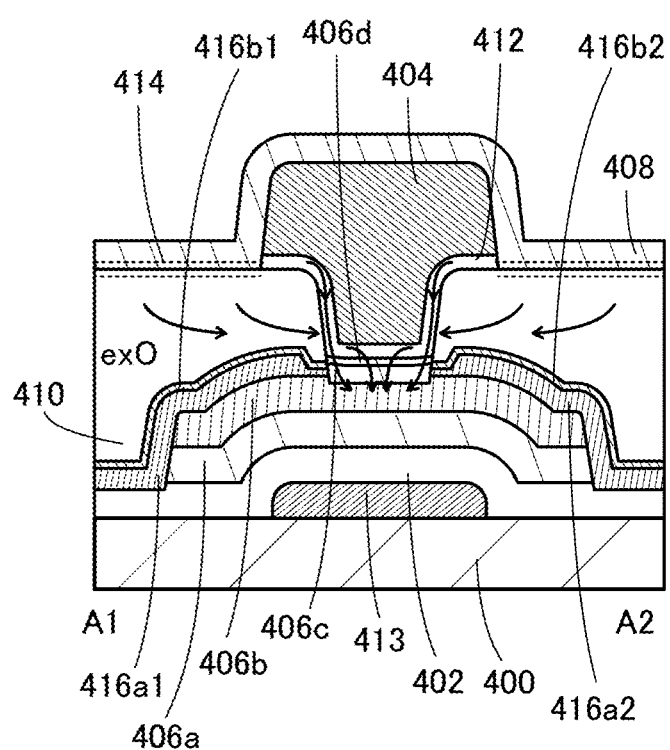
Figure 22D:
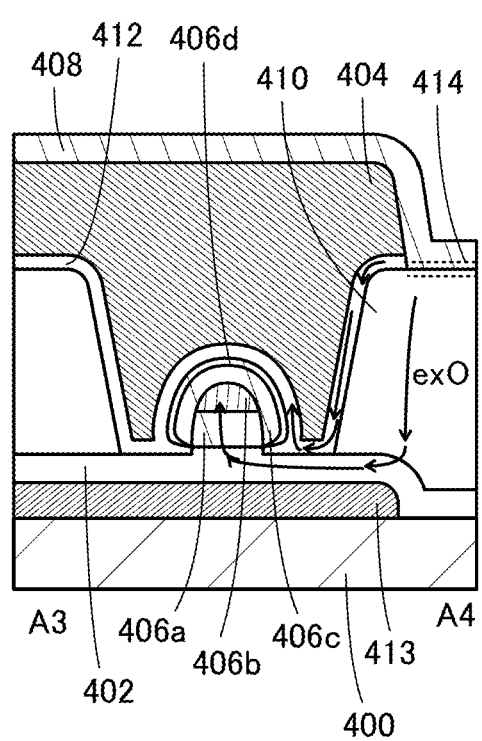

Next, the insulator 408 is formed over the insulator 410 and the conductor 404. The insulator 408 can be formed by a sputtering method, a CVD method, an MBE method, a PLD method, an ALD method, or the like. Aluminum oxide is preferably formed as the insulator 408 using plasma containing oxygen, so that oxygen in the plasma can be added to the top surface of the insulator 410 and a region of the insulator 412 in contact with the insulator 408 as excess oxygen (exO). Here, the mixed region 414 containing a large amount of excess oxygen might be formed in the interface between the insulator 408 and the insulator 410 and the vicinity of the interface. FIGS. 22A and 22B illustrate the state where the excess oxygen is added to the vicinity of the mixed region 414 by arrows.

Second heat treatment may be performed at any time after the formation of the insulator 408. By the second heat treatment, the excess oxygen contained in the insulator 410 and the mixed region 414 is moved to the semiconductor 406b through the insulator 412, the insulator 402, the insulator 406d, the insulator 406c, and the insulator 406a. Since excess oxygen is moved to the semiconductor 406b as described above, defects (oxygen vacancies) in the semiconductor 406b can be reduced (see FIGS. 22C and 22D).

Note that the second heat treatment may be performed at a temperature such that excess oxygen in the insulator 410 and the mixed region 414 is diffused to the semiconductor 406b. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen from the insulator 402 or the like can be inhibited. Note that the second heat treatment is not necessarily performed when heating during formation of the films can work as heat treatment comparable to the second heat treatment.

Although not illustrated, an opening reaching the conductor 416a1 and an opening reaching the conductor 416a2 may be formed in the insulator 408 and the insulator 410, and conductors serving as wirings may be formed in the openings. Alternatively, an opening reaching the conductor 404 may be formed in the insulator 408, and a conductor serving as a wiring may be formed in the opening.

Through the above steps, the transistor illustrated in FIGS. 1A to 1C can be manufactured.

In Embodiment 1, one embodiment of the present invention has been described. Note that one embodiment of the present invention is not limited to the above examples. That is, since various embodiments of the present invention are disclosed in this embodiment and other embodiments, one embodiment of the present invention is not limited to a specific embodiment. The example in which an oxide semiconductor is used as a semiconductor has been described as one embodiment of the present invention; however, one embodiment of the present invention is not limited thereto. Depending on cases or conditions, silicon, germanium, silicon germanium, silicon carbide, gallium arsenide, aluminum gallium arsenide, indium phosphide, gallium nitride, an organic semiconductor, or the like may be used in one embodiment of the present invention.

The structure and method described in this embodiment can be implemented by being combined as appropriate with any of the other structures and methods described in the other embodiments.

Embodiment 2

Transistor Structure 2

Figure 23A:
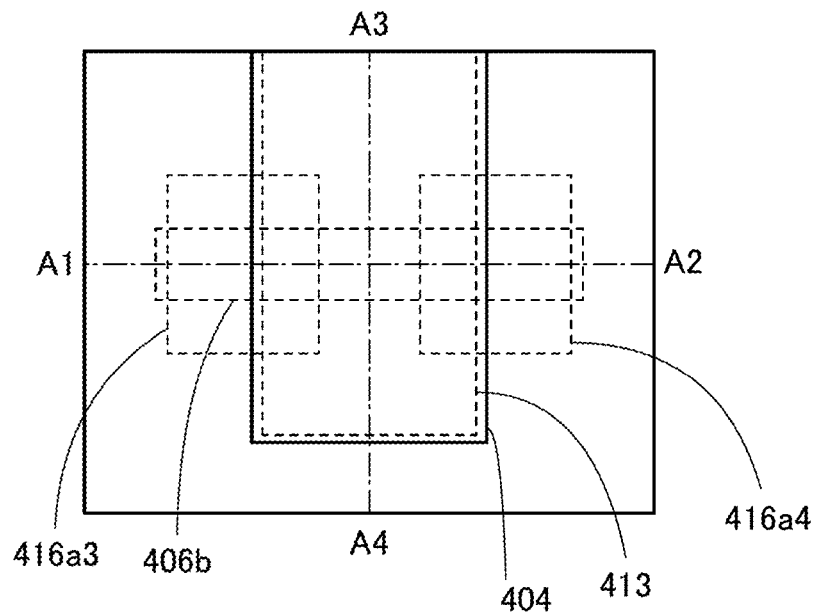
FIGS. 23A to 23C are a top view and cross-sectional views illustrating a method for manufacturing a transistor of one embodiment of the present invention.
Figure 23B:
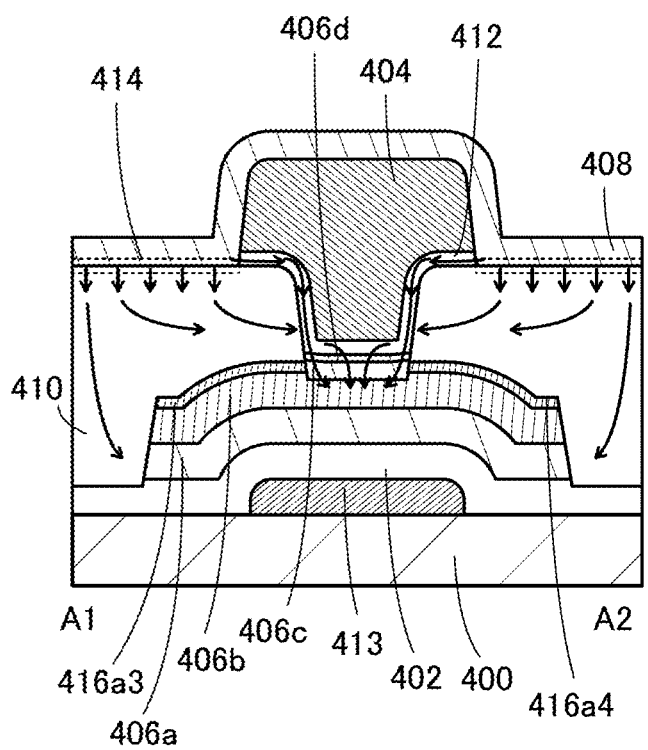
Figure 23C:
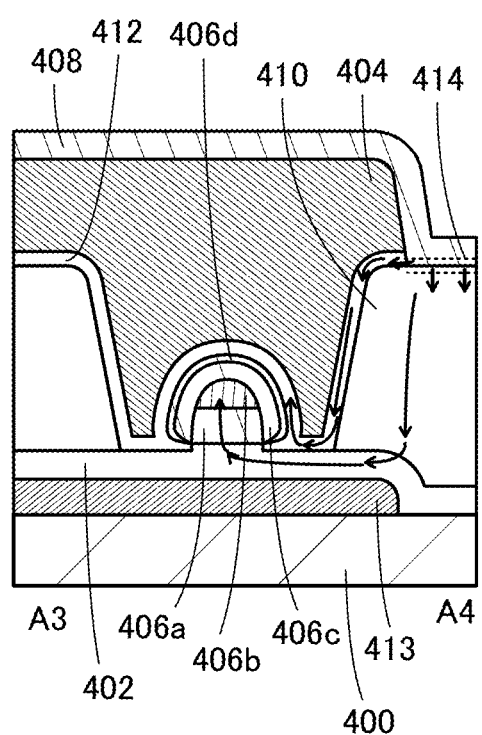

A transistor having a structure different from that in FIGS. 1A to 1C and a manufacturing method thereof will be described with reference to FIGS. 23A to 23C and FIGS. 24A to 24C. FIGS. 23A to 23C are a top view and cross-sectional views of a semiconductor device of one embodiment of the present invention. FIG. 23A is the top view, and FIGS. 23B and 23C are the cross-sectional views taken along dashed-dotted lines A1-A2 and A3-A4 in FIG. 23A, respectively. Note that for simplification of the drawing, some components are not illustrated in the top view in FIG. 23A.

In the transistor illustrated in FIGS. 23A to 23C, conductors 416a3 and 416a4 serving as a source electrode and a drain electrode are formed only over the top surface of the semiconductor 406b. For the other components, the description of the transistor in FIGS. 1A to 1C is referred to.

<Method 2 for Manufacturing Transistor>

Figure 24A:
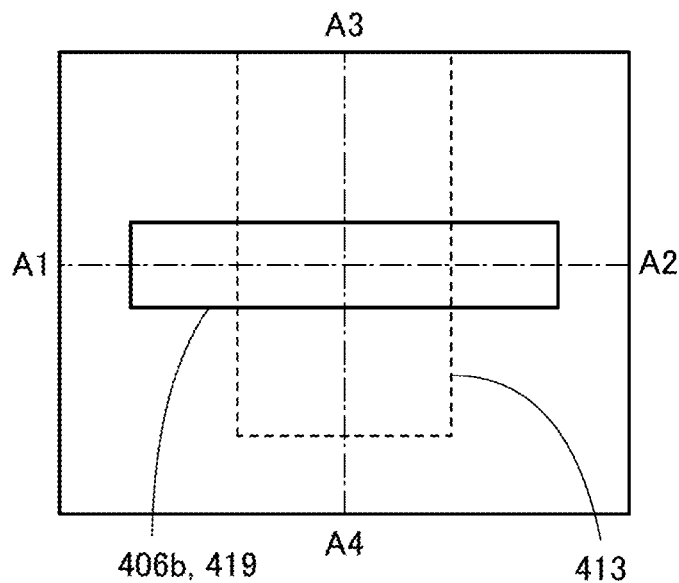
FIGS. 24A to 24C are a top view and cross-sectional views illustrating a method for manufacturing a transistor of one embodiment of the present invention.
Figure 24B:
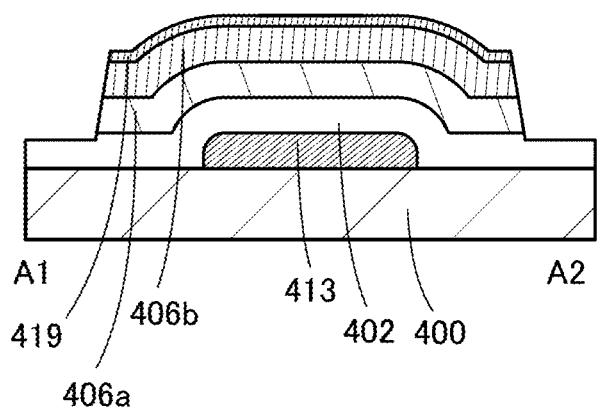
Figure 24C:
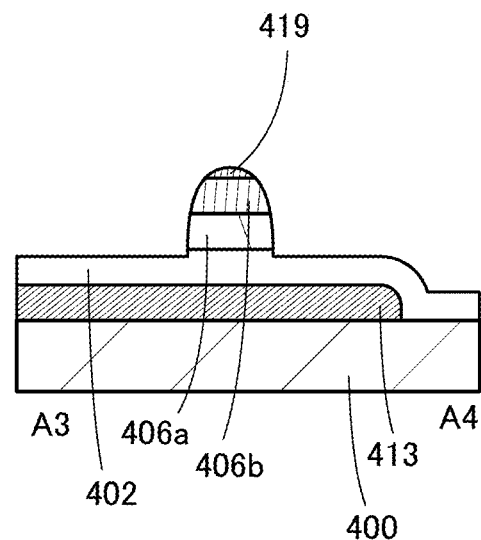

A method for manufacturing the transistor illustrated in FIGS. 23A to 23C will be described below with reference to FIGS. 24A to 24C.

First, the substrate 400 is prepared. Next, a conductor is formed over the substrate 400 and is then processed by a photolithography method or the like to form the conductor 413. Next, the insulator 402 is formed.

Next, the insulator to be the insulator 406a is formed over the insulator 402. Next, the semiconductor to be the semiconductor 406b is formed over the insulator to be the insulator 406a.

Next, first heat treatment is preferably performed. The first heat treatment may be performed in a manner similar to that in Embodiment 1. Alternatively, in the first heat treatment, plasma treatment using oxygen may be performed under a reduced pressure.

Next, a conductor to be a conductor 419 is formed over the semiconductor to be the semiconductor 406b. The conductor can be formed by a sputtering method, a CVD method, an MBE method, a PLD method, an ALD method, or the like. Then, the insulator to be the insulator 406a, the semiconductor to be the semiconductor 406b, and the conductor to be the conductor 419 are processed by a lithography method or the like to form a multilayer film including the insulator 406a, the semiconductor 406b, and the conductor 419. Here, a top surface of the semiconductor to be the semiconductor 406b is damaged when the conductor is formed, whereby a region whose resistance is decreased is formed in some cases. The semiconductor 406b includes the region whose resistance is decreased; thus, contact resistance between the conductor 419 and the semiconductor 406b is reduced. Note that when the multilayer film is formed, the insulator 402 is also subjected etching to have a thinned region in some cases. That is, the insulator 402 may have a protruding portion in a region in contact with the multilayer film (see FIGS. 24A to 24C).

The subsequent steps may be performed in a manner similar to the steps illustrated in FIGS. 16A to 16C, FIGS. 17A to 17C, FIGS. 18A to 18C, FIGS. 19A to 19C, FIGS. 20A to 20C, FIGS. 21A to 21C, and FIGS. 22A to 22C in the method 1 for manufacturing the transistor described in Embodiment 1.

Through the above steps, the transistor illustrated in FIGS. 23A to 23C can be manufactured.

The structure and method described in this embodiment can be implemented by being combined as appropriate with any of the other structures and methods described in the other embodiments.

Embodiment 3

Transistor Structure 3

Figure 25A:
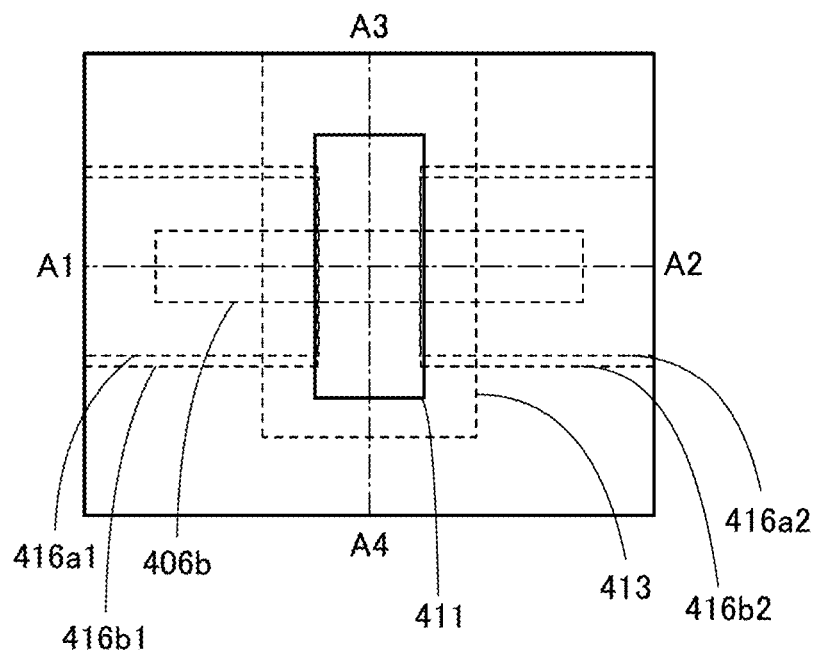
FIGS. 25A to 25C are a top view and cross-sectional views illustrating a method for manufacturing a transistor of one embodiment of the present invention.
Figure 25B:
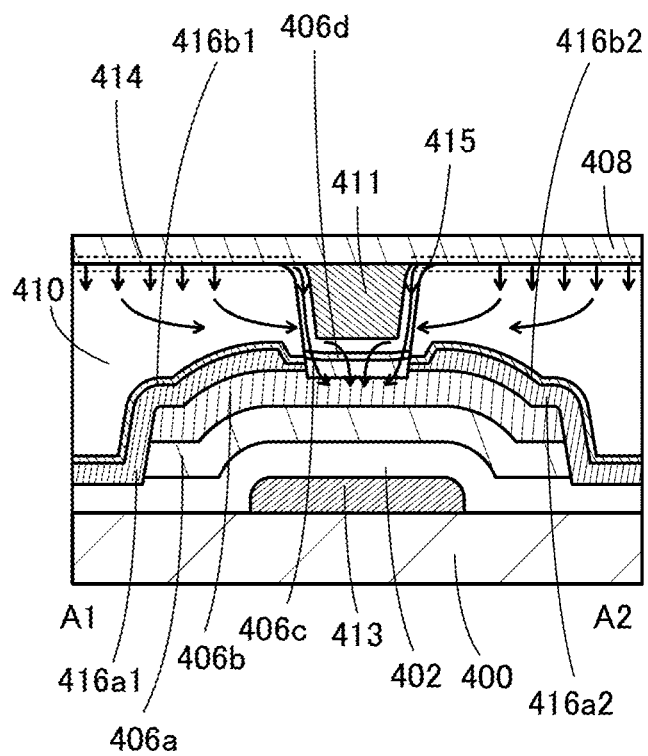
Figure 25C:
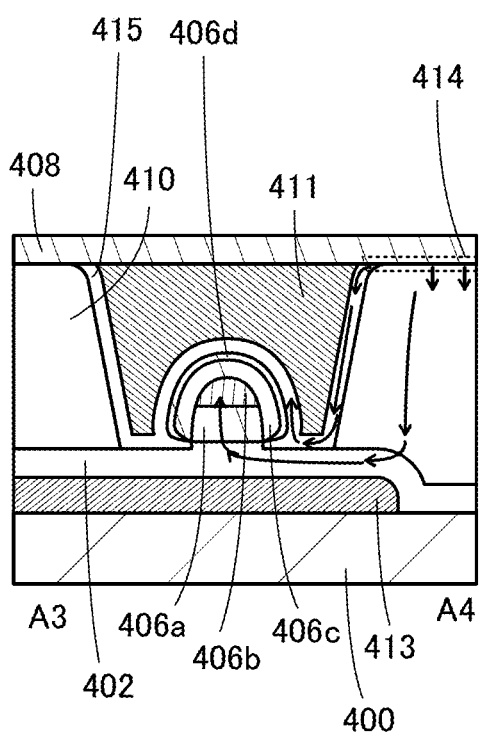

A transistor having a structure different from that in FIGS. 1A to 1C and a manufacturing method thereof will be described with reference to FIGS. 25A to 25C. FIGS. 25A to 25C are a top view and cross-sectional views of a semiconductor device of one embodiment of the present invention. FIG. 25A is the top view, and FIGS. 25B and 25C are the cross-sectional views taken along dashed-dotted lines A1-A2 and A3-A4 in FIG. 25A, respectively. Note that for simplification of the drawing, some components are not illustrated in the top view in FIG. 25A.

In the transistor illustrated in FIGS. 25A to 25C, a conductor 411 serving as the gate electrode can be formed in a self-aligned manner by CMP treatment or the like without using a photolithography method. For the other components, the description of the transistor in FIGS. 1A to 1C is referred to.

<Method 3 for Manufacturing Transistor>

A method for manufacturing the transistor illustrated in FIGS. 25A to 25C is described below.

First, the steps up to the step which is illustrated in FIGS. 20A to 20C and described in Embodiment 1 are performed.

Next, an insulator to be an insulator 415 and a conductor to be a conductor 411 are formed, and then CMP treatment is performed so that a surface of the insulator 410 is exposed, whereby the insulator 415 and the conductor 411 are formed.

Accordingly, the conductor 411 serving as the gate electrode can be formed in a self-aligned manner without using a lithography method. The conductor 411 serving as the gate electrode can be formed without considering alignment accuracy of the conductor 411 serving as the gate electrode and the conductors 416a1 and 416a2 serving as the source electrode and the drain electrode; as a result, the area of the semiconductor device can be reduced. Furthermore, because the lithography process is not necessary, improvement in productivity due to simplification of the process is expected.

The insulator 410 serves as a stopper in CMP treatment. CMP treatment is not necessarily performed until the surface of the insulator 410 is exposed and may be performed until the surface of the insulator 415 is exposed, whereby the conductor 411 is formed. In addition, the insulator 415 may include an insulator serving as a stopper in CMP treatment.

Next, the insulator 408 is formed over the conductor 411 and the insulator 410.

Through the above steps, the transistor illustrated in FIGS. 25A to 25C can be manufactured.

The structure and method described in this embodiment can be implemented by being combined as appropriate with any of the other structures and methods described in the other embodiments.

Embodiment 4

Transistor Structure 4

Figure 26A:
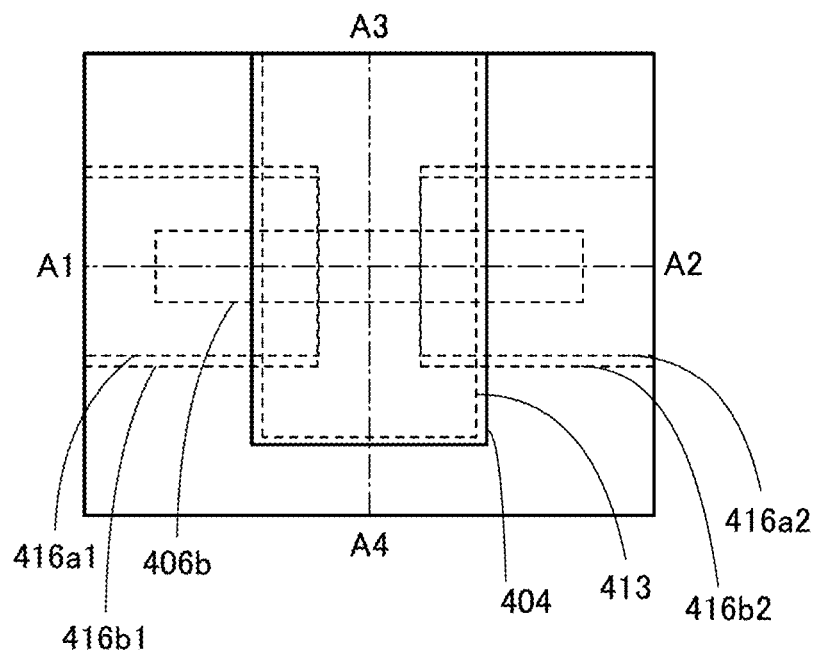
FIGS. 26A to 26C are a top view and cross-sectional views illustrating a method for manufacturing a transistor of one embodiment of the present invention.
Figure 26B:
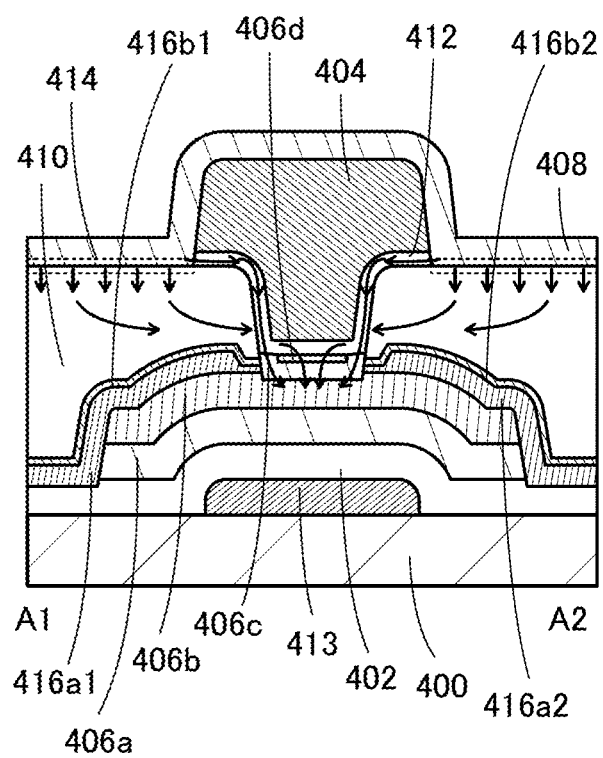
Figure 26C:
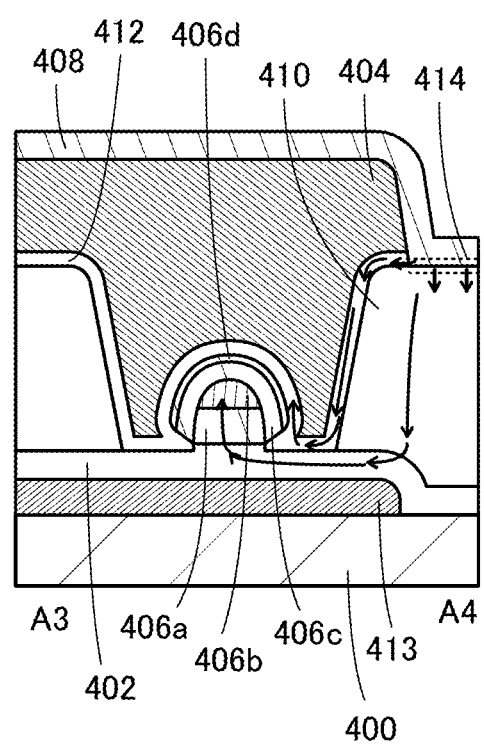
Figure 27A:
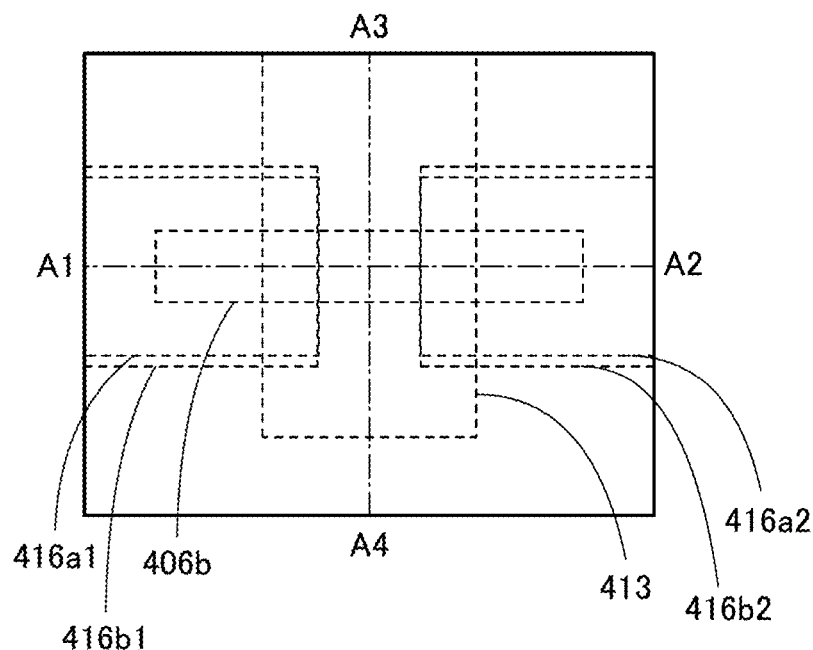
FIGS. 27A to 27C are a top view and cross-sectional views illustrating a method for manufacturing a transistor of one embodiment of the present invention.
Figure 27B:
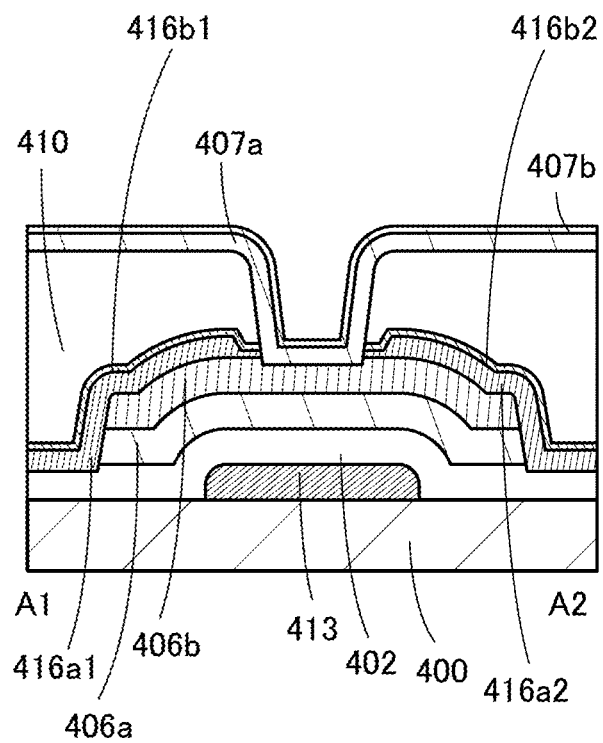
Figure 27C:
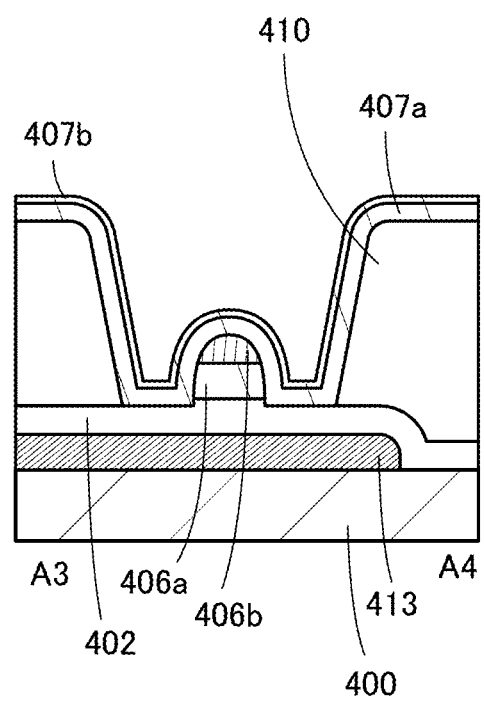

A transistor having a structure different from that in FIGS. 1A to 1C and a manufacturing method thereof will be described with reference to FIGS. 26A to 26C, FIGS. 27A to 27C, and FIGS. 28A to 28C. FIGS. 26A to 26C are a top view and cross-sectional views of a semiconductor device of one embodiment of the present invention. FIG. 26A is the top view, and FIGS. 26B and 26C are the cross-sectional views taken along dashed-dotted lines A1-A2 and A3-A4 in FIG. 23A, respectively. Note that for simplification of the drawing, some components are not illustrated in the top view of FIG. 26A.

The transistor is different from the transistor in FIGS. 1A to 1C in that the shapes of the insulators 406c and 406d are different. For the other components, the description of the transistor in FIGS. 1A to 1C is referred to.

<Method 4 for Manufacturing Transistor>

A method for manufacturing the transistor illustrated in FIGS. 26A to 26C is described below with reference to FIGS. 27A to 27C and FIGS. 28A to 28C.

Figure 16A:
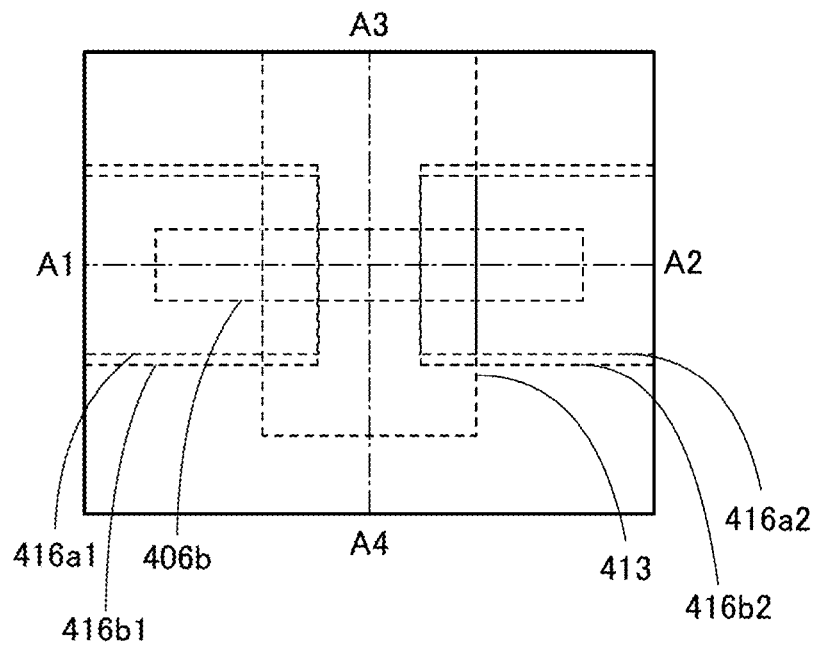
FIGS. 16A to 16C are a top view and cross-sectional views illustrating a method for manufacturing a transistor of one embodiment of the present invention.
Figure 16B:
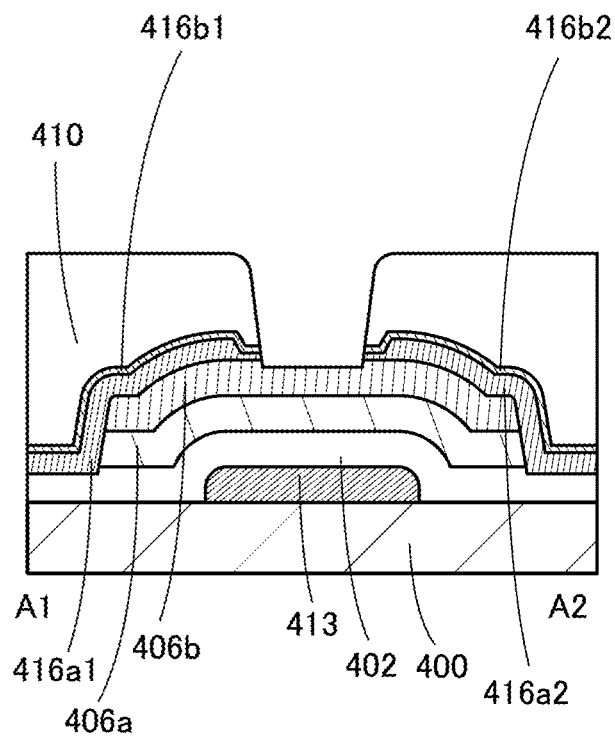
Figure 16C:
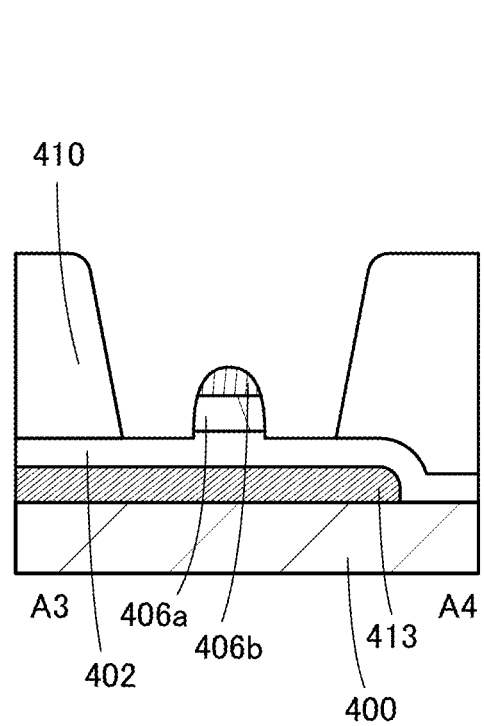

First, the steps up to the step in FIG. 16C in Embodiment 1 are performed.

Next, the insulator 407a is formed, and then, the insulator 407b is formed. The insulators 407a and 407b may be formed as in Embodiment 1 (see FIGS. 27B and 27C).

Figure 28A:
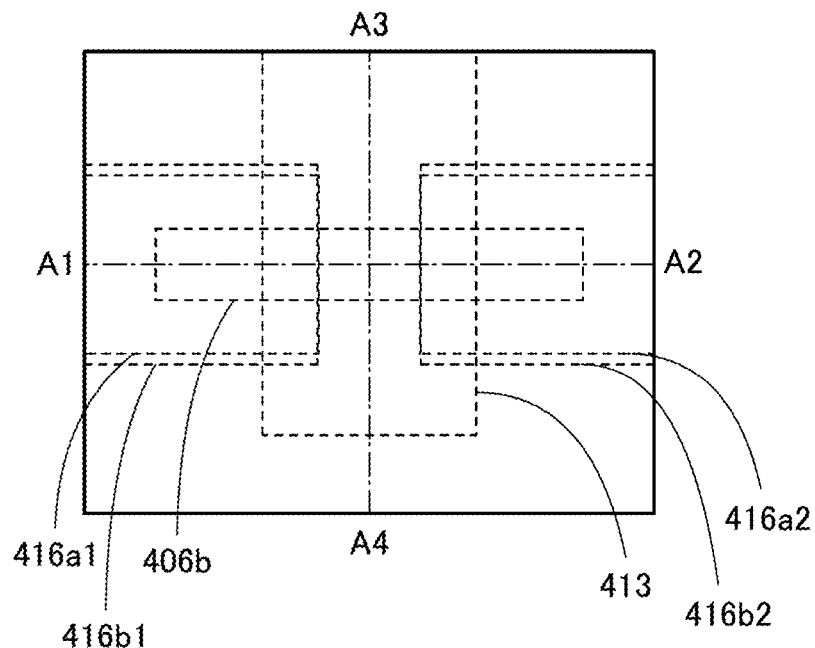
FIGS. 28A to 28C are a top view and cross-sectional views illustrating a method for manufacturing a transistor of one embodiment of the present invention.
Figure 28B:
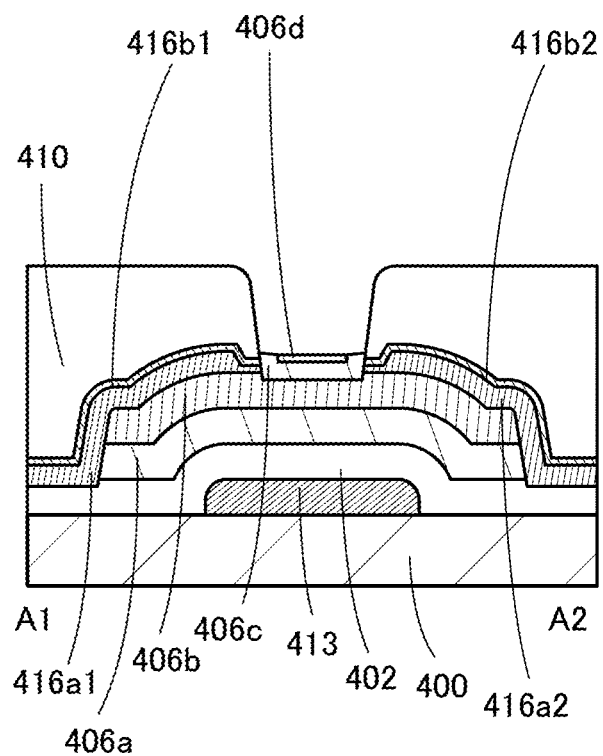
Figure 28C:
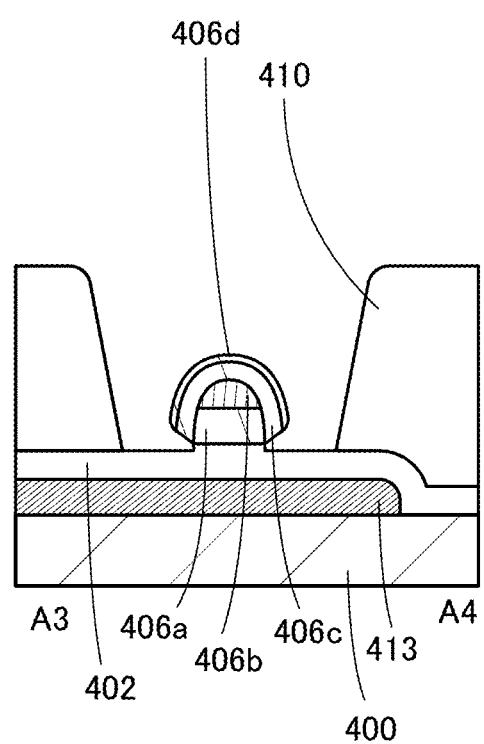

Next, the insulator 407a and the insulator 407b are etched to form the insulator 406c and the insulator 406d (see FIGS. 28B and 28C). The etching is preferably performed by wet etching. Accordingly, the insulator 407a and the insulator 407b can be selectively etched without using a mask in accordance with the crystallinity or the like of the insulators. As an etchant of the wet etching, an acid solution is preferably used. For example, a solution containing hydrofluoric acid, a solution obtained by mixing phosphoric acid, acetic acid, and nitric acid, a solution containing oxalic acid, or a solution containing phosphoric acid can be used. Furthermore, the etchant is not limited to an acid solution and may be an alkaline solution. As the alkaline solution, an ammonia hydrogen peroxide mixture (a mixed solution of ammonia, water, and a hydrogen peroxide solution) may be used, for example.

The subsequent steps may be performed in a manner similar to the steps illustrated in FIGS. 21A to 21C and FIGS. 22A to 22D in the method 1 for manufacturing the transistor described in Embodiment 1.

Through the above steps, the transistor illustrated in FIGS. 26A to 26C can be manufactured.

The structure and method described in this embodiment can be implemented by being combined as appropriate with any of the other structures and methods described in the other embodiments.

Embodiment 5

Memory Device 1

Figure 29A:
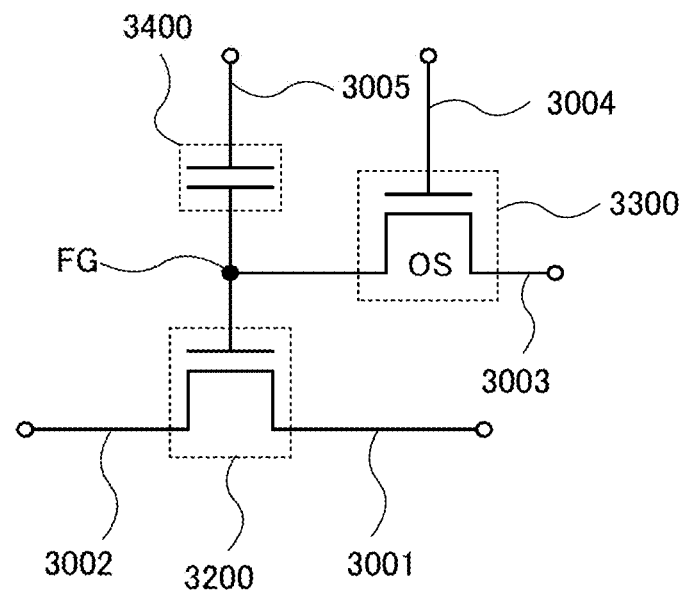
FIGS. 29A and 29B are each a circuit diagram of a memory device of one embodiment of the present invention.
Figure 29B:
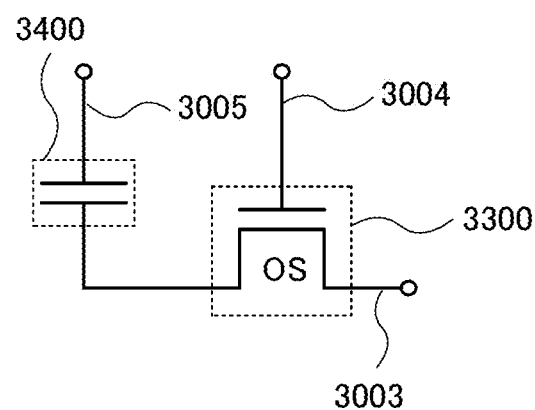

An example of a semiconductor device (memory device) which includes the transistor of one embodiment of the present invention, which can retain stored data even when not powered, and which has an unlimited number of write cycles is shown in FIGS. 29A and 29B.

The semiconductor device illustrated in FIG. 29A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 29A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to a first terminal of the capacitor 3400. A fifth wiring 3005 is electrically connected to a second terminal of the capacitor 3400.

The semiconductor device in FIG. 29A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the first terminal of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state". Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ (>$V_{th\_H}$), the transistor 3200 is brought into "on state". In the case where the low-level electric charge is supplied to the node FG in writing, even when the potential of the fifth wiring 3005 is $V_0$ (<$V_{th\_L}$), the transistor 3200 still remains in "off state". Thus, the data retained in the node FG can be read by determining the potential of the second wiring 3002.

Note that in the case where memory cells are arrayed, it is necessary that data of a desired memory cell be read in read operation. The fifth wiring 3005 of memory cells from which data is not read may be supplied with a potential at which the transistor 3200 is turned off regardless of the electric charge supplied to the node FG, that is, a potential lower than $V_{th\_H}$, whereby only data of a desired memory cell can be read. Alternatively, the fifth wiring 3005 of the memory cells from which data is not read may be supplied with a potential at which the transistor 3200 is brought into "on state" regardless of the electric charge supplied to the node FG, that is, a potential higher than $V_{th\_L}$, whereby only data of a desired memory cell can be read.

<Structure 1 of Semiconductor Device>

Figure 30:
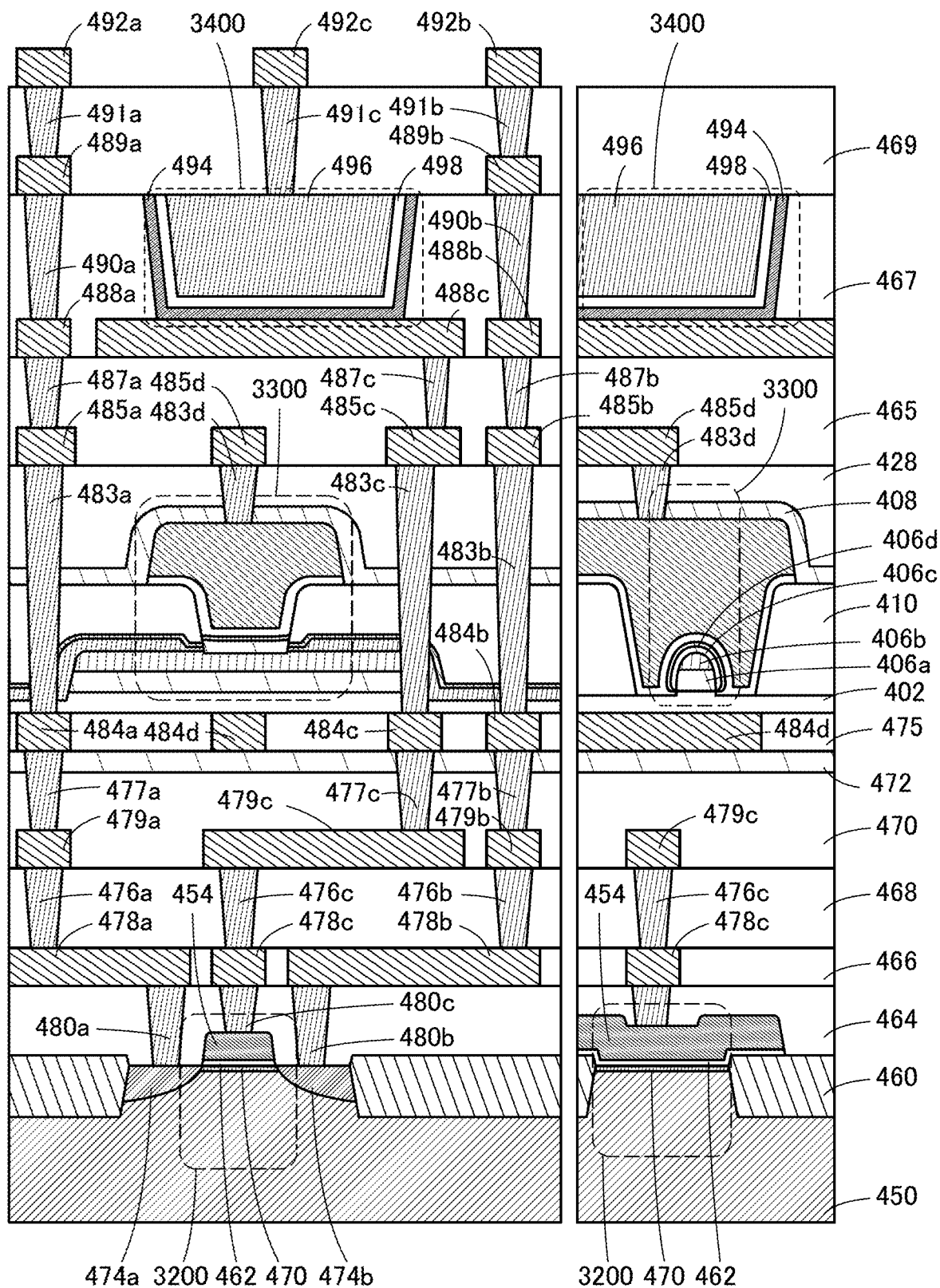
FIG. 30 is a cross-sectional view illustrating a semiconductor device of one embodiment of the present invention.

FIG. 30 is a cross-sectional view of the semiconductor device in FIG. 29A. The semiconductor device shown in FIG. 30 includes the transistor 3200, the transistor 3300, and the capacitor 3400. The transistor 3300 and the capacitor 3400 are provided over the transistor 3200. Although an example where the transistor illustrated in FIGS. 1A to 1C is used as the transistor 3300 is shown, a semiconductor device of one embodiment of the present invention is not limited thereto. The description of the above transistor is referred to.

The transistor 3200 illustrated in FIG. 30 is a transistor using a semiconductor substrate 450. The transistor 3200 includes a region 474a in the semiconductor substrate 450, a region 474b in the semiconductor substrate 450, an insulator 462, and a conductor 454.

In the transistor 3200, the regions 474a and 474b have a function as a source region and a drain region. The insulator 462 has a function as a gate insulator. The conductor 454 has a function as a gate electrode. Therefore, resistance of a channel formation region can be controlled by a potential applied to the conductor 454. In other words, conduction or non-conduction between the region 474a and the region 474b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 3200 is formed. Alternatively, the semiconductor substrate 450 may be an i-type semiconductor substrate.

The top surface of the semiconductor substrate 450 preferably has a (110) plane. Thus, on-state characteristics of the transistor 3200 can be improved.

The regions 474a and 474b are regions including impurities imparting the p-type conductivity. Accordingly, the transistor 3200 has a structure of a p-channel transistor.

Note that although the transistor 3200 is illustrated as a p-channel transistor, the transistor 3200 may be an n-channel transistor.

Note that the transistor 3200 is separated from an adjacent transistor by the region 460 and the like. The region 460 is an insulating region.

The semiconductor illustrated in FIG. 30 includes an insulator 464, an insulator 466, an insulator 468, an insulator 470, an insulator 472, an insulator 475, the insulator 402, the insulator 410, the insulator 408, an insulator 428, an insulator 465, an insulator 467, an insulator 469, an insulator 498, a conductor 480a, a conductor 480b, a conductor 480c, a conductor 478a, a conductor 478b, a conductor 478c, a conductor 476a, a conductor 476b, a conductor 476c, a conductor 479a, a conductor 479b, a conductor 479c, a conductor 477a, a conductor 477b, a conductor 477c, a conductor 484a, a conductor 484b, a conductor 484c, a conductor 484d, a conductor 483a, a conductor 483b, a conductor 483c, a conductor 483d, a conductor 485a, a conductor 485b, a conductor 485c, a conductor 485d, a conductor 487a, a conductor 487b, a conductor 487c, a conductor 488a, a conductor 488b, a conductor 488c, a conductor 490a, a conductor 490b, a conductor 489a, a conductor 489b, a conductor 491a, a conductor 491b, a conductor 491c, a conductor 492a, a conductor 492b, a conductor 492c, a conductor 494, a conductor 496, an insulator 406a, a semiconductor 406b, and an insulator 406c.

The insulator 464 is provided over the transistor 3200. The insulator 466 is over the insulator 464. The insulator 468 is over the insulator 466. The insulator 470 is placed over the insulator 468. The insulator 472 is placed over the insulator 470. The insulator 475 is placed over the insulator 472. The transistor 3300 is provided over the insulator 475. The insulator 408 is provided over the transistor 3300. The insulator 428 is provided over the insulator 408. The insulator 465 is over the insulator 428. The capacitor 3400 is provided over the insulator 465. The insulator 469 is provided over the capacitor 3400.

The insulator 464 includes an opening reaching the region 474a, an opening reaching the region 474b, and an opening reaching the conductor 454, in which the conductor 480a, the conductor 480b, and the conductor 480c are embedded, respectively.

In addition, the insulator 466 includes an opening reaching the conductor 480a, an opening reaching the conductor 480b, and an opening reaching the conductor 480c, in which the conductor 478a, the conductor 478b, and the conductor 478c are embedded, respectively.

In addition, the insulator 468 includes an opening reaching the conductor 478a, an opening reaching the conductor 478b, and an opening reaching the conductor 478c, in which the conductor 476a, the conductor 476b, and the conductor 476c are embedded, respectively.

The conductor 479a in contact with the conductor 476a, the conductor 479b in contact with the conductor 476b, and the conductor 479c in contact with the conductor 476c are over the insulator 468. The insulator 472 includes an opening reaching the conductor 479a through the insulator 470 and an opening reaching the conductor 479b through the insulator 470. In the openings, the conductor 477a and the conductor 477b are embedded.

The insulator 475 includes an opening overlapping with the channel formation region of the transistor 3300, an opening reaching the conductor 477a, an opening reaching the conductor 477b, and an opening reaching the insulator 472. In the openings, the conductor 484a, the conductor 484b, the conductor 484c, and the conductor 484d is embedded.

The conductor 484d may have a function as a bottom gate electrode of the transistor 3300. Alternatively, for example, electric characteristics such as the threshold voltage of the transistor 3300 may be controlled by application of a constant potential to the conductor 484d. Further alternatively, for example, the conductor 484d and the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

In addition, the insulator 402 includes an opening reaching the conductor 484a and an opening reaching the conductor 484c.

The insulator 428 includes two openings reaching the conductor 484a through the insulator 408, the insulator 410, and the insulator 402, two openings reaching a conductor of one of the source electrode and the drain electrode of the transistor 3300 through the insulator 408 and the insulator 410, and an opening reaching a conductor of the gate electrode of the transistor 3300 through the insulator 408. In the openings, the conductor 483a, the conductor 483c, and the conductor 483d are embedded.

The conductor 485a in contact with the conductor 483a, the conductor 485b in contact with the conductor 483b, the conductor 485c in contact with the conductor 483c, and the conductor 485d in contact with the conductor 483d are over the insulator 428. The insulator 465 has an opening reaching the conductor 485a, an opening reaching the conductor 485b, and an opening reaching the conductor 485c. In the openings, the conductor 487a, the conductor 487b, and the conductor 487c are embedded.

The conductor 488a in contact with the conductor 487a, the conductor 488b in contact with the conductor 487b, and the conductor 488c in contact with the conductor 487c are over the insulator 465. In addition, the insulator 467 includes an opening reaching the conductor 488a and an opening reaching the conductor 488b. In the openings, the conductor 490a and the conductor 490b are embedded. The conductor 488c is in contact with the conductor 494 which is the first terminal of the capacitor 3400.

The conductor 489a in contact with the conductor 490a and the conductor 489b in contact with the conductor 490b are over the insulator 467. The insulator 469 includes an opening reaching the conductor 489a, an opening reaching the conductor 489b, an opening reaching the conductor 496 which is the second terminal of the capacitor 3400. In the openings, the conductor 491a, the conductor 491b, and the conductor 491c are embedded.

The conductor 492a in contact with the conductor 491a, the conductor 492b in contact with the conductor 491b, and the conductor 492c in contact with the conductor 491c are over the insulator 469.

The insulators 464, 466, 468, 470, 472, 475, 402, 410, 408, 428, 465, 467, 469, and 498 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed of, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 470, 472, 475, 402, 410, 408, 428, 465, 467, 469, and 498. When an insulator that has a function of blocking oxygen and impurities such as hydrogen is placed near the transistor 3300, the electric characteristics of the transistor 3300 can be stable.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Each of the conductors 480a, 480b, 480c, 478a, 478b, 478c, 476a, 476b, 476c, 479a, 479b, 479c, 477a, 477b, 477c, 484a, 484b, 484c, 484d, 483a, 483b, 483c, 483d, 485a, 485b, 485c, 485d, 487a, 487b, 487c, 488a, 488b, 488c, 490a, 490b, 489a, 489b, 491a, 491b, 491c, 492a, 492b, 492c, 494, and 496 may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406a and the insulator 406c, oxides containing one or more, or two or more elements other than oxygen included in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The source or drain of the transistor 3200 is electrically connected to the conductor that is one of the source electrode and the drain electrode of the transistor 3300 through the conductor 480a, the conductor 478a, the conductor 476a, the conductor 479a, the conductor 477a, the conductor 484a, the conductor 483a, and the conductor 485a. The conductor 454 that is the gate electrode of the transistor 3200 is electrically connected to the conductor that is the other of the source electrode and the drain electrode of the transistor 3300 through the conductor 480c, the conductor 478c, the conductor 476c, the conductor 479c, the conductor 477c, the conductor 484c, the conductor 483c, and the conductor 485c.

The capacitor 3400 includes one of the source electrode and the drain electrode of the transistor 3300, the conductor 494 electrically connected to the first terminal of the capacitor 3400 through the conductor 483c, the conductor 485c, the conductor 487c, and the conductor 488c, the insulator 498, the conductor 496 which is the second terminal of the capacitor 3400. The capacitor 3400 is preferably formed above or below the transistor 3300 because the semiconductor can be reduced in size.

For the structures of other components, the description of FIGS. 1A to 1C and the like can be referred to as appropriate.

Figure 31:
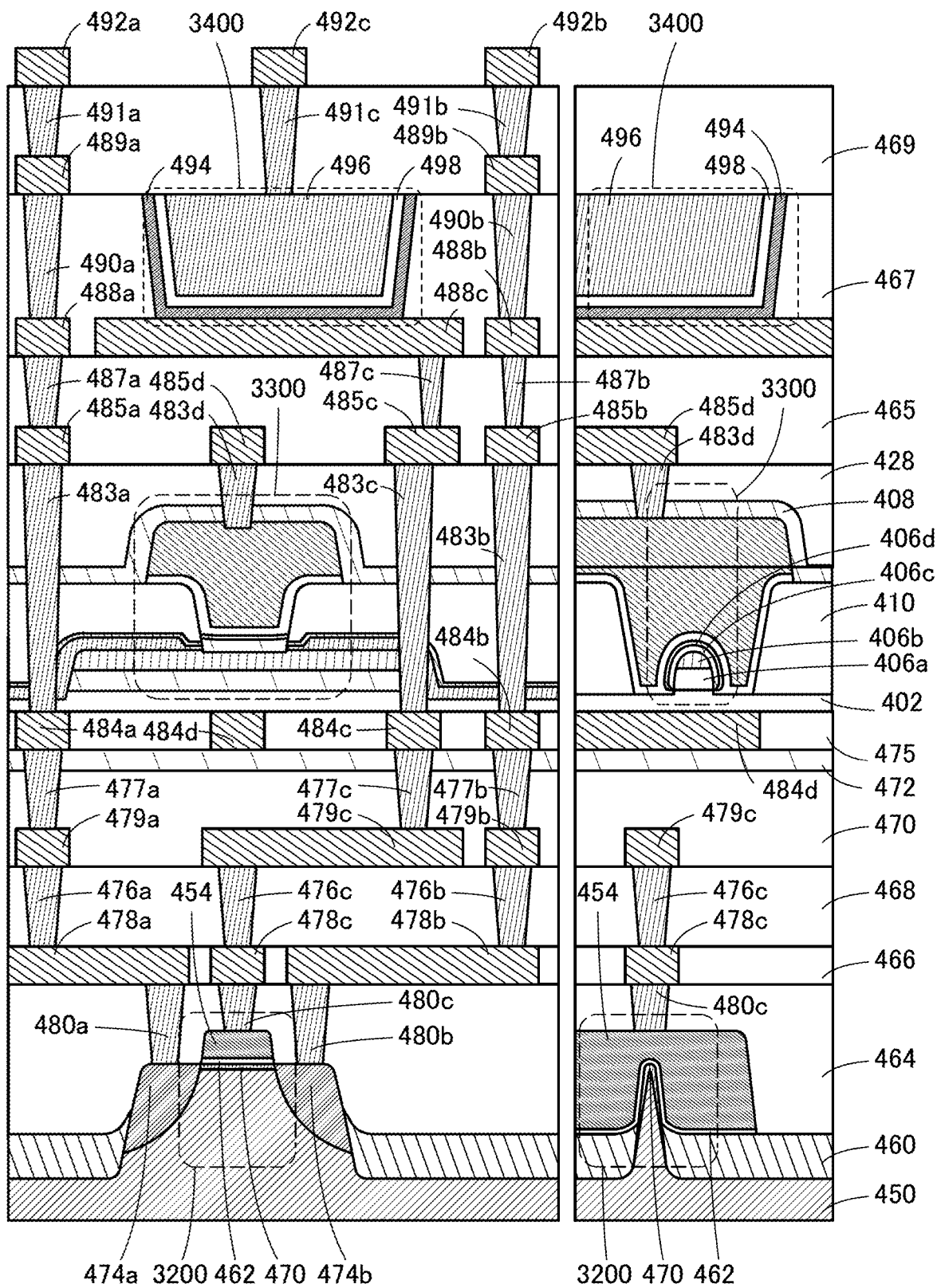
FIG. 31 is a cross-sectional view illustrating a semiconductor device of one embodiment of the present invention.

A semiconductor device in FIG. 31 is the same as the semiconductor device in FIG. 30 except the structure of the transistor 3200. Therefore, the description of the semiconductor device in FIG. 30 is referred to for the semiconductor device in FIG. 31. Specifically, in the semiconductor device in FIG. 31, the transistor 3200 is a FIN-type transistor. The effective channel width is increased in the FIN-type transistor 3200, whereby the on-state characteristics of the transistor 3200 can be improved. In addition, since contribution of the electric field of the gate electrode can be increased, the off-state characteristics of the transistor 3200 can be improved. Note that the transistor 3200 may be a p-channel transistor or an n-channel transistor.

Although an example in which the transistor 3300 is over the transistor 3200 and the capacitor 3400 is over the transistor 3300 is illustrated in this embodiment, one or more transistors including a semiconductor similar to the transistor 3300 may be provided over the transistor 3200. With such a structure, the degree of integration of the semiconductor device can be further increased.

<Memory Device 2>

The semiconductor device in FIG. 29B is different from the semiconductor device in FIG. 29A in that the transistor 3200 is not provided. Also in this case, data can be written and retained in a manner similar to that of the semiconductor device in FIG. 29A.

Reading of data in the semiconductor device in FIG. 29B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)$ $(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved. At least part of this embodiment can be implemented in combination with any of the embodiments described in this specification as appropriate.

Embodiment 6

Structure 2 of Semiconductor Device

In this embodiment, an example of a circuit including the transistor of one embodiment of the present invention is described with reference to drawings.

<Cross-Sectional Structure>

Figure 32A:
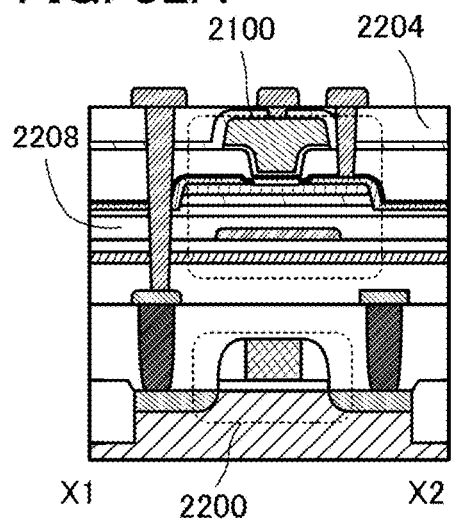
FIGS. 32A to 32F are circuit diagrams and cross-sectional views illustrating a semiconductor device of one embodiment of the present invention.
Figure 32B:
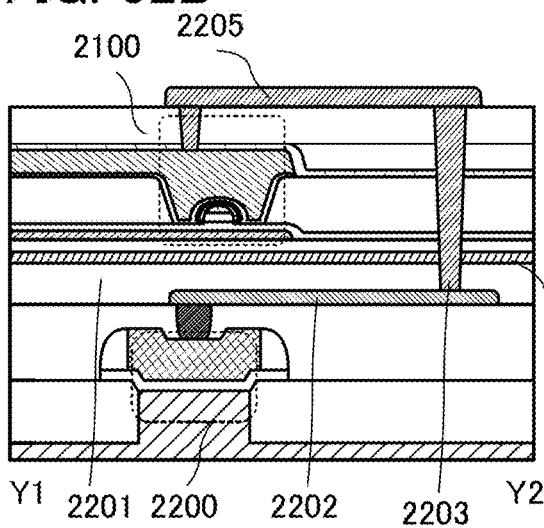

FIGS. 32A and 32B are cross-sectional views of a semiconductor device of one embodiment of the present invention. In FIG. 32A, X1-X2 direction represents a channel length direction, and in FIG. 32B, Y1-Y2 direction represents a channel width direction. The semiconductor device illustrated in FIGS. 32A and 32B includes a transistor 2200 containing a first semiconductor material in a lower portion and a transistor 2100 containing a second semiconductor material in an upper portion. In FIGS. 32A and 32B, an example is illustrated in which the transistor illustrated in FIGS. 1A to 1C is used as the transistor 2100 containing the second semiconductor material.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using an oxide semiconductor and described in the above embodiment as an example has excellent subthreshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIGS. 32A and 32B illustrate a structure in which the transistor 2100 is provided over the transistor 2200 with an insulator 2201, an insulator 2207, and an insulator 2208 provided therebetween. A plurality of wirings 2202 are provided between the transistor 2200 and the transistor 2100. Furthermore, wirings and electrodes provided in an upper portion in which the transistor 2100 is provided and those in a lower portion in which the transistor 2200 is provided are electrically connected to each other through a plurality of plugs 2203 embedded in insulators. An insulator 2204 covering the transistor 2100 and a wiring 2205 over the insulator 2204 are provided.

The stack of the two kinds of transistors reduces the area occupied by the circuit, allowing a plurality of circuits to be highly integrated.

Here, in the case where a silicon-based semiconductor material is used for the transistor 2200 provided in the lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in the upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulator 2207 having a function of preventing diffusion of hydrogen is provided between the transistors 2100 and 2200. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 also can be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide film is preferably used. Using the aluminum oxide film, excess oxygen can be added to the insulator under the aluminum oxide film in the deposition, and the excess oxygen moves to the oxide semiconductor layer of the transistor 2100 by heat treatment, which has an effect of repairing a defect in the oxide semiconductor layer. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented. Note that as the block film, the insulator 2204 having a stacked-layer structure may be used, or the block film may be provided under the insulator 2204.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIGS. 32E and 32F. An insulator 2212 is provided over a semiconductor substrate 2211. The semiconductor substrate 2211 includes a projecting portion with a thin tip (also referred to a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

At least part of this embodiment can be implemented in combination with any of the embodiments described in this specification as appropriate.

Embodiment 7

CMOS Circuit

Figure 32C:
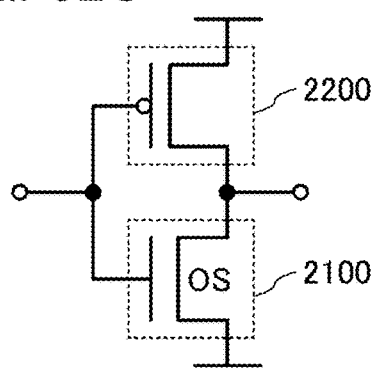

A circuit diagram in FIG. 32C shows a configuration of a so-called CMOS circuit in which a p-channel transistor 2200 and an n-channel transistor 2100 are connected to each other in series and in which gates of them are connected to each other.

[Analog Switch]

Figure 32D:
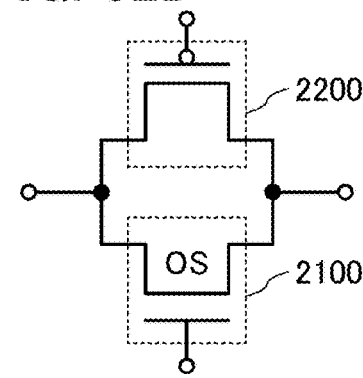
Figure 32E:
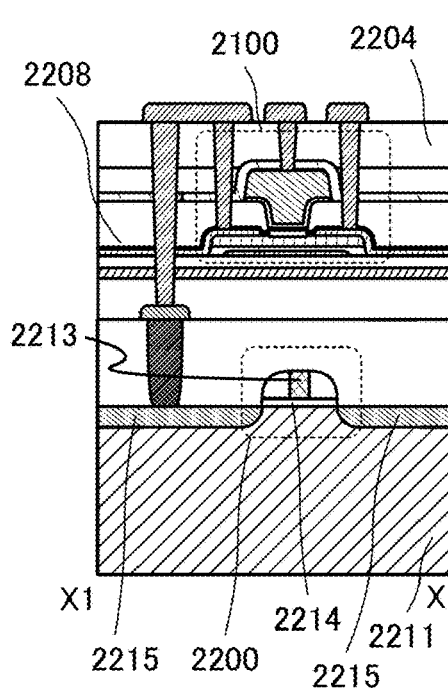
Figure 32F:
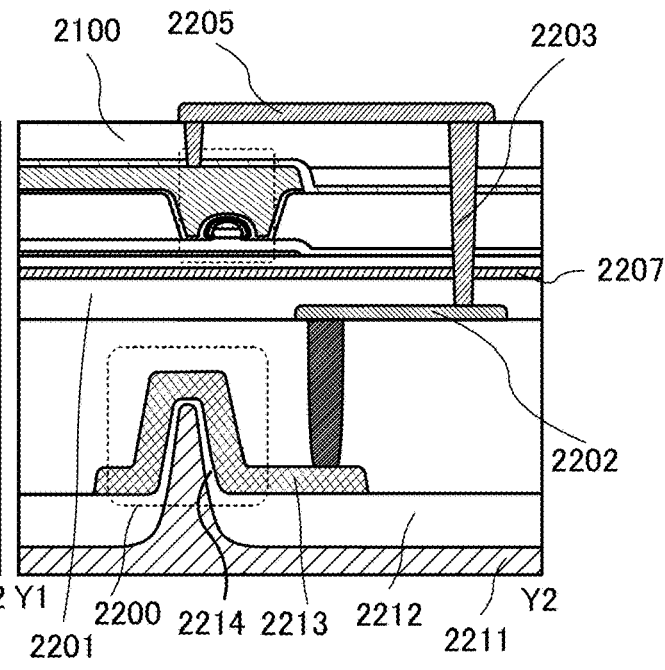

A circuit diagram in FIG. 32D shows a configuration in which sources of the transistors 2100 and 2200 are connected to each other and drains of the transistors 2100 and 2200 are connected to each other. With such a configuration, the transistors can function as a so-called analog switch. At least part of this embodiment can be implemented in combination with any of the embodiments described in this specification as appropriate.

Embodiment 8

CPU

A CPU including a semiconductor device such as any of the above-described transistors or the above-described memory device is described below.

Figure 33:
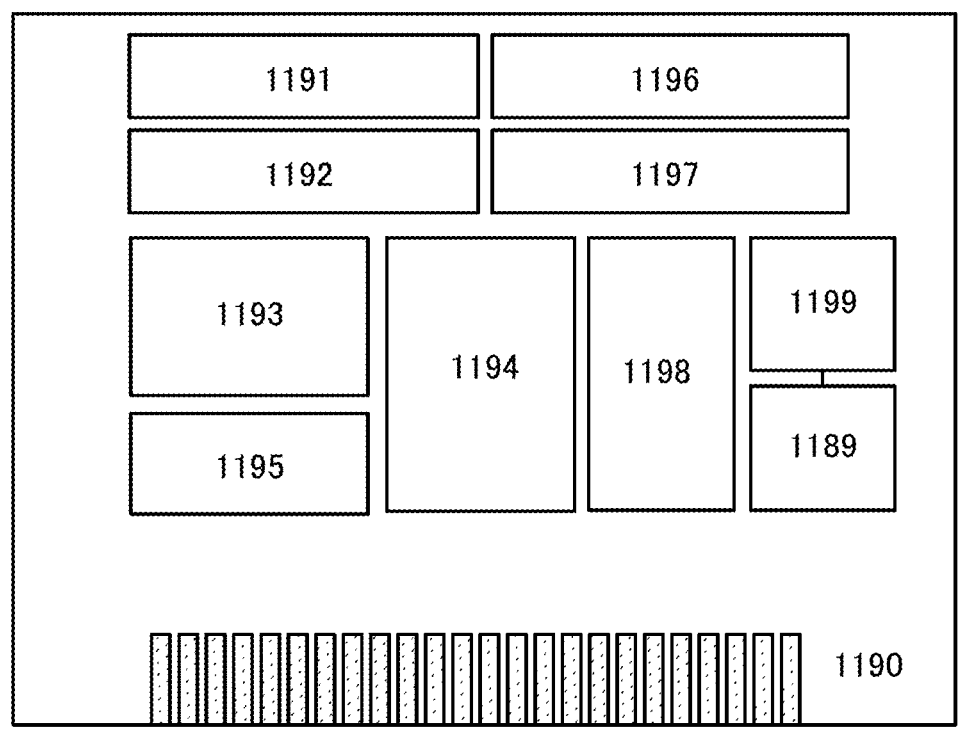
FIG. 33 is a block diagram illustrating a CPU of one embodiment of the present invention.

FIG. 33 is a block diagram illustrating a configuration example of a CPU including any of the above-described transistors as a component.

The CPU illustrated in FIG. 33 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 33 is just an example of a simplified structure, and an actual CPU may have a variety of structures depending on the application. For example, the CPU may have the following configuration: a structure including the CPU illustrated in FIG. 33 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

In the CPU illustrated in FIG. 33, a memory cell is provided in the register 1196. For the memory cell of the register 1196, any of the above-described transistors, the above-described memory device, or the like can be used.

In the CPU illustrated in FIG. 33, the register controller 1197 selects operation of retaining data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of the power supply voltage to the memory cell in the register 1196 can be stopped.

Figure 34:
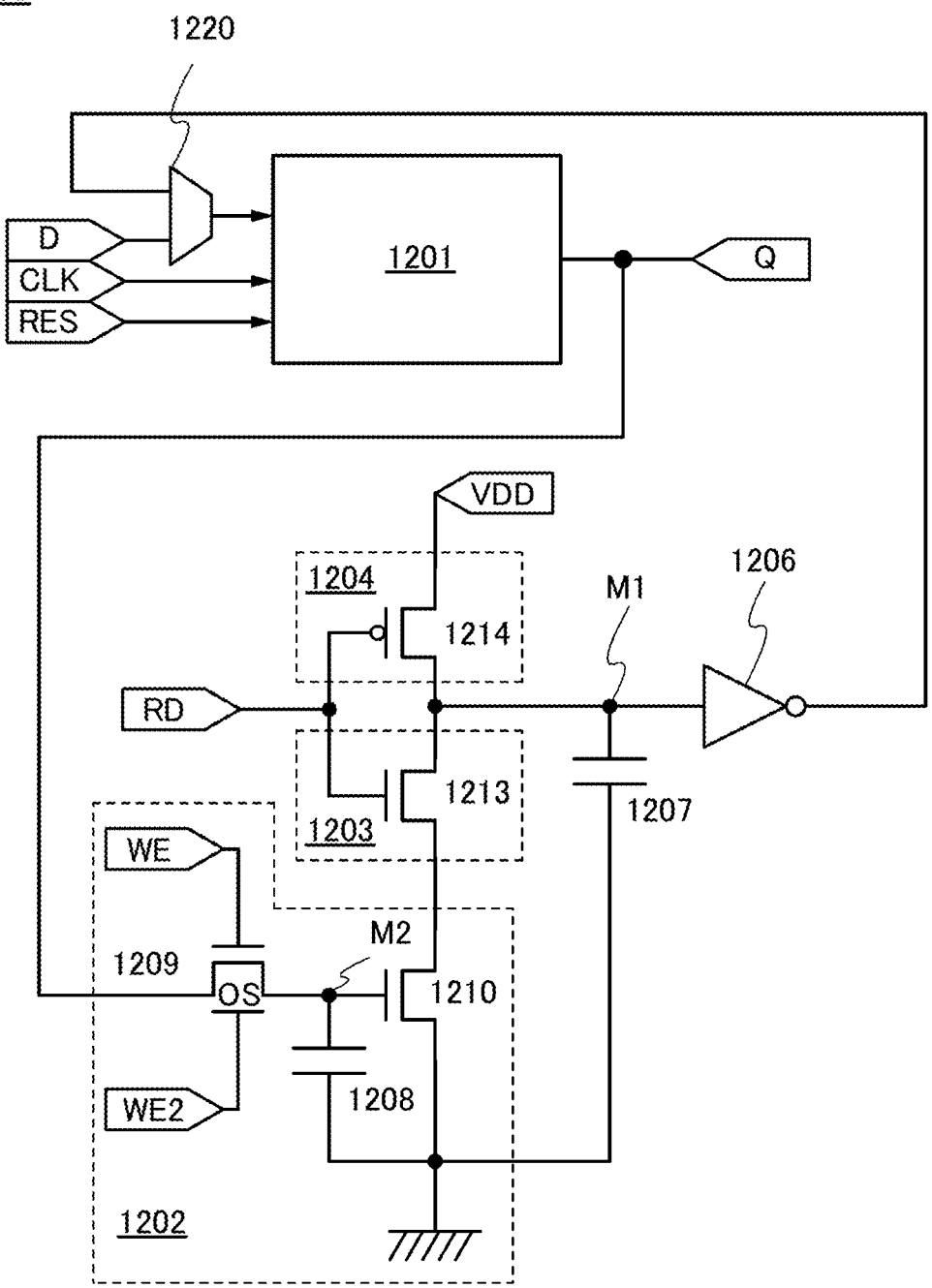
FIG. 34 is a circuit diagram of a memory element of one embodiment of the present invention.

FIG. 34 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the line, or the like is actively utilized.

A control signal WE is input to a first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 34 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 34, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 34, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer including a semiconductor other than an oxide semiconductor or the substrate 1190 can be used for the rest of the transistors.

As the circuit 1201 in FIG. 34, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By using the above-described memory element 1200 for a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU in this embodiment, the memory element 1200 can also be used in an LSI such as a digital signal processor (DSP), a custom LSI, or a programmable logic device (PLD), and a radio frequency (RF) tag.

At least part of this embodiment can be implemented in combination with any of the embodiments described in this specification as appropriate.

Embodiment 9

Imaging Device

Figure 35A:
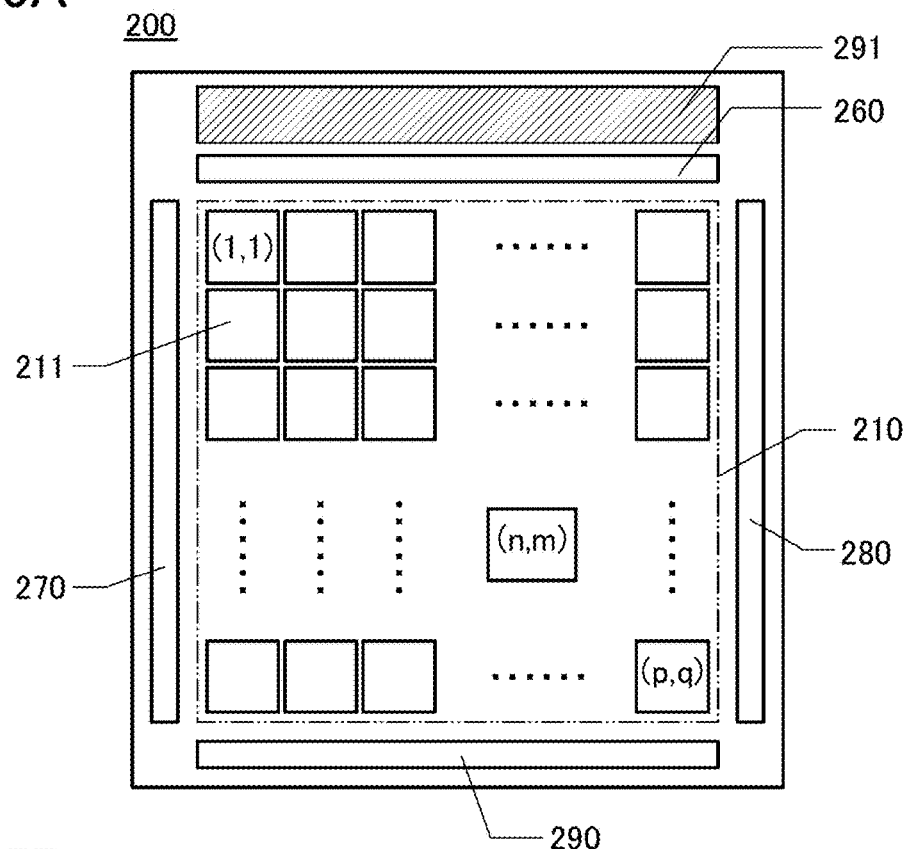
FIGS. 35A and 35B are plan views of an imaging device.

FIG. 35A is a top view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicates all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. Alternatively, a semiconductor device such as an IC chip may be used as part or the whole of the peripheral circuit. Note that as the peripheral circuit, one or more of the peripheral circuits 260, 270, 280, and 290 may be omitted.

Figure 35B:
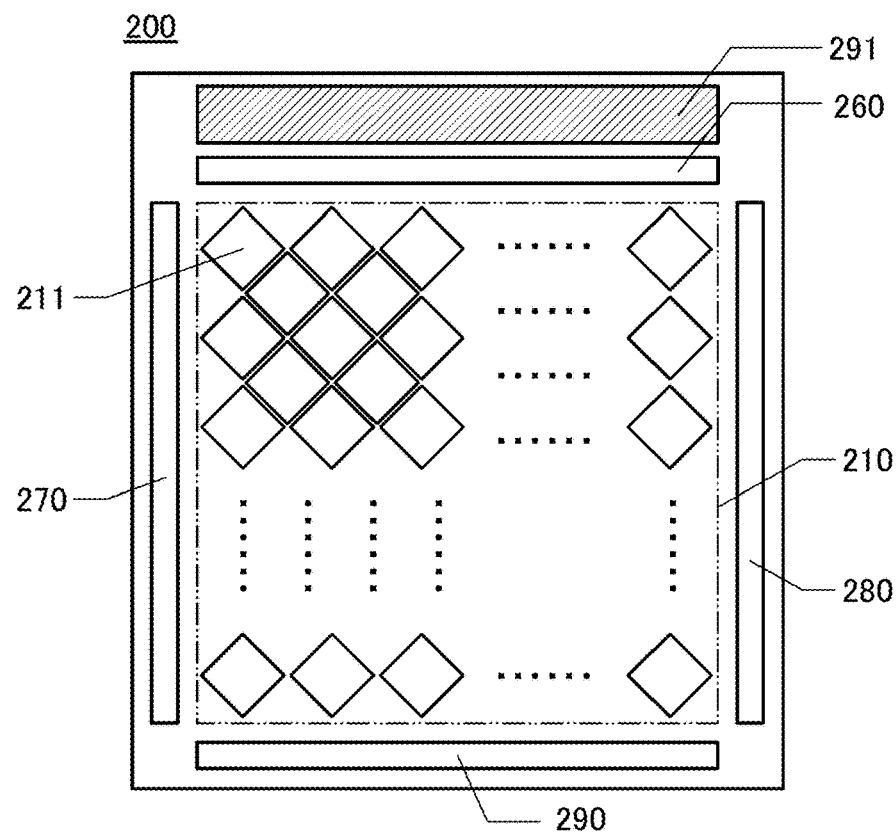

As illustrated in FIG. 35B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 36A:
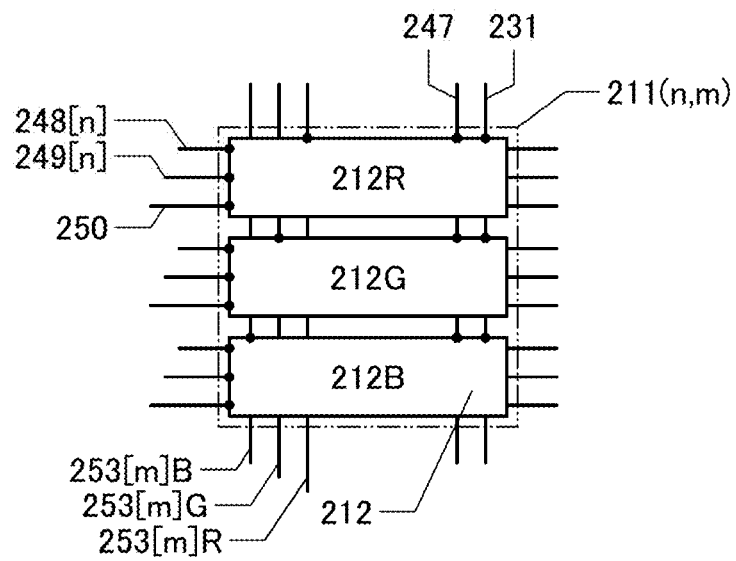
FIGS. 36A and 36B are plan views of pixels of an imaging device.

FIG. 36A is a top view showing an example of the pixel 211 with which a color image is obtained. The pixel 211 illustrated in FIG. 36A includes the subpixel 212 provided with a color filter that transmits light with a red (R) wavelength band (also referred to as a subpixel 212R), a subpixel 212 provided with a color filter that transmits light with a green (G) wavelength band (also referred to as a subpixel 212G), and a subpixel 212 provided with a color filter that transmits light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row are referred to as a wiring 248[n] and a wiring 249[n], respectively. For example, the wiring 253 connected to the pixel 211 in the m-th column is referred to as a wiring 253[m]. Note that in FIG. 36A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 36B:
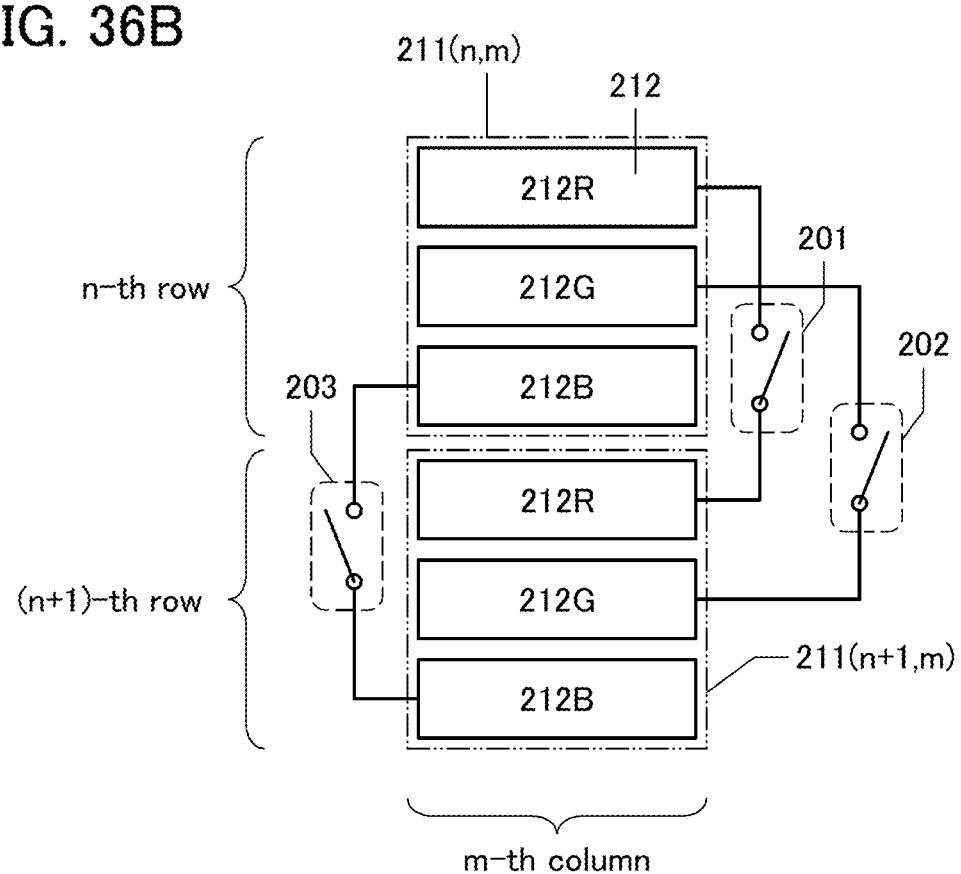

The imaging device 200 has a structure in which the subpixel 212 is electrically connected to the subpixel 212 in an adjacent pixel 211 that is provided with a color filter that transmits light with the same wavelength band as the subpixel 212, via a switch. FIG. 36B shows a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 36B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 36A, in regard to the subpixel 212 sensing light in a red wavelength band, the subpixel 212 sensing light in a green wavelength band, and the subpixel 212 sensing light in a blue wavelength band, the pixel number ratio (or the light receiving area ratio) thereof is not necessarily 1:1:1. For example, it is possible to employ the Bayer arrangement, in which the ratio of the number of pixels (the ratio of light-receiving areas) is set to red:green:blue=1:2:1. Alternatively, the pixel number ratio (the ratio of light receiving area) of red and green to blue may be 1:6:1.

Although the number of subpixels 212 provided in the pixel 211 may be one, two or more subpixels are preferably provided. For example, when two or more subpixels 212 sensing light in the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 37A and 37B. With the lens 255, the photoelectric conversion element can receive incident light efficiently. Specifically, as illustrated in FIG. 37A, light 256 enters a photoelectric conversion element 220 through the lens 255, the filter 254 (a filter 254R, a filter 254G, and a filter 254B), a pixel circuit 230, and the like which are provided in the pixel 211.

However, part of the light 256 indicated by arrows might be blocked by some wirings 257 as indicated by a region surrounded with dashed-dotted lines. Thus, a preferable structure is such that the lens 255 and the filter 254 are provided on the photoelectric conversion element 220 side as illustrated in FIG. 37B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 37A:
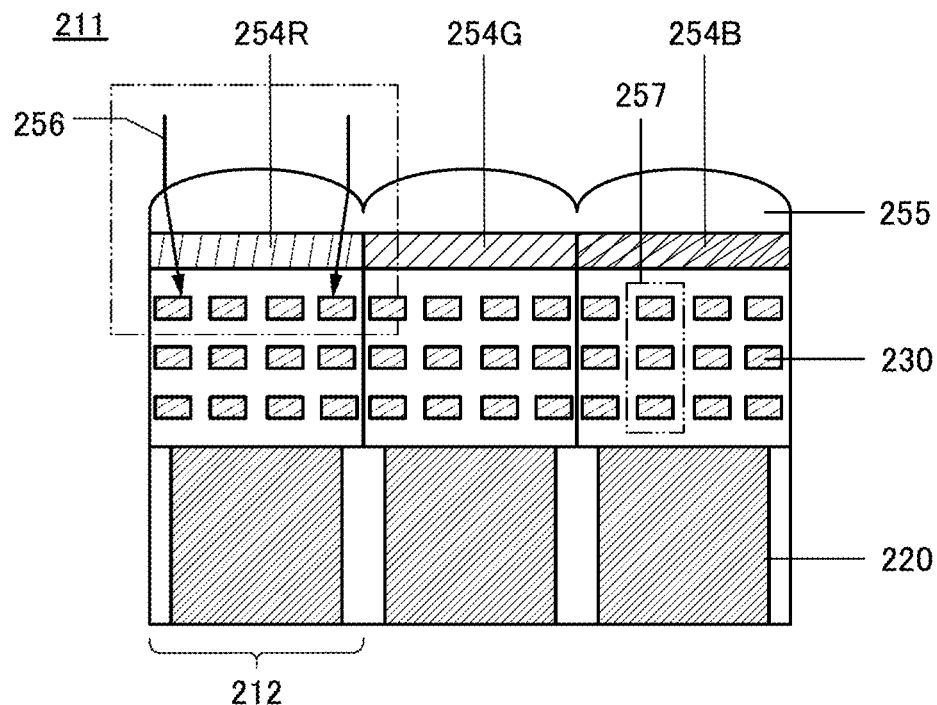
FIGS. 37A and 37B are cross-sectional views of an imaging device.
Figure 37B:
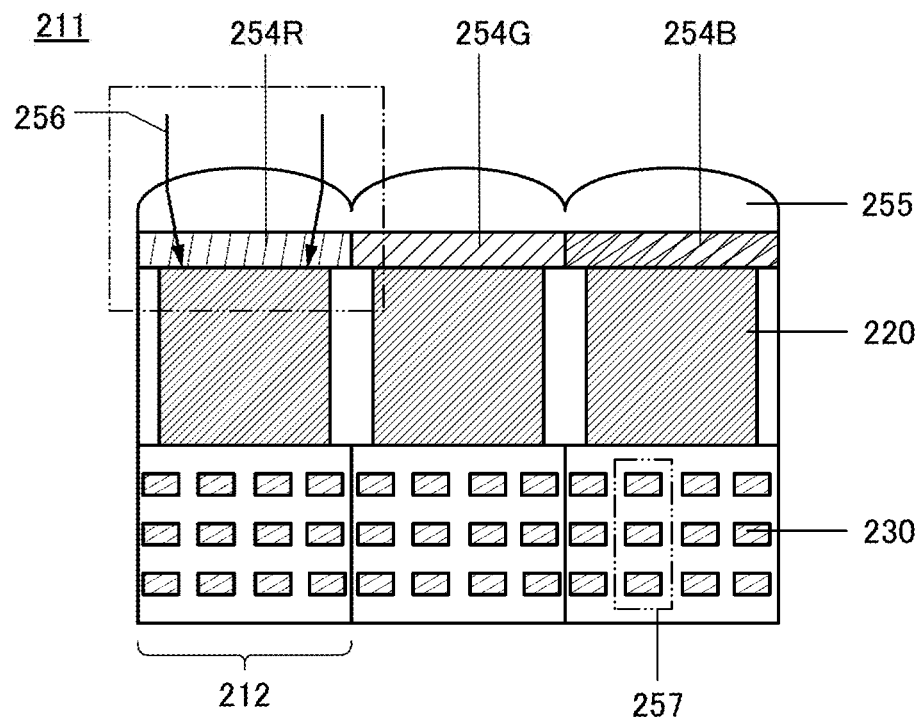

As the photoelectric conversion element 220 illustrated in FIGS. 37A and 37B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 37A and 37B.

<Configuration Example 2 of Pixel>

An example of a pixel including a transistor using silicon and a transistor using an oxide semiconductor according to one embodiment of the present invention is described below.

Figure 38A:
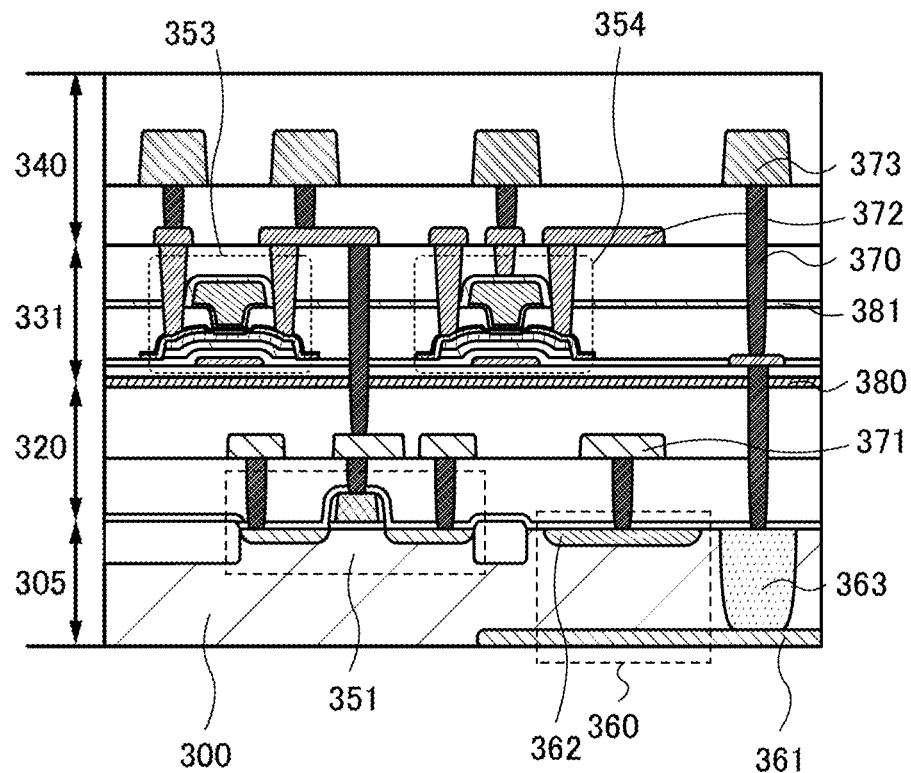
FIGS. 38A and 38B are cross-sectional views of an imaging device.
Figure 38B:
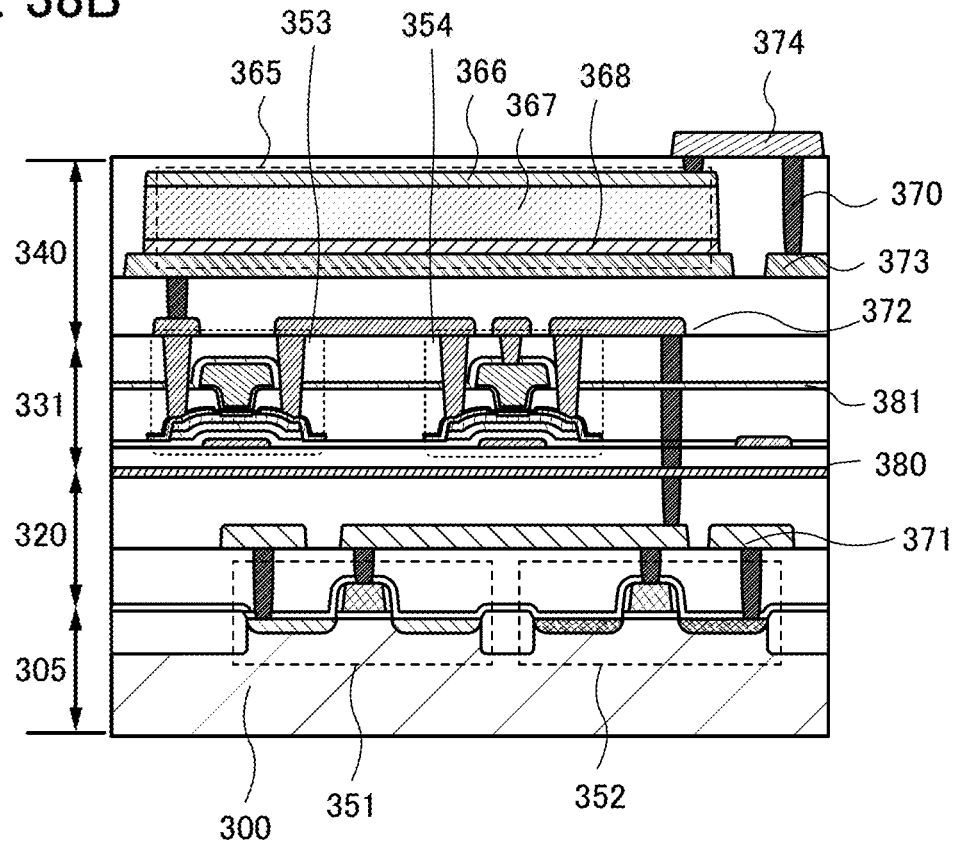

FIGS. 38A and 38B are each a cross-sectional view of an element included in an imaging device.

The imaging device illustrated in FIG. 38A includes a transistor 351 including silicon over a silicon substrate 300, transistors 353 and 354 which include an oxide semiconductor and are stacked over the transistor 351, and a photodiode 360 provided in a silicon substrate 300 and including an anode 361 and a cathode 362. The transistors and the photodiode 360 are electrically connected to various plugs 370 and wirings 371. In addition, an anode 361 of the photodiode 360 is electrically connected to the plug 370 through a low-resistance region 363

The imaging device includes a layer 305 including the transistor 351 provided on the silicon substrate 300 and the photodiode 360 provided in the silicon substrate 300, a layer 320 which is in contact with the layer 305 and includes the wirings 371, a layer 331 which is in contact with the layer 320 and includes the transistors 353 and 354, and a layer 340 which is in contact with the layer 331 and includes a wiring 372 and a wiring 373.

Note that in the example of cross-sectional view in FIG. 38A, a light-receiving surface of the photodiode 360 is provided on the side opposite to a surface of the silicon substrate 300 where the transistor 351 is formed. With the structure, an optical path can be obtained without the influence by the transistors or wirings, and therefore, a pixel with a high aperture ratio can be formed. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 305 may include the transistor using an oxide semiconductor. Alternatively, the layer 305 may be omitted, and the pixel may include only transistors using an oxide semiconductor.

In addition, in the cross-sectional view in FIG. 38A, the photodiode 360 in the layer 305 and the transistor in the layer 331 can be formed so as to overlap with each other. Thus, the degree of integration of pixels can be increased. In other words, the resolution of the imaging device can be increased.

An imaging device shown in FIG. 38B includes a photodiode 365 in the layer 340 and over the transistor. In FIG. 38B, the layer 305 includes the transistor 351 and a transistor 352 using silicon, the layer 320 includes the wiring 371, the layer 331 includes the transistors 353 and 354 using an oxide semiconductor layer, the layer 340 includes the photodiode 365. The photodiode 365 includes a semiconductor layer 366, a semiconductor layer 367, and a semiconductor layer 368, and is electrically connected to the wiring 373 and a wiring 374 through the plug 370.

The element structure shown in FIG. 38B can increase the aperture ratio.

Alternatively, a PIN diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. The p-type semiconductor layer 366 and the n-type semiconductor layer 368 can each be formed using amorphous silicon, microcrystalline silicon, or the like which includes a dopant imparting the corresponding conductivity type. The photodiode 365 in which a photoelectric conversion layer is formed using amorphous silicon has high sensitivity in a visible light wavelength region, and therefore can easily sense weak visible light.

Here, in FIGS. 38A and 38B, an insulator 380 is provided between the layer 305 including the transistor 351 and the layer 331 including the transistors 353 and 354. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 353, the transistor 354, and the like becomes one of factors generating a carrier in the oxide semiconductor. Thus, the hydrogen may cause a reduction of the reliability of the transistor 354, the transistor 354, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 353, the transistor 354, and the like can be increased. It is preferable to form the insulator 381 over the transistors 353 and 354 because oxygen diffusion can be prevented in the oxide semiconductor.

At least part of this embodiment can be implemented in combination with any of the embodiments described in this specification as appropriate.

Embodiment 10

Rf Tag

In this embodiment, an RF tag that includes the transistor described in the above embodiments or the memory device described in the above embodiment is described with reference to FIG. 39.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 39. FIG. 39 is a block diagram illustrating a configuration example of an RF tag.

Figure 39:
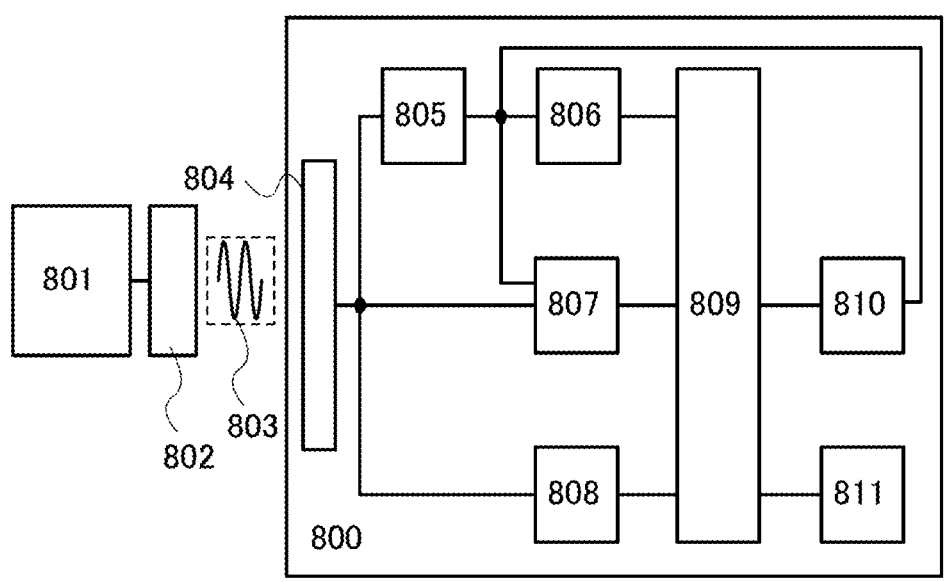
FIG. 39 illustrates a configuration example of an RF tag.

As shown in FIG. 39, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Note that this embodiment can be combined as appropriate with any of the other embodiments and an example in this specification.

Embodiment 11

Display Device

A display device of one embodiment of the present invention is described below with reference to FIGS. 40A to 40C and FIGS. 41A and 41B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 40A:
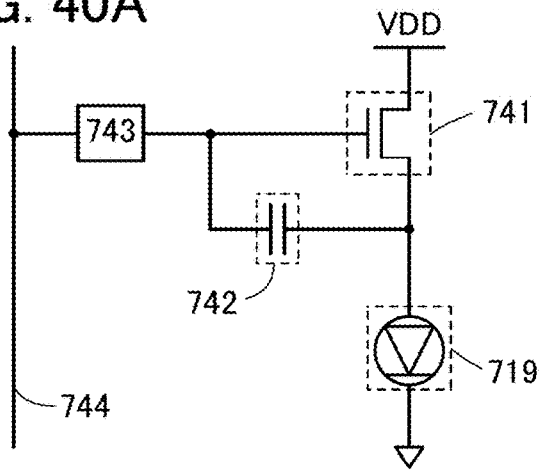
FIGS. 40A to 40C are a circuit diagram, a top view, and a cross-sectional view illustrating a semiconductor device according to one embodiment of the present invention.
Figure 40B:
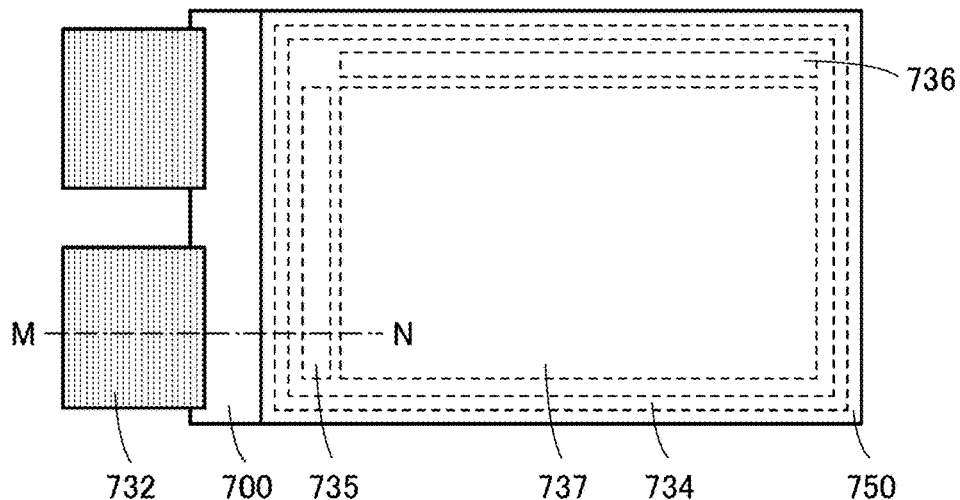
Figure 40C:
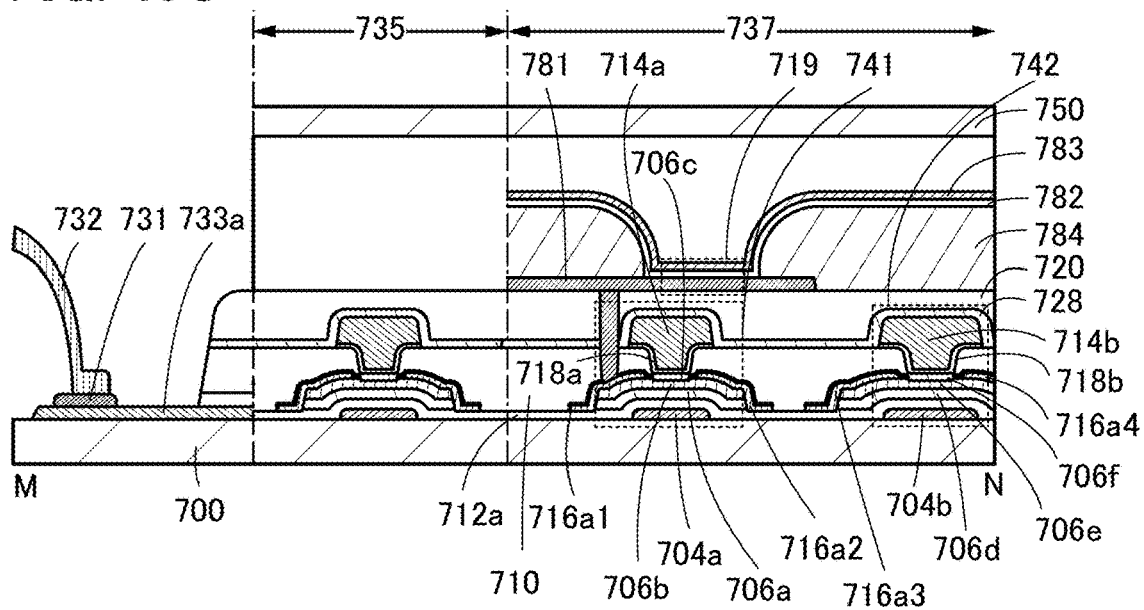

FIGS. 40A to 40C illustrate an example of an EL display device of one embodiment of the present invention. FIG. 40A is a circuit diagram of a pixel in an EL display device. FIG. 40B is a top view showing the whole of the EL display device.

FIG. 40C is a cross-sectional view taken along part of dashed-dotted line M-N in FIG. 40B.

FIG. 40A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 40A includes a switching element 743, a transistor 741, a capacitor 742, and a light-emitting element 719.

Note that FIG. 40A and the like each illustrate an example of a circuit structure; therefore, a transistor can be provided additionally. In contrast, for each node in FIG. 40A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the transistor illustrated in FIGS. 1A to 1C can be used, for example.

FIG. 40B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 40C is a cross-sectional view of the EL display device taken along part of dashed-dotted line M-N in FIG. 40B. In FIG. 40C, the FPC 732 is connected to the wiring 733a via the terminal 731. Note that the wiring 733a may be formed using the same kind of conductor or semiconductor as the conductor or semiconductor included in the transistor 741.

FIG. 40C illustrates a structure of the transistor 741 including an insulator 712 over the transistor 700; a conductor 704a; an insulator 706a that is over the insulator 712a and the conductor 704a and partly overlaps with the conductor 704a; a semiconductor 706b over the insulator 706a; conductors 716a1 and 716a2 in contact with a top surface of the semiconductor 706b; an insulator 710 over the conductors 716a1 and 716a2; an insulator 706c over the semiconductor 706b; an insulator 718a over the insulator 706c; and a conductor 714a that is over the insulator 718a and overlaps with the semiconductor 706b. Note that the structure of the transistor 741 is just an example; the transistor 741 may have a structure different from that illustrated in FIG. 40C.

In the transistor 741 illustrated in FIG. 40C, the conductor 704a serves as a gate electrode, the insulator 712a serves as a gate insulator, the conductor 716a2 serves as a source electrode, the conductor 716a1 serves as a drain electrode, the insulator 718a serves as a gate insulator, and the conductor 714a serves as a gate electrode. Note that in some cases, electric characteristics of the insulator 706a, the semiconductor 706b, and the insulator 706c change if light enters the insulator 706a, the semiconductor 706b, and the insulator 706c. To prevent this, it is preferable that one or more of the conductor 704a, the conductor 716a1, the conductor 716a2, and the conductor 714a have a light-blocking property.

FIG. 40C illustrates a structure of the capacitor 742 including an insulator 706d that is over a conductor 704b and partly overlaps with the conductor 704b; a semiconductor 706e over the insulator 706d; conductors 716a3 and 716a4 in contact with a top surface of the semiconductor 706e; the insulator 710 over the conductors 716a3 and 716a4; an insulator 706f over the semiconductor 706e; the insulator 718b over the insulator 706f; and a conductor 714b that is over the insulator 718b and overlaps with the semiconductor 706e.

In the capacitor 742, the conductor 704b serves as one electrode and the conductor 714b serves as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 40C has a large capacitance per area occupied by the capacitor. Therefore, the EL display device illustrated in FIG. 40C has high display quality. Note that the structure of the capacitor 742 is just an example and may be different from that illustrated in FIG. 40C.

An insulator 728 is provided over the transistor 741 and the capacitor 742, and an insulator 720 is provided over the insulator 728. Here, the insulator 728 and the insulator 720 may have an opening reaching the conductor 716a1 that serves as the drain electrode of the transistor 741. A conductor 781 is provided over the insulator 720. The conductor 781 may be electrically connected to the transistor 741 through the opening in the insulator 728 and the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 41A:
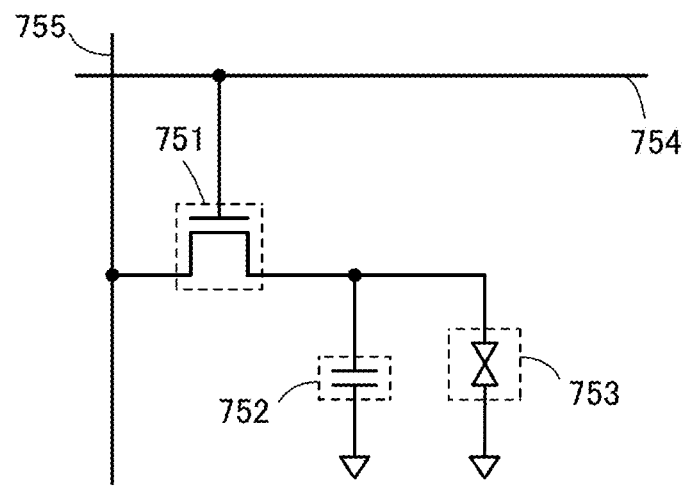
FIGS. 41A and 41B are a circuit diagram and a cross-sectional view illustrating a semiconductor device according to one embodiment of the present invention.

FIG. 41A is a circuit diagram showing a structural example of a pixel of the liquid crystal display device. A pixel illustrated in FIG. 41A includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 41B:
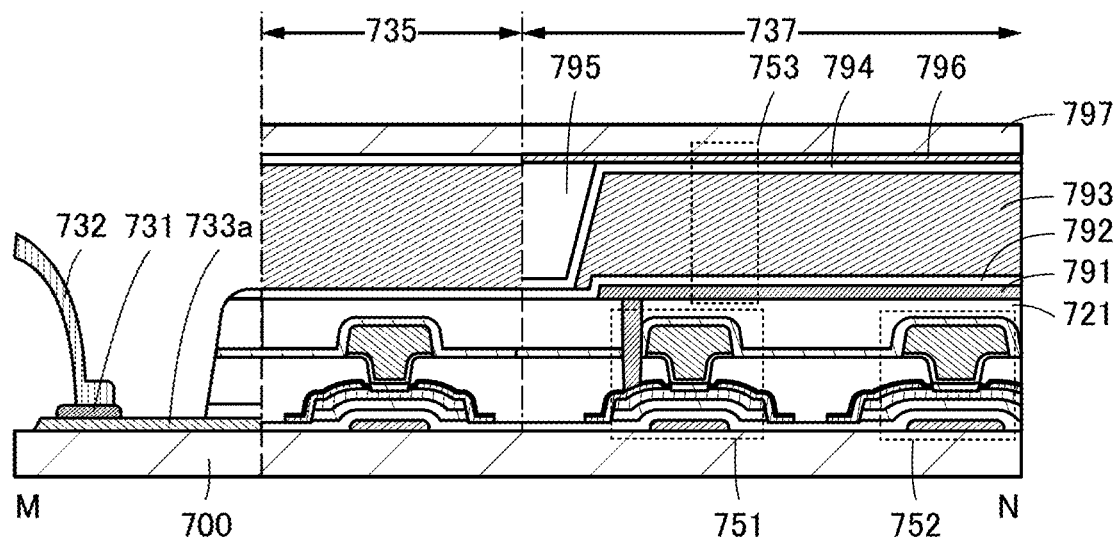

Note the description of the liquid crystal display device is made on the assumption that the top view of the liquid crystal display device is similar to that of the EL display device. FIG. 40B is a cross-sectional view of the liquid crystal display device taken along dashed-dotted line M-N in FIG. 41B. In FIG. 41B, the FPC 732 is connected to the wiring 733*a* via the terminal 731. Note that the wiring 733*a* may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 41B corresponds to, but is not limited to, the structure of the capacitor 742 in FIG. 40C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

Note that this embodiment can be combined as appropriate with any of the other embodiments and an example in this specification.

Embodiment 12

In this embodiment, a display module using a semiconductor device of one embodiment of the present invention is described with reference to FIG. 42.

<Display Module>

Figure 42:
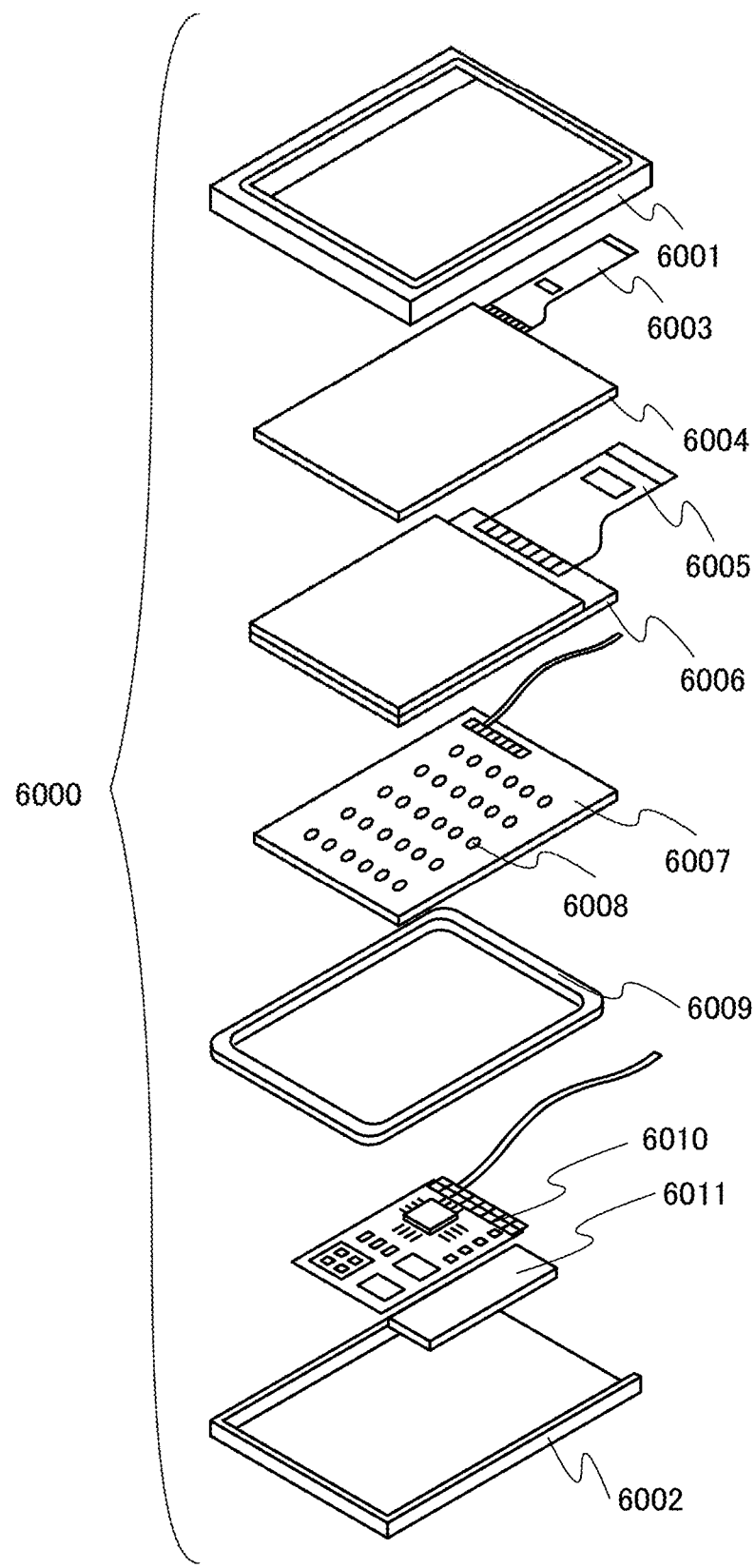
FIG. 42 illustrates a display module.

In a display module 6000 in FIG. 42, a touch panel 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for, for example, the display panel 6006 and an integrated circuit mounted on a printed circuit board.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. A counter substrate (sealing substrate) of the display panel 6006 can have a touch panel function. A photosensor may be provided in each pixel of the display panel 6006 so that an optical touch panel function is added. An electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and also functions as an electromagnetic shield for blocking electromagnetic waves generated from the printed board 6010. The frame 6009 may function as a radiator plate.

The printed board 6010 has a power supply circuit and a signal processing circuit for outputting a video signal and a clock signal. As a power source for supplying power to the power supply circuit, an external commercial power source or the battery 6011 provided separately may be used. Note that the battery 6011 is not necessary in the case where a commercial power source is used.

The display module 6000 can be additionally provided with a member such as a polarizing plate, a retardation plate, or a prism sheet.

Note that this embodiment can be combined as appropriate with any of the other embodiments and an example in this specification.

Embodiment 13

Package Using a Lead Frame Interposer

Figure 43A:
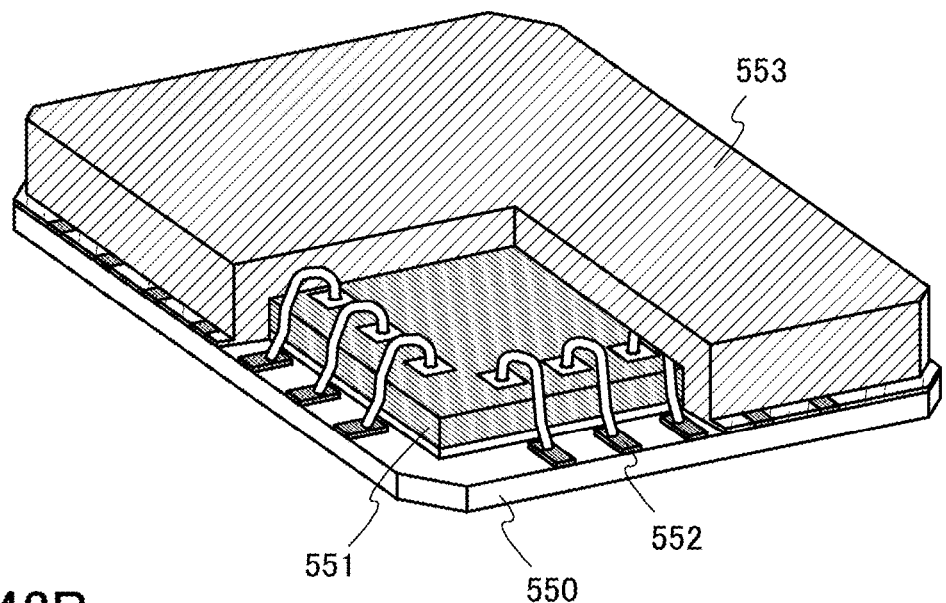
FIGS. 43A and 43B are perspective views illustrating a cross-sectional structure of a package using a lead frame interposer.

FIG. 43A is a perspective view illustrating a cross-sectional structure of a package using a lead frame interposer. In the package illustrated in FIG. 43A, a chip 551 corresponding to the semiconductor device of one embodiment of the present invention is connected to a terminal 552 over an interposer 550 by wire bonding. The terminal 552 is placed on a surface of the interposer 550 on which the chip 551 is mounted. The chip 551 may be sealed by a mold resin 553, in which case the chip 551 is sealed such that part of each of the terminals 552 is exposed.

Figure 43B:
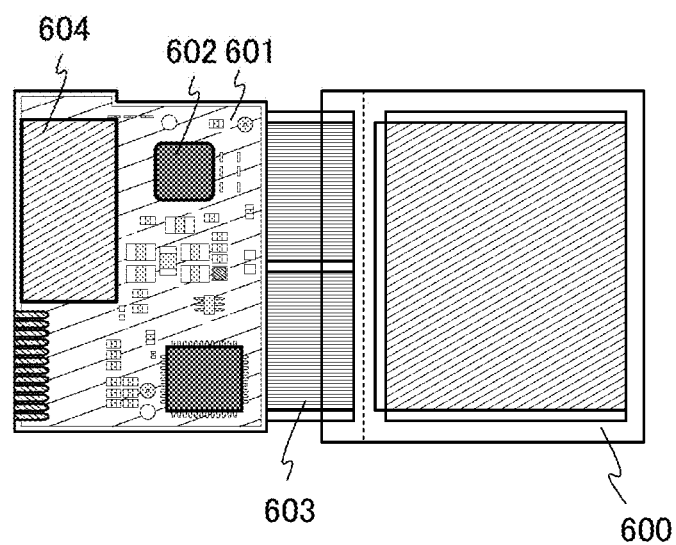

FIG. 43B illustrates the structure of a module of an electronic device (mobile phone) in which a package is mounted on a circuit board. In the module of the mobile phone in FIG. 43B, a package 602 and a battery 604 are mounted on a printed wiring board 601. The printed wiring board 601 is mounted on a panel 600 including a display element by an FPC 603.

Note that this embodiment can be combined as appropriate with any of the other embodiments and an example in this specification.

Embodiment 14

In this embodiment, electronic devices and lighting devices of one embodiment of the present invention will be described with reference to drawings.

<Electronic Device>

Electronic devices and lighting devices can be fabricated using the semiconductor device of one embodiment of the present invention. In addition, highly reliable electronic devices and lighting devices can be fabricated using the semiconductor device of one embodiment of the present invention. Furthermore, electronic devices and lighting devices including touch sensors with improved detection sensitivity can be fabricated using the semiconductor device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

In the case of having flexibility, the electronic device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

Figure 44A:
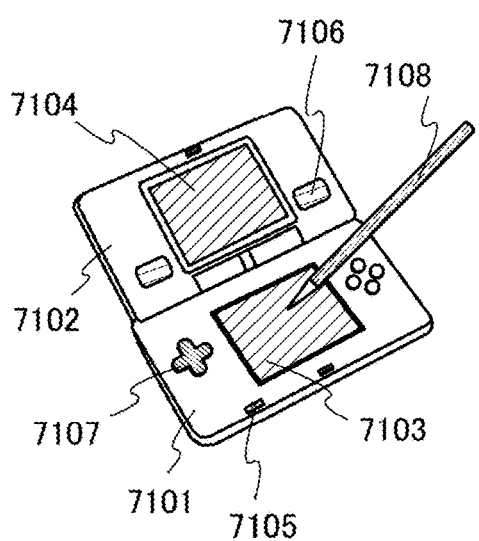
FIGS. 44A to 44E each illustrate an electronic device of one embodiment of the present invention.

FIG. 44A illustrates a portable game machine including a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the light-emitting device of one embodiment of the present invention is used as the display portion 7103 or 7104, it is possible to provide a user-friendly portable game machine with quality that hardly deteriorates. Although the portable game machine illustrated in FIG. 44A includes two display portions, the display portion 7103 and the display portion 7104, the number of display portions included in the portable game machine is not limited to two.

Figure 44B:
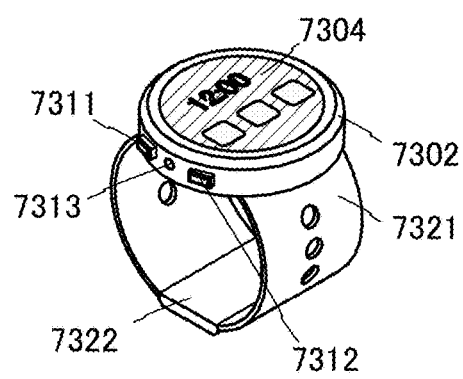

FIG. 44B illustrates a smart watch, which includes a housing 7302, a display portion 7304, operation buttons 7311 and 7312, a connection terminal 7313, a band 7321, a clasp 7322, and the like. The semiconductor device of one embodiment of the present invention can be used for a memory, a CPU, or the like incorporated in the housing 7302.

Figure 44C:
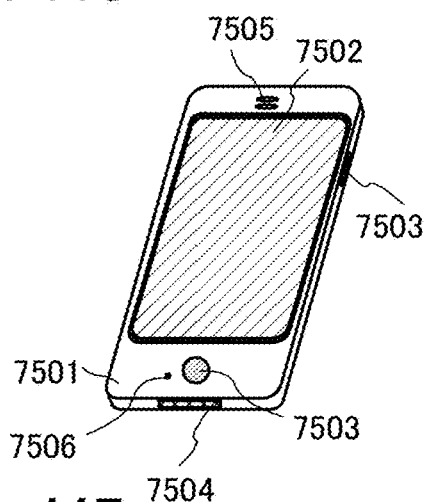

FIG. 44C illustrates a portable information terminal, which includes a display portion 7502 incorporated in a housing 7501, operation buttons 7503, an external connection port 7504, a speaker 7505, a microphone 7506, a display portion 7502, and the like. The semiconductor device of one embodiment of the present invention can be used for a mobile memory, a CPU, or the like incorporated in the housing 7501. Note that the display portion 7502 is small- or medium-sized but can perform full high vision, 4 k, or 8 k display because it has greatly high definition; therefore, a significantly clear image can be obtained.

Figure 44D:
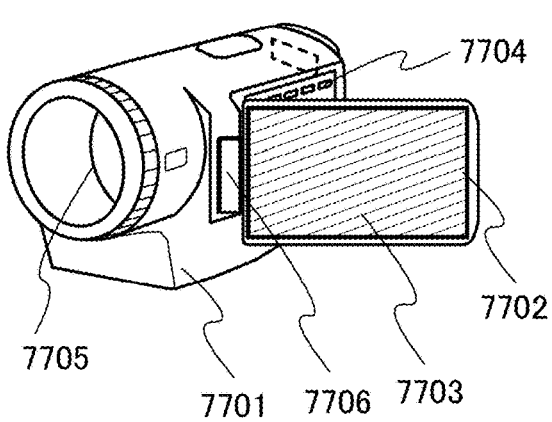

FIG. 44D illustrates a video camera, which includes a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device in one embodiment of the present invention can be provided in a focus position of the lens 7705. The semiconductor device of one embodiment of the present invention can be used for an integrated circuit, a CPU, or the like incorporated in the first housing 7701.

Figure 44E:
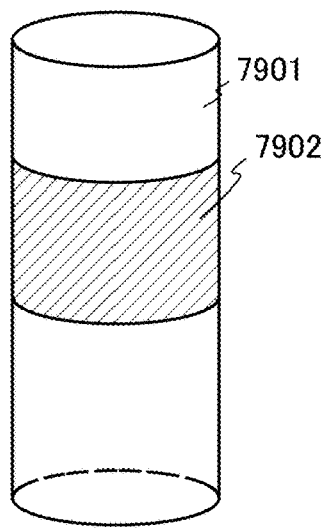

FIG. 44E illustrates a digital signage including a display portion 7902 provided on a utility pole 7901. The display device of one embodiment of the present invention can be used for a control circuit of the display portion 7902.

Figure 45A:
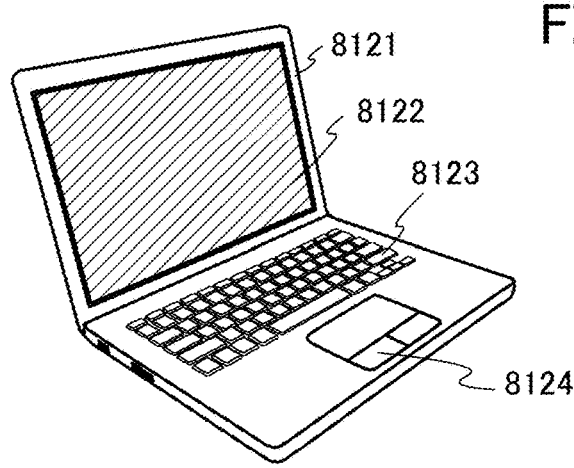
FIGS. 45A to 45D are views each illustrating an electronic device of one embodiment of the present invention.

FIG. 45A illustrates a notebook personal computer, which includes a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform 8 k display because it has greatly high definition; therefore, a significantly clear image can be obtained.

Figure 45B:
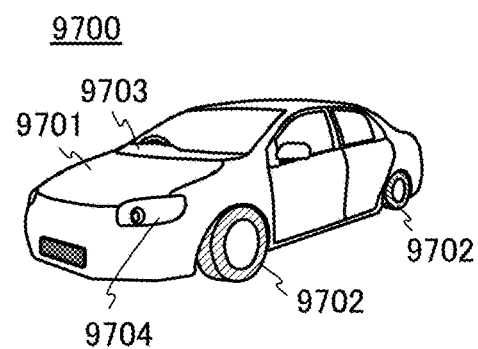
Figure 45C:
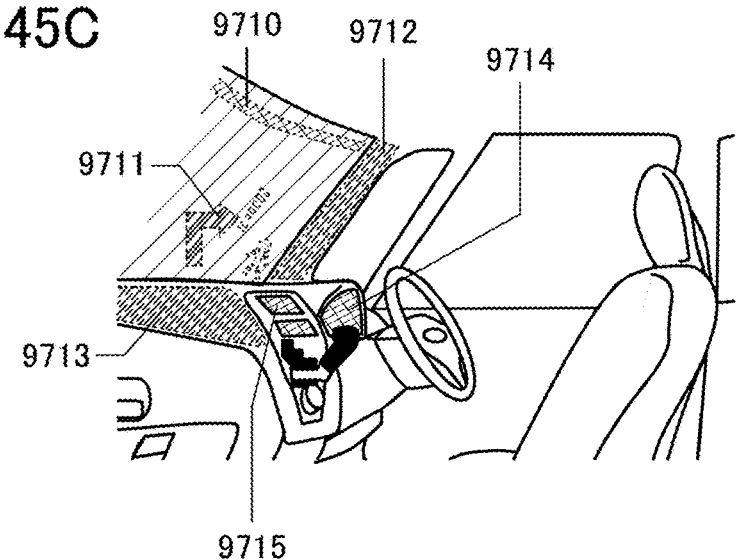

FIG. 45B is an external view of an automobile 9700. FIG. 45C illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the semiconductor device of one embodiment of the present invention can be used in display portions 9710 to 9715 illustrated in FIG. 45C.

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard.

For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 45D:
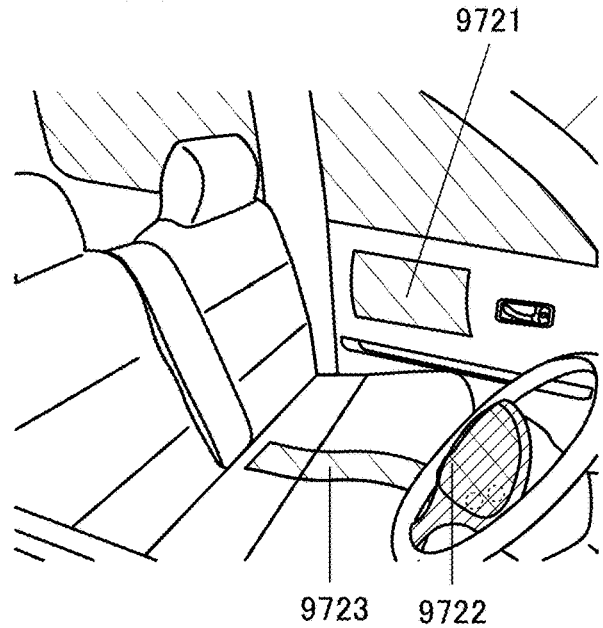

FIG. 45D illustrates the inside of a car in which a bench seat is used as a driver seat and a front passenger seat. A display portion 9721 is a display device or input/output device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 46A:
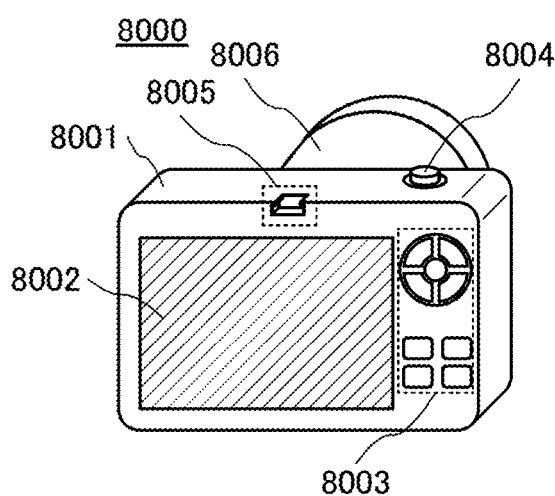
FIGS. 46A to 46C are views each illustrating an electronic device according to one embodiment of the present invention.

FIG. 46A illustrates an external view of a camera 8000. The camera 8000 includes a housing 8001, a display portion 8002, an operation button 8003, a shutter button 8004, a connection portion 8005, and the like. A lens 8006 can be put on the camera 8000.

Figure 46B:
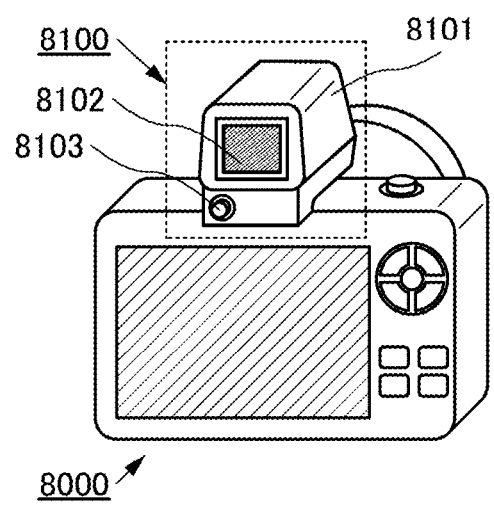

The connection portion 8005 includes an electrode to connect with a finder 8100, which is illustrated in FIG. 46B, a stroboscope, or the like.

Although the lens 8006 of the camera 8000 here is detachable from the housing 8001 for replacement, the lens 8006 may be included in a housing.

Images can be taken at the touch of the shutter button 8004. In addition, images can be taken at the touch of the display portion 8002 which serves as a touch panel.

The display device or input/output device of one embodiment of the present invention can be used in the display portion 8002.

FIG. 46B shows the camera 8000 with the finder 8100 connected.

The finder 8100 includes a housing 8101, a display portion 8102, a button 8103, and the like.

The housing 8101 includes a connection portion for the camera 8000 and the connection portion 8005, and the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off with the button 8103.

The semiconductor device of one embodiment of the present invention can be used for an integrated circuit and an image sensor included in the housing 8101.

Although the camera 8000 and the finder 8100 are separate and detachable electronic devices in FIGS. 46A and 46B, the housing 8001 of the camera 8000 may include a finder having the display device or input/output device of one embodiment of the present invention.

Figure 46C:
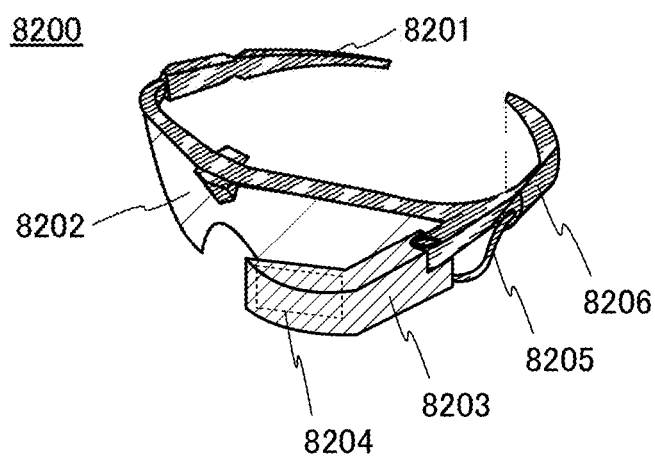

FIG. 46C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. In addition, the movement of the eyeball and the eyelid of a user can be captured by a camera in the main body 8203 and then coordinates of the points the user looks at can be calculated using the captured data to utilize the eye of the user as an input means.

The mounting portion 8201 may include a plurality of electrodes to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The semiconductor device of one embodiment of the present invention can be used for an integrated circuit included in the main body 8203.

At least part of this embodiment can be implemented in combination with any of the embodiments described in this specification as appropriate.

Embodiment 15

In this embodiment, application examples of an RF tag using the semiconductor device of one embodiment of the present invention will be described with reference to FIGS. 47A to 47F.

<Application Examples of RF Tag>

The RF tag is widely used and can be provided for, for example, products such as bills, coins, securities, bearer bonds, documents (e.g., driver's licenses or resident's cards, see FIG. 47A), vehicles (e.g., bicycles, see FIG. 47B), packaging containers (e.g., wrapping paper or bottles, see FIG. 47C), recording media (e.g., DVD or video tapes), personal belongings (e.g., bags or glasses, see FIG. 47D), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 47E and 47F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined as appropriate with any of the other embodiments and an example in this specification.

This application is based on Japanese Patent Application serial no. 2015-044526 filed with Japan Patent Office on Mar. 6, 2015, the entire contents of which are hereby incorporated by reference.

What is claimed is:

1. A semiconductor device comprising:
a first insulator over a substrate;
a second insulator over the first insulator;
a semiconductor over the second insulator, the semiconductor including a first region, a second region, and a third region, wherein the first region is located between the second region and the third region;
a source electrode and a drain electrode over the second region and the third region of the semiconductor, respectively;
a third insulator over and in contact with the first region of the semiconductor;
a fourth insulator over the source electrode and the drain electrode;
a first gate insulator including a first region over a top surface of the third insulator and a second region over and in contact with a side surface of the fourth insulator; and
a first gate electrode over the first gate insulator,
wherein an entirety of the third insulator is directly underneath the first gate electrode,
wherein the first insulator has a first region in contact with the second insulator and a second region in contact with one of the source electrode and the drain electrode, and
wherein a thickness of the first region of the first insulator is larger than a thickness of the second region of the first insulator.

2. The semiconductor device according to claim 1, wherein the third insulator has a stacked-layer structure including at least a first layer and a second layer.

3. The semiconductor device according to claim 1, wherein the semiconductor includes a first oxide semiconductor.

4. The semiconductor device according to claim 1, wherein the semiconductor includes a first oxide semiconductor having a c-axis aligned crystal part.

5. The semiconductor device according to claim 1, wherein each of the source electrode and the drain electrode has a stacked-layer structure including a plurality of layers.

6. The semiconductor device according to claim 1, wherein each of the source electrode and the drain electrode includes regions with different thicknesses.

7. The semiconductor device according to claim 1, further comprising a second gate electrode under the first insulator.

8. The semiconductor device according to claim 1, wherein each of the second insulator and the third insulator contains at least one element contained in the semiconductor.

9. The semiconductor device according to claim 1, wherein the semiconductor has electron affinity higher than the second insulator and the third insulator.

* * * * *